(12) United States Patent
Lee et al.

(10) Patent No.: US 9,391,269 B2
(45) Date of Patent: Jul. 12, 2016

(54) VARIABLE RESISTANCE MEMORY DEVICES

(71) Applicant: Samsung Electronics Co., Ltd., Suwon-si (KR)

(72) Inventors: Jung-Moo Lee, Hwaseong-si (KR); Youn-Seon Kang, Yongin-si (KR); Seung-Jae Jung, Suwon-si (KR); Jung-Dal Choi, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/457,439

(22) Filed: Aug. 12, 2014

(65) Prior Publication Data

US 2015/0214478 A1 Jul. 30, 2015

(30) Foreign Application Priority Data

Jan. 29, 2014 (KR) .................. 10-2014-0011149

(51) Int. Cl.
*H01L 45/00* (2006.01)
*H01L 21/768* (2006.01)
*H01L 27/24* (2006.01)
*H01L 21/336* (2006.01)
*H01L 29/788* (2006.01)
*H01L 27/108* (2006.01)

(52) U.S. Cl.
CPC ........ *H01L 45/1233* (2013.01); *H01L 27/2481* (2013.01); *H01L 45/04* (2013.01); *H01L 45/08* (2013.01); *H01L 45/1675* (2013.01); *H01L 27/2436* (2013.01)

(58) Field of Classification Search
CPC ............... H01L 2924/0002; H01L 2924/00; H01L 27/11502; H01L 29/7391
USPC ......... 257/2–4, 310, E21.17, E21.28, E21.58; 438/672, 612, 618, 244
See application file for complete search history.

(56) References Cited

U.S. PATENT DOCUMENTS

| | | | |
|---|---|---|---|
| 4,638,813 A * | 1/1987 | Turner | A61N 1/403 324/119 |
| 7,629,225 B2 | 12/2009 | Naujok et al. | |
| 7,682,904 B2 | 3/2010 | Kim et al. | |
| 8,008,149 B2 | 8/2011 | Kuniya | |
| 8,013,364 B2 | 9/2011 | Naujok et al. | |
| 8,129,705 B2 | 3/2012 | Kinoshita et al. | |
| 8,148,235 B2 | 4/2012 | Naujok et al. | |

(Continued)

FOREIGN PATENT DOCUMENTS

| | | |
|---|---|---|
| EP | 2015355 | 1/2010 |
| JP | 201087160 | 4/2010 |

(Continued)

*Primary Examiner* — Kimberly Rizkallah
*Assistant Examiner* — Brian Turner
(74) *Attorney, Agent, or Firm* — Onello & Mello LLP

(57) ABSTRACT

A variable resistance memory device includes a plurality of first conductive lines, a plurality of second conductive lines, a plurality of memory cells, a plurality of first air gaps and a plurality of second air gaps. The first conductive line extends in a first direction. The second conductive line is over the first conductive line and extends in a second direction crossing the first direction. The memory cell includes a variable resistance device. The memory cell is located at an intersection region of the first conductive line and the second conductive line. The first air gap extends in the first direction between the memory cells. The second air gap extends in the second direction between the memory cells.

17 Claims, 52 Drawing Sheets

(56) References Cited

U.S. PATENT DOCUMENTS

| | | |
|---|---|---|
| 8,158,479 B2 | 4/2012 | Sato et al. |
| 8,592,887 B2 | 11/2013 | Inoue et al. |
| 8,609,507 B2 | 12/2013 | Kim et al. |
| 2006/0281295 A1 | 12/2006 | Naujok et al. |
| 2010/0032841 A1 | 2/2010 | Naujok et al. |
| 2010/0144112 A1 | 6/2010 | Naujok et al. |
| 2011/0278730 A1 | 11/2011 | Naujok et al. |
| 2012/0007165 A1 | 1/2012 | Lee et al. |
| 2012/0217568 A1 | 8/2012 | Oda |
| 2012/0238099 A1 | 9/2012 | Shundo et al. |
| 2012/0256263 A1 | 10/2012 | Inoue et al. |
| 2012/0280300 A1 | 11/2012 | Kim et al. |
| 2013/0056817 A1 | 3/2013 | Kim et al. |
| 2013/0126816 A1 | 5/2013 | Tang et al. |
| 2013/0161716 A1 | 6/2013 | Kim et al. |
| 2013/0240823 A1 | 9/2013 | Kwon |
| 2014/0138606 A1* | 5/2014 | Suh .................... H01L 45/1253 257/4 |

FOREIGN PATENT DOCUMENTS

| | | |
|---|---|---|
| JP | 5076000 | 8/2012 |
| KR | 2012006183 | 1/2012 |
| KR | 101144443 | 5/2012 |
| KR | 2012098453 | 9/2012 |
| KR | 2012124706 | 11/2012 |
| KR | 2013025204 | 3/2013 |

* cited by examiner

1ST
DIRECTION
⊗ → 2ND
DIRECTION

VARIABLE RESISTANCE MEMORY DEVICES

CROSS-REFERENCE TO RELATED APPLICATION

This application claims priority under 35 USC §119 to Korean Patent Application No. 10-2014-0011149, filed on Jan. 29, 2014 in the Korean Intellectual Property Office (KIPO), the contents of which are incorporated by reference herein in their entirety.

BACKGROUND

1. Field

Example embodiments relate to variable resistance memory devices and methods of manufacturing the same. More particularly, example embodiments relate to variable resistance memory devices having an array structure and methods of manufacturing the same.

2. Description of the Related Art

Variable resistance memory devices, such as resistive random access memory (ReRAM) devices, phase change random access memory (PRAM) device, and magnetic random access memory (MRAM) devices include a memory cell with a variable resistance layer that may be between upper and lower electrodes or between upper and lower conductive lines, for example. With increased integration of memory devices, distance between neighboring memory cells, or pitch, is decreased. This reduction in pitch may result in interference between the memory cells. Additionally, properties of the variable resistance layer may be altered during a process for manufacturing the memory device.

SUMMARY

Example embodiments in accordance with principles of inventive concepts provide a variable resistance memory device having improved structural stability and operational reliability.

Example embodiments in accordance with principles of inventive concepts provide a method of manufacturing a variable resistance memory device having improved structural stability and operational reliability.

According to example embodiments, a variable resistance memory device includes a plurality of first conductive lines, a plurality of second conductive lines, a plurality of memory cells, a plurality of first air gaps and a plurality of second air gaps. The first conductive line extends in a first direction. The second conductive line is over the first conductive line and extends in a second direction crossing the first direction. The memory cell includes a variable resistance device. The memory cell is located at an intersection region of the first conductive line and the second conductive line. The first air gap extends in the first direction and extends between the memory cells. The second air gap extends in the second direction and extends between the memory cells.

In example embodiments, the variable resistance device may include a variable resistance layer including a perovskite-based material or a transition metal oxide.

In example embodiments, the variable resistance memory device may further include a capping layer pattern at an upper portion of the second air gap.

In example embodiments, the capping layer pattern may include a first capping layer pattern including an opening through which the upper portion of the second air gap is exposed, and a second capping layer pattern on the first air gap pattern and closing the opening.

In example embodiments, the second capping layer pattern may include an oxide having a gap fill property less than that of the first capping layer pattern.

In example embodiments, the first capping layer pattern may include an atomic layer deposition (ALD) oxide, and the second capping layer pattern may include tetra ethyl ortho silicate (TEOS) or a chemical vapor deposition (CVD) oxide.

In example embodiments, an upper portion of the first air gap may be covered by the second conductive line and the capping layer pattern.

In example embodiments, the first air gap and the second air gap may be in fluid communication with each other. A sidewall of the memory cell may be surrounded by the first air gaps and the second air gaps.

In example embodiments, the memory cell may include a lower electrode, a variable resistance layer and an upper electrode which are sequentially stacked on the first conductive line.

In example embodiments, the memory cell may further include a selection device between the first conductive line and the variable resistance device.

In example embodiments, the first conductive line may be on a base insulation layer. The first air gap may extend through an upper portion of the base insulation layer, and the second air gap may extend through an upper portion of the first conductive line.

According to example embodiments, there is provided a variable resistance memory device. The variable resistance memory device includes a first memory cell array, a second memory cell array, a plurality of first air gaps, a plurality of second air gaps and a plurality of common air gaps. The first memory cell array includes a plurality of first memory cells. The first memory cell includes a first variable resistance device. The second memory cell array is on the first memory cell array and includes a plurality of second memory cells. The second memory cell includes a second variable resistance device. The first air gap extends between the first memory cells. The second air gap extends between the second memory cells. The common air gap extends through the first memory cell array and the second memory cell array. The common air gap crosses the first air gap and the second air gap.

In example embodiments, the variable resistance memory device may further include a plurality of first conductive lines, a plurality of second conductive lines and a plurality of third conductive lines. Each of the first memory cells may be located in an intersection region of the first conductive line and the second conductive line. Each of the second memory cells may be located in an intersection region of the second conductive line and the third conductive line.

In example embodiments, the first conductive line and the third conductive line may extend in a first direction, and the second conductive line may extend in a second direction crossing the first direction.

In example embodiments, the first air gap and the second air gap may extend in the first direction, and the common air gap may extend in the second direction.

In example embodiments, the first air gap and the second air gap may be in fluid communication with each other via the common air gap.

In example embodiments, a sidewall of the first memory cell may be surrounded by the first air gaps and the common air gaps, and a sidewall of the second memory cell may be surrounded by the second air gaps and the common air gaps.

In example embodiments, the variable resistance memory device may further include a capping layer pattern at an upper portion of the second air gap.

In example embodiments, the variable resistance memory device may further include a first spacer, a second spacer and a common spacer formed on bottoms and sidewalls of the first air gap, the second air gap and the common air gap, respectively.

According to example embodiments, there is provided a method of manufacturing a variable resistance memory device. In the method, a first conductive layer and a first variable resistance material layer are formed sequentially on a base insulation layer. The first variable resistance material layer and the first conductive layer are partially etched to form a plurality of first trenches extending in a first direction. A first sacrificial layer pattern filling the first trench is formed. A second conductive layer and a second variable resistance material layer are formed sequentially on the first variable resistance material layer and the first sacrificial layer pattern. The second variable resistance material layer, the second conductive layer and the first variable resistance material layer are partially etched to form a plurality of common trenches extending in a second direction that crosses the first direction. A common sacrificial layer pattern filling the common trench is formed. A third conductive layer is formed on the second variable resistance material layer and the common sacrificial layer pattern. The third conductive layer and the second variable resistance material layer are partially etched to form a plurality of second trenches extending in the first direction. A second sacrificial layer pattern filling the second trench is formed. The first sacrificial layer pattern, the second sacrificial layer pattern and the common sacrificial layer pattern are removed.

In example embodiments, the first sacrificial layer pattern, the second sacrificial layer pattern and the common sacrificial layer pattern may be formed using a silicon-based spin-on hard mask (SOH) material or a carbon-based SOH material.

In example embodiments, the SOH material may include silicon carbide, silicon ox carbide or hydrocarbon compounds. These may be used alone or in a combination thereof.

In example embodiments, the first sacrificial layer pattern and the second sacrificial layer pattern may be connected to each other via the common sacrificial layer pattern.

In example embodiments, in the removal of the first sacrificial layer pattern, the second sacrificial layer pattern and the common sacrificial layer pattern, a first capping layer pattern may be formed on the second sacrificial layer pattern. The first capping layer pattern may include an opening through which a top surface of the second sacrificial layer pattern is exposed. An aching process may be performed through the opening to remove the second sacrificial layer pattern, the common sacrificial layer pattern and the first sacrificial layer pattern.

In example embodiments, a second capping layer may be further formed on the first capping layer pattern such that the opening may be closed.

In example embodiments, an apparatus includes an array of variable resistance memory cells arranged in a crosspoint array; and air gaps surrounding each variable resistance memory cell.

In example embodiments, air gaps surrounding variable resistance memory cells are formed using a low temperature formation and removal material.

In example embodiments, variable resistance memory cells are resistive random access (ReRAM) cells.

In example embodiments a variable resistance memory array including memory cells surrounded by air gaps also includes a memory controller.

In example embodiments, a variable resistance memory array including memory cells surrounded by air gaps and a memory controller is configured as a solid state disk (SSD).

According to example embodiments of inventive concepts, a variable resistance memory device may include air gaps between neighboring memory cells. The air gaps may include a first air gap extending in a direction of a word line, and a second air gap extending in a direction of a bit line. In this manner, cell interference in substantially all directions may be prevented by the air gaps. In a formation of the air gaps, a material which may be formed and removed in a low process temperature, such as an SOH material, may be used. By using a low temperature material, property fluctuation, or degeneration, of a variable resistance layer occurring when performing a thermal curing process may be prevented.

BRIEF DESCRIPTION OF THE DRAWINGS

Example embodiments will be more clearly understood from the following detailed description taken in conjunction with the accompanying drawings.

FIGS. 1 and 2 are a schematic perspective view and a schematic top plan view, respectively, illustrating a variable resistance memory device in accordance with example embodiments;

FIG. 52 is a block diagram illustrating a schematic construction of an information processing system in accordance with example embodiments.

DESCRIPTION OF EMBODIMENTS

Figure 1:
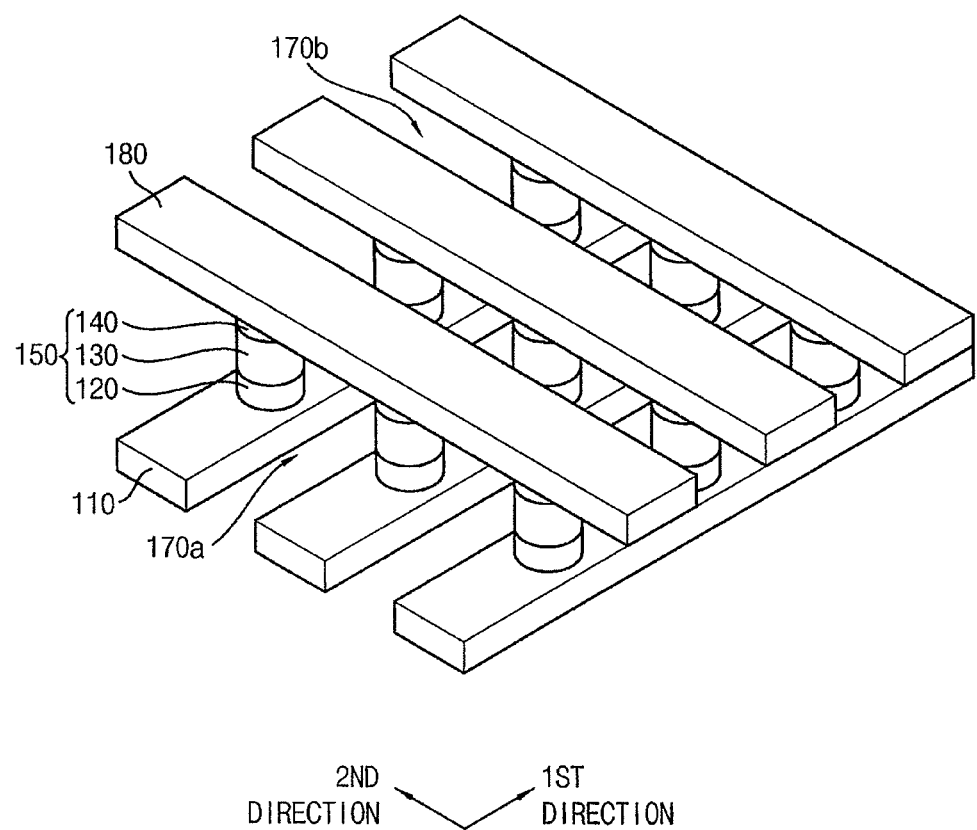
FIGS. 1 to 52 represent non-limiting, example embodiments as described herein.

Various example embodiments will be described more fully hereinafter with reference to the accompanying drawings, in which some example embodiments are shown. Inventive concepts may, however, be embodied in many different forms and should not be construed as limited to the example embodiments set forth herein. Rather, these example embodiments are provided so that this description will be thorough and complete, and will convey the scope of inventive concepts to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items and the term "or" is meant to be inclusive, unless otherwise indicated.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of inventive concepts.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of inventive concepts. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of inventive concepts.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
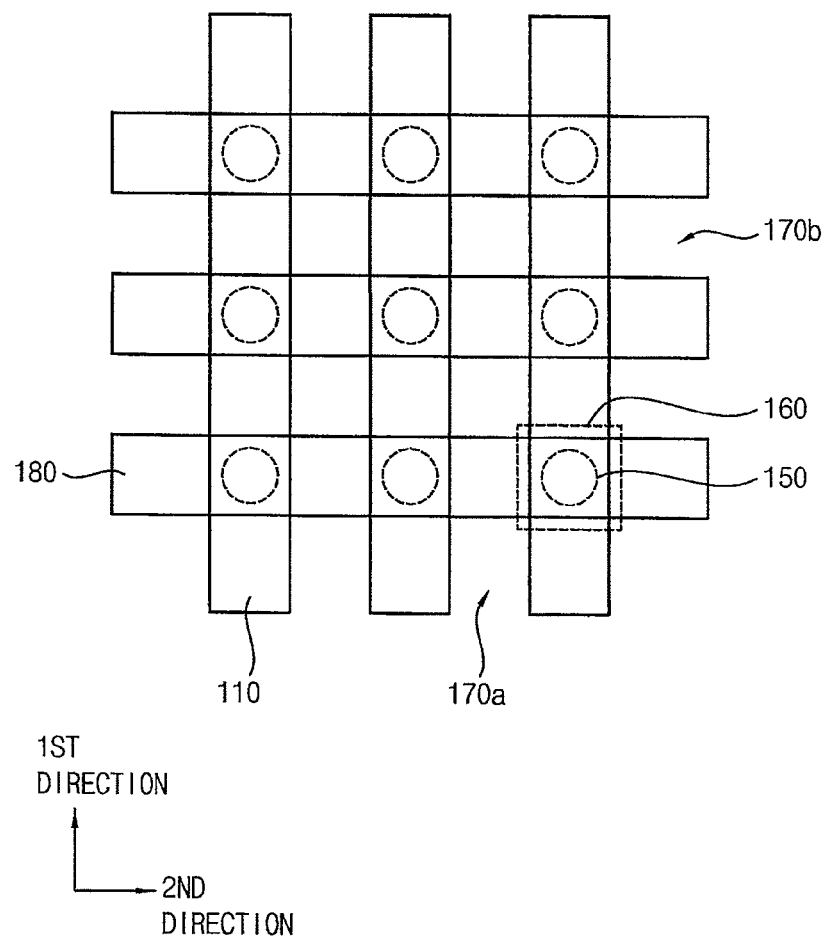
Figure 3A:
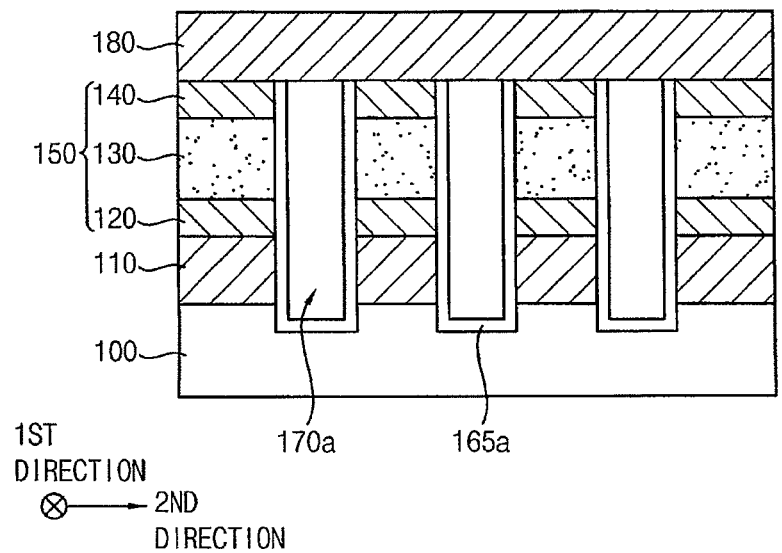
FIGS. 3A and 3B are cross-sectional views illustrating the variable resistance memory device of FIGS. 1 and 2 taken along a second direction and a first direction, respectively.
Figure 3B:
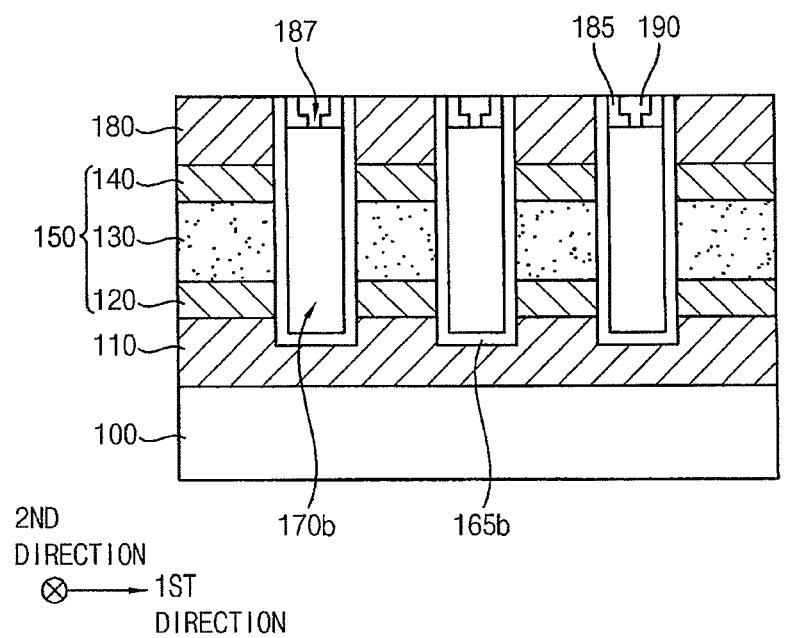

FIGS. 1 and 2 are a schematic perspective view and a schematic top plan view, respectively, illustrating a variable resistance memory device in accordance with example embodiments. FIGS. 3A and 3B are cross-sectional views illustrating the variable resistance memory device of FIGS. 1 and 2 taken along a second direction and a first direction, respectively.

For example, FIGS. 1 to 3B illustrate a cross-point memory cell array having a "1R" structure in which one variable resistance device is located at each intersection region of conductive lines. For convenience of an explanation, FIGS. 1 and 2 illustrate only a first conductive line, a second conductive line and a memory cell, and other insulation structures are omitted for brevity and clarity.

Referring to FIGS. 1 to 3B, the variable resistance memory device may include a plurality of first conductive lines 110 and a plurality of second conductive lines 180. The second conductive lines 180 may be disposed over the first conductive lines 110, and the first and second conductive lines 110 and 180 may cross each other. A memory cell 150 may be located at an intersection region 160 of the first and second conductive lines 110 and 180. The variable resistance memory device may include a first air gap 170a and a second air gap 170b which may be formed between the neighboring memory cells 150 and may extend to cross each other, thereby surrounding memory cell 150 with an air gap.

The first conductive line 110 may be disposed on a base insulation layer 100 and may extend in a first direction that is parallel to a top surface of the base insulation layer 100. A plurality of the first conductive lines 110 may be arranged in a second direction that is parallel to the top surface of the base insulation layer 100.

In example embodiments, the first and second directions may be substantially perpendicular to each other. In an example embodiment, the first and second directions may cross each other by a predetermined acute angle. The definitions of the first and second directions are the same throughout the specification.

The base insulation layer 100 may include an insulation material, for example, silicon oxide, silicon nitride or silicon oxynitride. The base insulation layer 100 may cover lower structures, for example, a transistor, formed on a substrate.

The first conductive line 110 may include a metal, for example, tungsten (W), copper (Cu), aluminum (Al), titanium (Ti) or tantalum (Ta). In example embodiments, the first conductive line 110 may serve as a word line.

The second conductive line 180 may be disposed over the first conductive line 110 and may extend in the second direction. A plurality of the second conductive lines 180 may be arranged in the first direction. The second conductive line 180 may include a metal, for example, W, Cu, Al, Ti or Ta. In example embodiments, the second conductive line 180 may serve as a bit line.

The memory cell 150, including a variable resistance layer 130, may be disposed at the intersection region 160 at which the first and second conductive lines 110 and 180 overlap or cross each other.

In example embodiments, the variable resistance layer 130 may include a material, the resistance of which may be changed by an oxygen vacancy or an oxygen migration. In such embodiments, the variable resistance memory device may be implemented to a ReRAM device.

For example, the variable resistance layer 130 may include a perovskite-based material or a transition metal oxide. The perovskite-based material may include, for example, STO (SrTiO$_3$), BTO (BaTiO$_3$) or PCMO (Pr$_{1-x}$CaXMnO$_3$). The transition metal oxide may include titanium oxide (TiOx), zirconium oxide (ZrOx), aluminum oxide (AlOx), hafnium oxide (HfOx), tantalum oxide (TaOx), niobium oxide (NbOx), cobalt oxide (CoOx), tungsten oxide (WOx), lanthanum oxide (LaOx) or zinc oxide (ZnOx). These may be used alone or in a combination thereof.

The variable resistance layer 130 may have a multi-layered structure including a plurality of the above-mentioned materials. For example, the variable resistance layer 130 may include a first hafnium oxide (HfO$_2$) layer, a second hafnium oxide (HfOx) layer and a zirconium oxide layer. Alternatively, the variable resistance layer 130 may include a titanium aluminum oxide (TiAlOx) layer, a tantalum oxide layer and an aluminum oxide layer.

In an example embodiment, if the variable resistance memory device is implemented to a PRAM device, the variable resistance layer 130 may include a material, the resistance of which may be changed through a phase change or a phase transition. In such an embodiment, the variable resistance layer 130 may include a chalcogenide-based material in which germanium (Ge), antimony (Sb) and/or tellurium (Te) are combined by a predetermined ratio.

In an example embodiment, if the variable resistance memory device is implemented to an MRAM device, the variable resistance layer 130 may include a material, the resistance of which may be changed by a magnetic field or spin transfer torque (STT). In such an embodiment, the variable resistance layer 130 may include a ferromagnetic material, for example, iron (Fe), nickel (Ni), cobalt (Co), dysprosium (Dy) or gadolinium (Gd).

In example embodiments, the memory cell 150 may further include a lower electrode 120 interposed between the first conductive line 110 and the variable resistance layer 130, and an upper electrode 140 interposed between the second conductive line 180 and the variable resistance layer 130.

The lower electrode 120 and the upper electrode 140 may include a metal nitride or a metal silicon nitride such as titanium nitride (TiNx), titanium silicon nitride (TiSiNx), tungsten nitride (WNx), tungsten silicon nitride (WSiNx), tantalum nitride (TaNx), tantalum silicon nitride (TaSiNx), zirconium nitride (ZrNx) or zirconium silicon nitride (ZrSiNx).

A plurality of the memory cells 150 may be arranged in the first direction to form a memory cell column. A plurality of the memory cells 150 may be arranged in the second direction to form a memory cell row.

The variable resistance memory device may include a plurality of air gaps formed between the memory cells 150. In example embodiments, the air gaps may include the first air gap 170a and the second air gap 170b which cross and meet each other.

The first air gap 170a may be formed between the neighboring memory cell columns and may extend in the first direction. For example, the first air gap 170a may extend in the direction substantially the same as that of the first conductive line 110. As illustrated in FIG. 3A, the first conductive lines 110 may be separated or insulated from each other by the first air gap 170a. In an example embodiment, the first air gap 170a may extend through an upper portion of the base insulation layer 100.

The second air gap 170b may be formed between the neighboring memory cell rows and may extend in the second direction. For example, the second air gap 170b may extend in the direction substantially the same as that of the second conductive line 180. As illustrated in FIG. 3B, the second conductive lines 180 may be separated or insulated from each other by the second air gap 170b. In an example embodiment, the second air gap 170b may extend through an upper portion of the first conductive line 110.

As illustrated in FIGS. 3A and 3B, a spacer may be formed on a sidewall of the memory cell 150. In example embodiments, the spacer may include a first spacer 165a and a second spacer 165b formed in the first air gap 170a and the second air gap 170b, respectively. The spacer may include, for example, silicon nitride.

The first spacer 165a and the second spacer 165b may be formed on bottoms and sidewalls of the first air gap 170a and the second air gap 170b, respectively. Accordingly, the first spacer 165a may be formed on the sidewalls of the memory cell 150 and sidewalls of the first conductive line 110. The second spacer 165b may be formed on the sidewalls of the memory cells 150 and sidewalls of the second conductive lines 180.

As illustrated in FIG. 3B, a capping layer pattern may be disposed at an upper portion of the second air gap 170b to cap, or close, the second air gap 170b. In example embodiments, the capping layer pattern may include a first capping layer pattern 185 and the second capping layer pattern 190.

The first capping layer pattern 185 may be formed on an upper sidewall of the second spacer 165b, and may include an opening 187 at a central bottom thereof, through which the second air gap 170b is exposed. The second capping layer pattern 190 may be formed on the first capping layer pattern 185 and may fill or block the opening 187. Thus, the second air gap 170b may be capped or closed by the second capping layer pattern 190. The first and second capping layer patterns 185 and 190 may extend in the second direction substantially the same as that of the second air gap 170b. Further, an upper portion of the first air gap 170a may be also capped or closed by the first and second capping layer patterns 185 and 190. Accordingly, the upper portion of the first air gap 170a may be covered by the second conductive line 180, the first capping layer pattern 185 and the second capping layer pattern 190.

In example embodiments, the first capping layer pattern 185 may include an insulation material which has good step coverage or conformability. For example, the first capping layer pattern 185 may include a middle temperature oxide (MTO), a high temperature oxide (HTO) or an atomic layer deposition (ALD) oxide. The second capping layer pattern 190 may include an insulation material which has relatively poor step coverage or gap fill properties. For example, the second capping layer pattern 190 may include tetra ethyl ortho silicate (TEOS) or a chemical vapor deposition (CVD) oxide.

According to example embodiments of inventive concepts, the variable resistance memory device may include the first air gap 170*a* and the second air gap 170*b* which cross and meet each other between the memory cells 150. Thus, the sidewall of each memory cell 150 may be completely surrounded by the air gap. Accordingly, cross-talk, parasitic capacitance and interference generated between the neighboring memory cells 150 may be minimized.

FIGS. 4 to 16 are cross-sectional views and top plan views illustrating a method of manufacturing a variable resistance memory device in accordance with example embodiments. Specifically, FIGS. 4, 5A, 6, 7, 8A and 14A are cross-sectional views taken along the second direction. FIGS. 8B, 9A, 10, 11, 12, 13, 14B, 15 and 16 are cross-sectional views taken along the first direction. FIGS. 5B and 9B are top plan views of FIGS. 5A and 9A, respectively.

Figure 4:
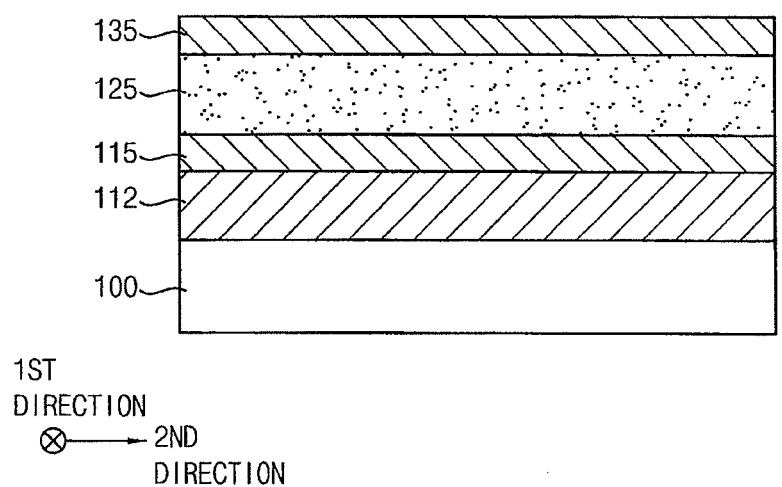
FIGS. 4 to 16 are cross-sectional views and top plan views illustrating a method of manufacturing a variable resistance memory device in accordance with example embodiments.

Referring to FIG. 4, a first conductive layer 112, a lower electrode layer 115, a variable resistance material layer 125 and an upper electrode layer 135 may be sequentially formed on a base insulation layer 100.

The base insulation layer 100 may include an insulation material, for example, silicon oxide, silicon nitride or silicon oxynitride. The base insulation layer 100 may cover lower structures (not illustrated), for example, a transistor, formed on a substrate (not illustrated).

The first conductive layer 112 may be formed using a metal, for example, W, Cu, Al, Ti or Ta, which may be used alone or in a combination thereof.

The lower electrode layer 115 and the upper electrode layer 135 may be formed using a metal nitride or a metal silicon nitride. For example, the lower and upper electrode layers 115 and 135 may be formed using titanium nitride, titanium silicon nitride, tungsten nitride, tungsten silicon nitride, tantalum nitride, tantalum silicon nitride, zirconium nitride or zirconium silicon nitride, which may be used alone or in a combination thereof.

A material for the variable resistance material layer 125 may be selected in consideration of types of the variable resistance memory device. In example embodiments, if the variable resistance memory device is implemented to a ReRAM device, the variable resistance material layer 125 may be formed using a perovskite-based material or a transition metal oxide. For example, the variable resistance material layer 125 may be formed using STO, BTO, PCMO, titanium oxide, zirconium oxide, aluminum oxide, hafnium oxide, tantalum oxide, niobium oxide, cobalt oxide, tungsten oxide, lanthanum oxide or zinc oxide, which may be used alone or in a combination thereof. The variable resistance material layer 125 may be formed as a multi-layered structure including a plurality of the above materials.

In an example embodiment, if the variable resistance memory device is implemented to a PRAM device, the variable resistance material layer 125 may be formed using a chalcogenide-based material.

In an example embodiment, if the variable resistance memory device is implemented to an MRAM device, the variable resistance material layer 125 may be formed using a ferromagnetic material, for example, Fe, Ni, Co, Dy or Gd.

The first conductive layer 112, the lower electrode layer 115, the variable resistance material layer 125 and the upper electrode layer 135 may be formed by, for example, a physical vapor deposition (PVD) process, a sputtering process, an ALD process or a CVD process.

Figure 5A:
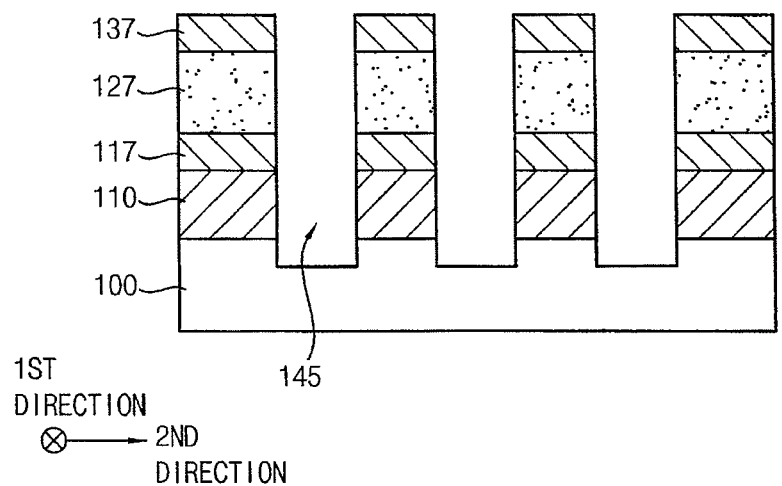
Figure 5B:
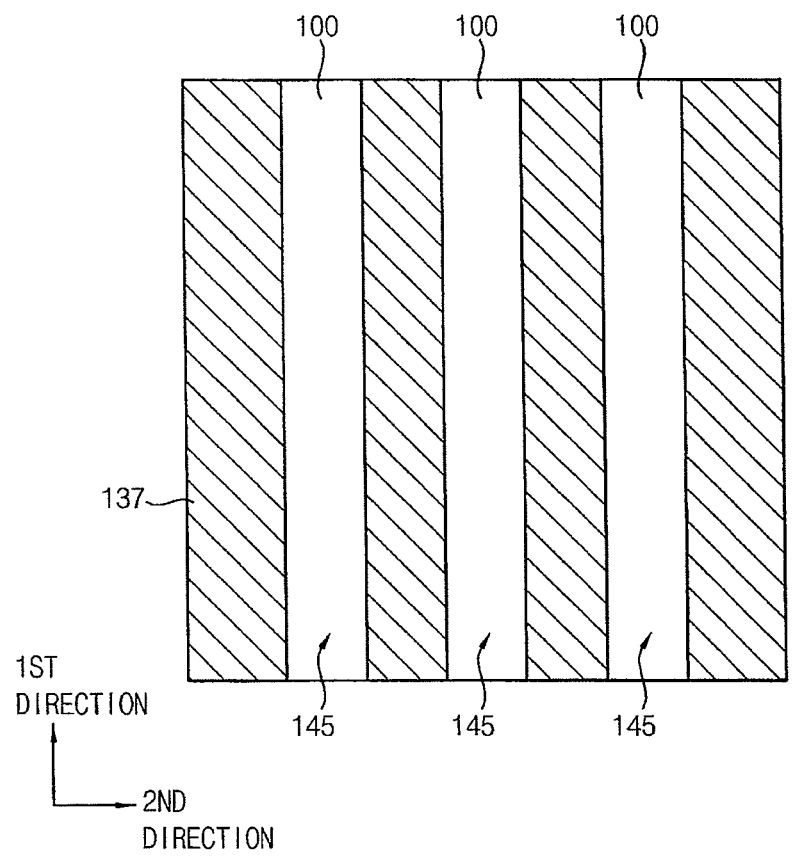

Referring to FIGS. 5A and 5B, the upper electrode layer 135, the variable resistance material layer 125 and the lower electrode layer 115 may be partially etched to form a first trench 145.

For example, a mask pattern (not illustrated) extending in the first direction may be formed on the upper electrode layer 135. The upper electrode layer 135, the variable resistance material layer 125 and the lower electrode layer 115 may be partially removed by a dry etching process using the mask pattern as an etching mask to form the first trench 145. The mask pattern may be formed using, for example, a photoresist material or polysilicon. The mask pattern may be removed by an ashing process and/or a strip process after the formation of the first trench 145.

An upper portion of the base insulation layer 100 may be partially removed while forming the first trench 145 by the etching process. In such an embodiment, the first trench 145 may extend through the upper portion of the base insulation layer 100.

In example embodiments, the first trench 145 may extend in the first direction, and a plurality of the first trenches 145 may be formed in the second direction. By the formation of the first trench 145, a first conductive line 110, a lower electrode layer pattern 117, a variable resistance material layer pattern 127 and an upper electrode layer pattern 137 sequentially stacked on the base insulation layer 100 and extending in the first direction may be obtained.

As described above, the first trench 145 may extend partially through the base insulation layer 100. Thus, an insulation of the neighboring first conductive lines 110 may be guaranteed by the first trench 145. For example, while etching the first conductive layer 112, an etching residue may remain on a top surface of the base insulation layer 100 to cause an interference or a short-circuit between the neighboring first conductive lines 110. According to example embodiments, the upper portion of the base insulation layer 100 may be partially removed during the etching process for the first trench 145 so that the etching residue may be also removed. As a result, the reliability of signal transfer through the first conductive line 110 may be improved.

In example embodiments, the first conductive line 110 may serve as a word line of the variable resistance memory device.

Figure 6:
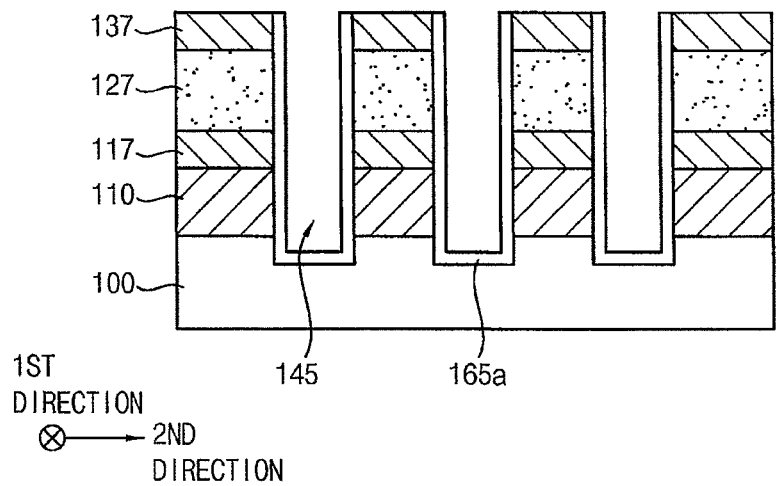

Referring to FIG. 6, a first spacer 165*a* may be formed on a sidewall and a bottom of the first trench 145.

For example, a first spacer layer may be formed along top surfaces of the upper electrode layer patterns 137, and the sidewalls and the bottoms of the first trenches 145. An upper portion of the first spacer layer may be planarized until the top surface of the upper electrode layer pattern 137 is exposed to form the first spacer 165*a*. The first spacer layer may be formed using, for example, silicon nitride by a CVD process or an ALD process. The planarization process may include a chemical mechanical polish (CMP) process and/or an etch-back process.

Figure 7:
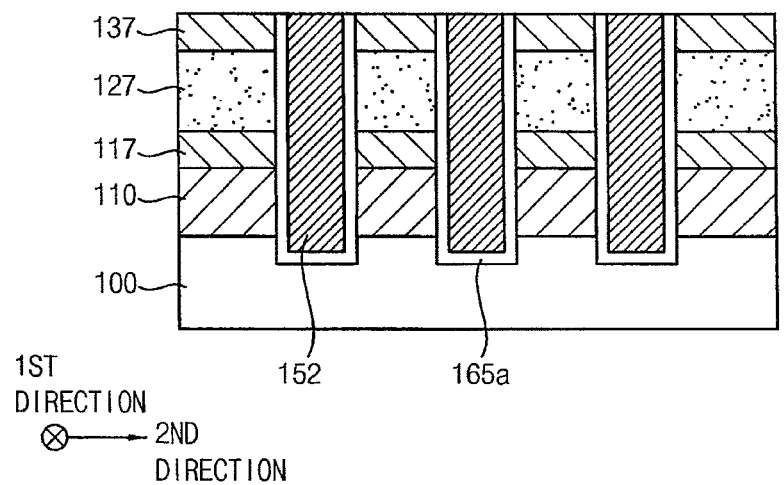

Referring to FIG. 7, a first sacrificial layer pattern 152 filling the first trench 145 may be formed on the first spacer 165*a*.

In example embodiments, a first sacrificial layer filling the first trench 145 may be formed on the upper electrode layer pattern 137 and the first spacer 165*a*. The first sacrificial layer may be planarized by a CMP process or an etch-back process until the top surface of the upper electrode layer pattern 137 is exposed to form the first sacrificial layer pattern 152. The first sacrificial layer pattern 152 may extend in the first direction.

In an example embodiment, a thermal treatment, for example, an annealing process may be performed for curing the first sacrificial layer. When the thermal treatment is performed at a high temperature, properties of the variable resistance layer pattern 127 may be modified, resulting in a wide distribution of memory cell properties and operation. In order to avoid such an undesirable variation in properties, a material capable of being cured at a relatively low temperature may be used for the first sacrificial layer.

In example embodiments, the first sacrificial layer may be formed using silicon-based or carbon-based spin-on hardmask (SOH) materials. For example, the SOH material may include silicon carbide (SiC), silicon oxycarbide or hydrocarbon compounds. These may be used alone or in a combination thereof.

The SOH material may be cured at a temperature lower than that for curing a general gap-fill insulation material, for example, silicon oxide. For example, the thermal treatment for curing the first sacrificial layer may be performed at a temperature raging from about 300° C. to about 400° C. The first sacrificial layer may be formed by a CVD process or an ALD process.

Figure 8A:
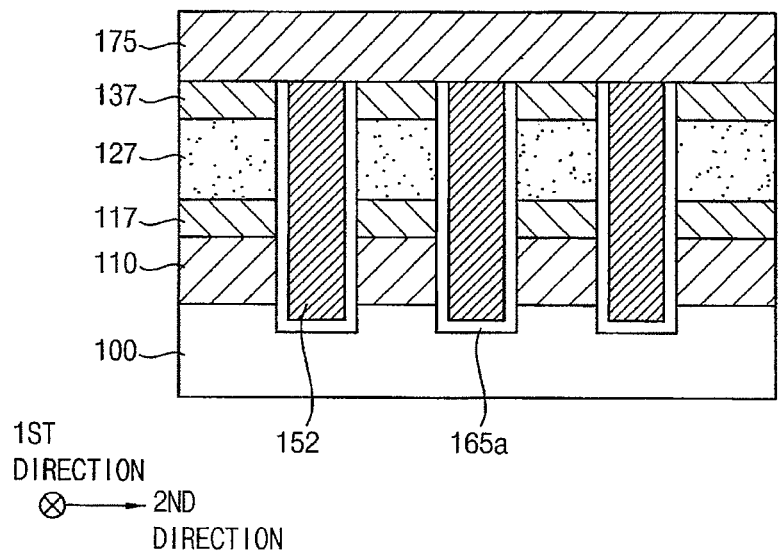
Figure 8B:
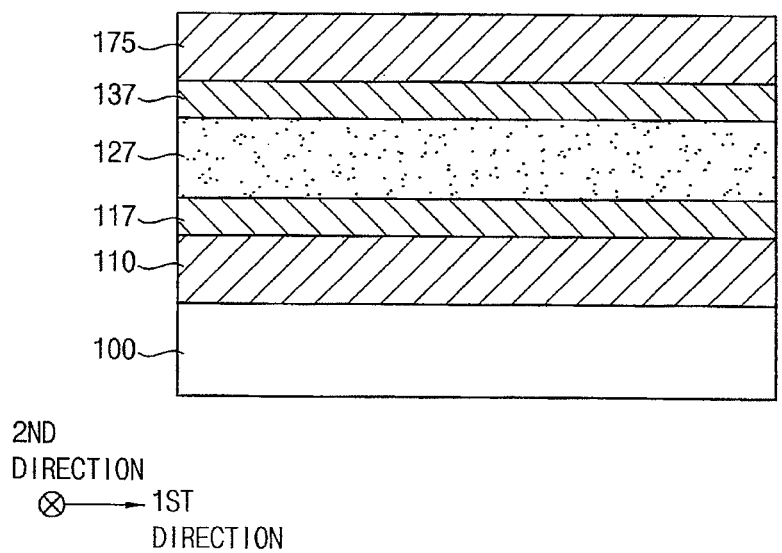

Referring to FIGS. 8A and 8B, a second conductive layer 175 may be formed on the upper electrode layer pattern 137, the first spacer 165a and the first sacrificial layer pattern 152.

The second conductive layer 175 may be formed using a metal, for example, W, Cu, Al, Ti or Ta, which may be used alone or in a combination thereof. The second conductive layer 175 may be formed by a PVD process, a sputtering process, an ALD process, a CVD process, for example.

Figure 9A:
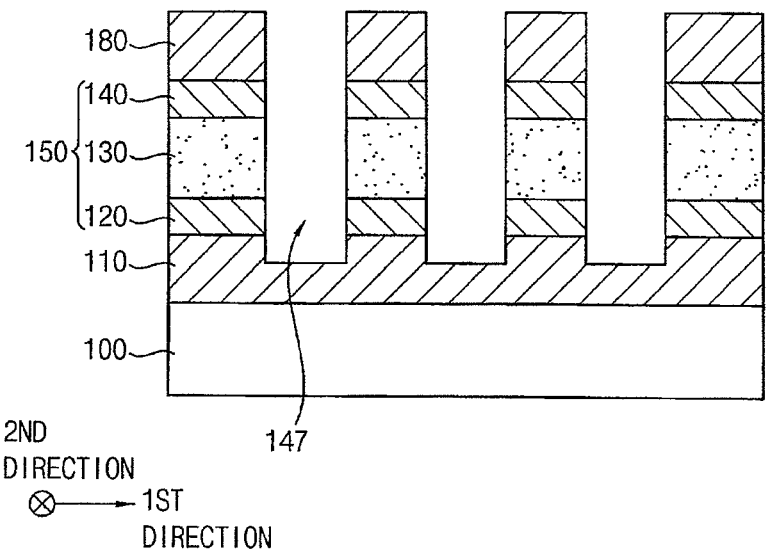
Figure 9B:
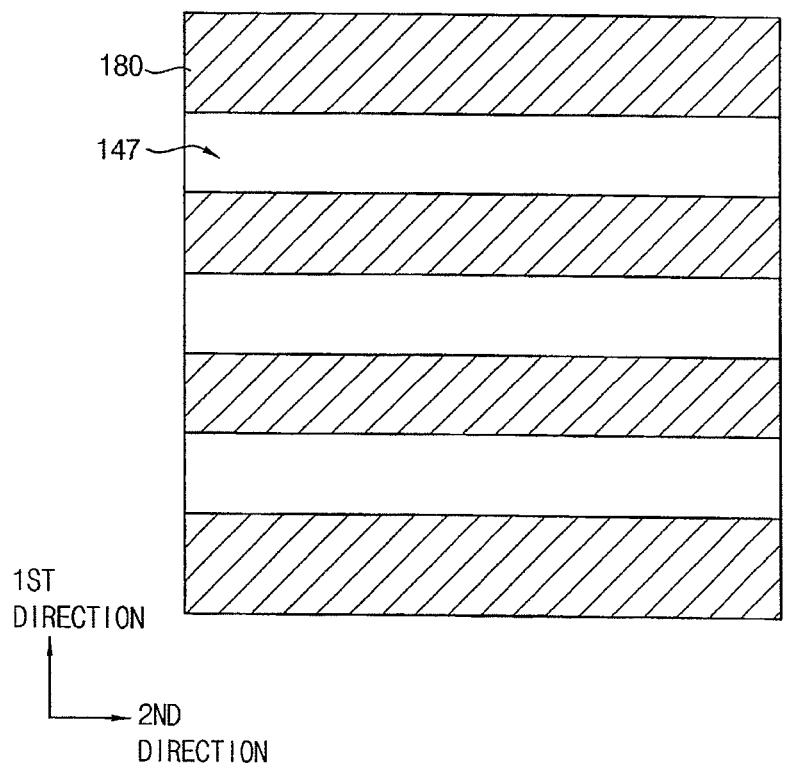

Referring to FIGS. 9A and 9B, the second conductive layer 175, the upper electrode layer pattern 137, the variable resistance material layer pattern 127 and the lower electrode layer pattern 117 may be partially removed to form a second trench 147.

For example, a mask pattern (not illustrated) extending in the second direction may be formed on the second conductive layer 175. The second conductive layer 175, the upper electrode layer pattern 137, the variable resistance material layer pattern 127 and the lower electrode layer pattern 117 may be partially removed by a dry etching process using the mask pattern as an etching mask to form the second trench 147. The mask pattern may be formed using, for example, a photoresist material or polysilicon. The mask pattern may be removed by an ashing process and/or a strip process after the formation of the second trench 147.

An upper portion of the first conductive line 110 may be partially removed while forming the second trench 147 by the etching process. In such an embodiment, the second trench 147 may extend through the upper portion of the first conductive line 110. The first spacer 165a and the first sacrificial layer pattern 152 may be also partially removed by the etching process. Accordingly, the first spacer 165a and the first sacrificial layer pattern 152 may be cut or isolated by the second trench 147.

In example embodiments, the second trench 147 may extend in the second direction, and a plurality of the second trenches 147 may be formed in the first direction. By the formation of the second trench 147, the lower electrode layer pattern 117, the variable resistance material layer pattern 127 and the upper electrode layer pattern 137 extending linearly in the first direction may be transformed into a lower electrode 120, a variable resistance layer 130 and an upper electrode 140, respectively, each having a substantially island shape. A memory cell 150 may include the lower electrode 120, the variable resistance layer 130 and the upper electrode 140.

The second conductive layer 175 may be transformed into a plurality of second conductive lines 180 by the formation of the second trench 147. The second conductive line 180 may extend in the second direction, and the plurality of the second conductive lines 180 may be arranged in the first direction. Accordingly, the second conductive line 180 may be disposed over the first conductive line 110, and the second and first conductive lines 180 and 110 may cross each other. As illustrated in FIG. 2, the memory cell 150 may be formed at each intersection region of the first conductive line 110 and the second conductive line 180.

In example embodiments, the second conductive line 180 may serve as a bit line of the variable resistance memory device.

As described above, the second trench 147 may extend partially through the first conductive line 110. As a result, insulation of the neighboring lower electrodes 120 may be guaranteed by the second trench 147. While etching the lower electrode layer pattern 117, an etching residue could remain on a top surface of the first conductive line 110. Such residue could cause interference between neighboring memory cells 150. According to example embodiments, the upper portion of the first conductive line 110 may be partially removed during the etching process for the second trench 147 in order to ensure that the etching residue is also removed. By thereby ensuring the removal of etching residue, the reliability of all memory cells 150 may be improved.

Figure 10:
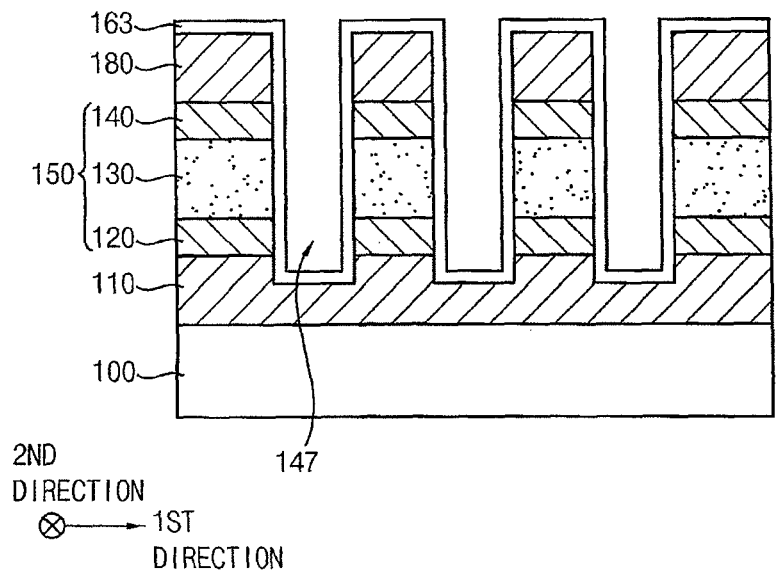

Referring to FIG. 10, a second spacer layer 163 may be formed on top surfaces of the second conductive lines 180 and on sidewalls and bottoms of the second trenches 147. For example, the second spacer layer 163 may be formed using silicon nitride by a CVD process or an ALD process.

Figure 11:
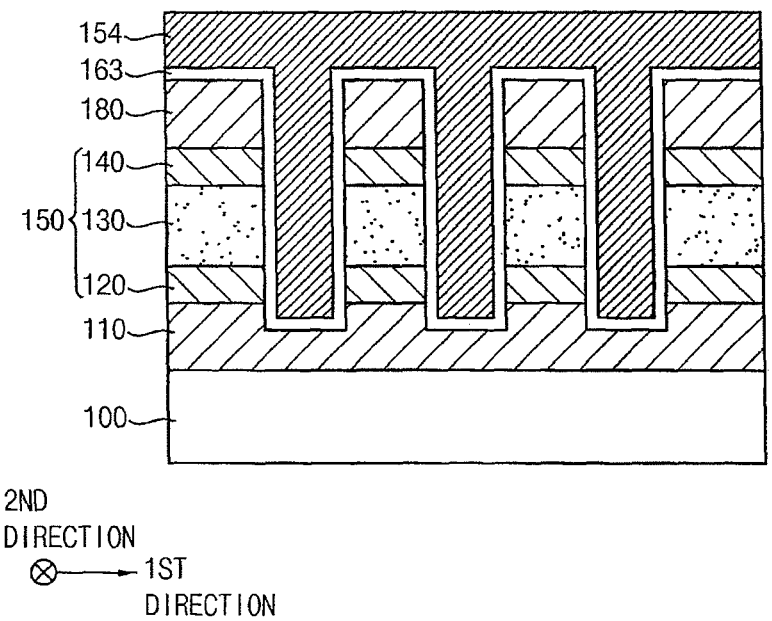

Referring to FIG. 11, a second sacrificial layer 154 filling the second trench 147 may be formed on the second spacer layer 163.

In example embodiments, the second sacrificial layer may be formed using silicon-based or carbon-based SOH materials by a CVD process or an ALD process. For example, the SOH material may include silicon carbide, silicon oxycarbide or hydrocarbon compounds.

In an example embodiment, a thermal treatment, for example, an annealing process may be further performed for curing the second sacrificial layer 154. As described above, the SOH material may be cured at a relatively low temperature, ranging from about 300° C. to about 400° C., so that an undesirable modification of the variable resistance layer 130 during a curing process may be prevented.

Figure 12:
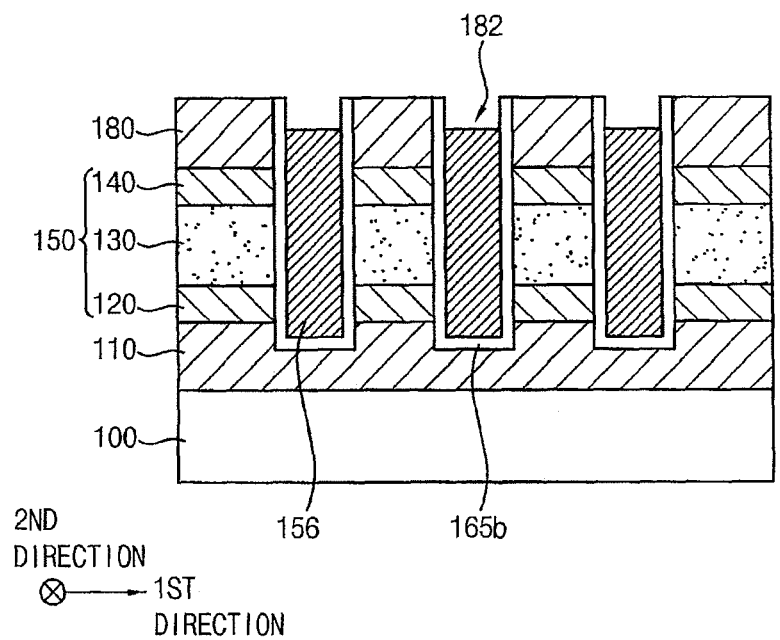

Referring to FIG. 12, the second spacer layer 163 and the second sacrificial layer 154 may be partially removed to form a second spacer 165b and a second sacrificial layer pattern 156.

In example embodiments, upper portions of the second sacrificial layer 154 and the second spacer layer 163 may be planarized by a CMP process until the top surface of the second conductive line 180 is exposed. Accordingly, the portion of the second spacer layer 163 formed on the top surface of the second conductive line 180 may be removed to form the second spacer 165b. An upper portion of the second sacrificial layer 154 may be further removed by, for example, an etchback process to form the second sacrificial layer pattern 156.

The second sacrificial layer pattern 156 may partially fill the second trench 147, and thus a first recess 182 may be defined at a remaining portion of the second trench 147.

Figure 13:
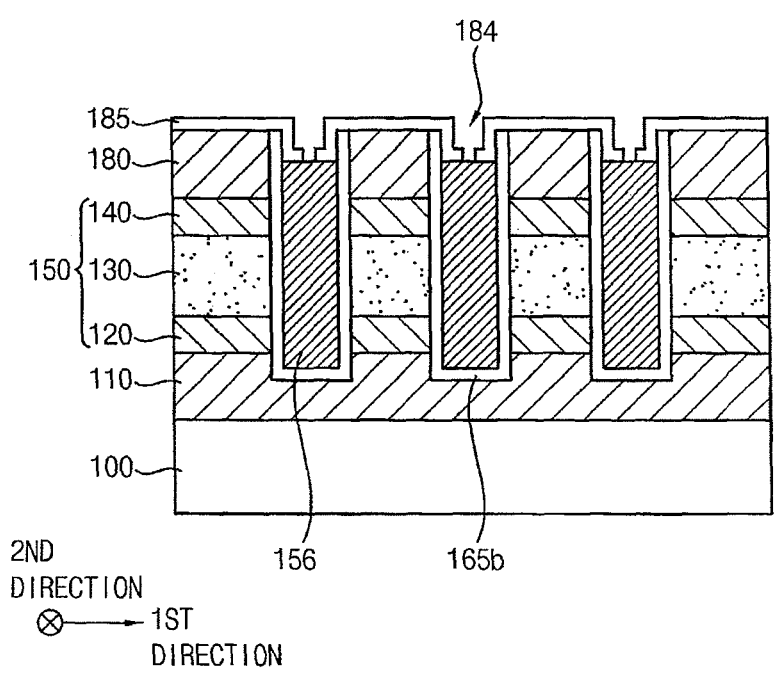

Referring to FIG. 13, a first capping layer pattern 185 may be formed on top surfaces of the second conductive line 180 and the second spacer 165b, and on a portion of a top surface of the second sacrificial layer pattern 156.

In example embodiments, a first capping layer may be formed on the top surfaces of the second conductive line 180, the second spacer 165b and the second sacrificial layer pattern 156. The first capping layer may be formed using a material and a process condition which have good step coverage or conformability. For example, the first capping layer may be formed using an MTO, an HTO or an ALD oxide by an ALD process.

A portion of the first capping layer formed on the second sacrificial layer pattern 156 may be partially removed by an etch-back process to form the first capping layer pattern 185 and a second recess 184. The top surface of the second sacrificial layer pattern 156 may be partially exposed through the second recess 184.

Figure 14A:
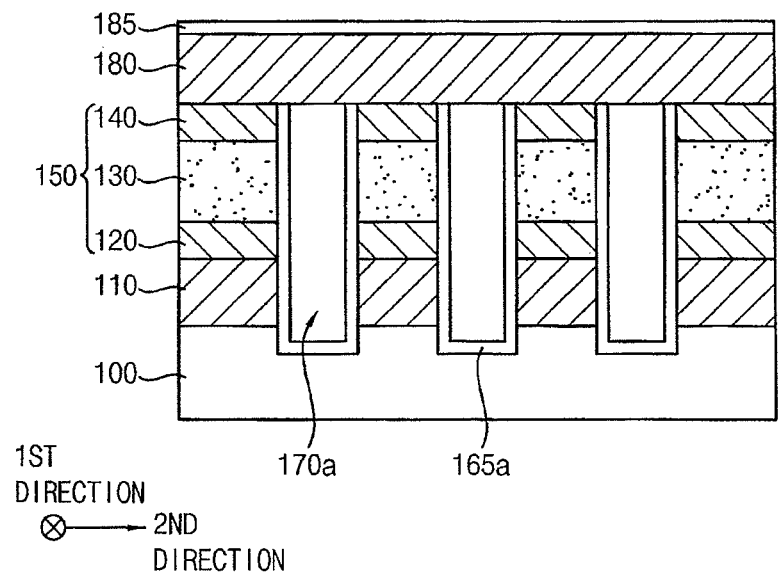
Figure 14B:
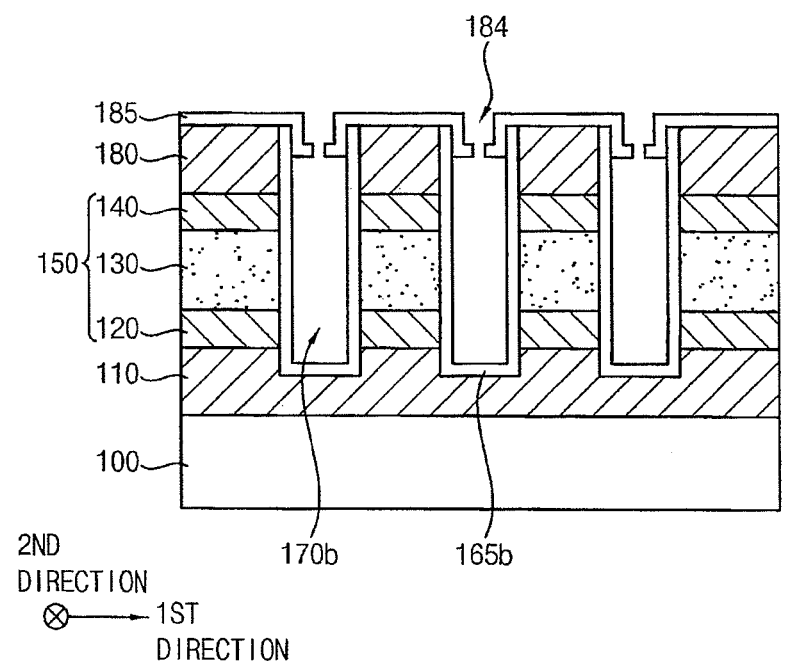

Referring to FIGS. 14A and 14B, the second sacrificial layer pattern 156 exposed through the second recess 184 may be removed. The first sacrificial layer pattern 152 may be also removed together with the second sacrificial layer pattern 156. Accordingly, a first air gap 170*a* and a second air gap 170*b* may be formed at spaces from which the first and second sacrificial layer patterns 152 and 156 are removed.

In example embodiments, the sacrificial layer patterns 152 and 156 may be removed by an ashing process, for example. The second sacrificial layer pattern 156 may be removed by the ashing process to form the second air gap 170*b*. A sidewall of the first sacrificial layer pattern 152 may be exposed by the second air gap 170*b*, and thus the first sacrificial layer pattern 152 may be also removed by the ashing process to form the first air gap 170*a*.

The sacrificial layer patterns 152 and 156 may include carbide or the SOH material which may be easily combusted or oxidized by the ashing process. Thus, the sacrificial layer patterns 152 and 156 may be selectively removed by the ashing process.

According to example embodiments, the first air gap 170*a* and the second air gap 170*b* may extend in the first direction and the second direction, respectively, and may cross each other. The first air gap 170*a* and the second air gap 170*b* may be in fluid communication with each other. Thus, all sides of one memory cell 150 may be surrounded by the two first air gaps 170*a* and the two second air gaps 170*b*. As a result, parasitic capacitance and interference between neighboring memory cells 150 may be minimized.

Additionally, the sacrificial layer patterns 152 and 156 including the SOH material may be utilized for the formation of the air gaps. As described above, the SOH material may be cured at the low temperature, so that deleterious modification of the variable resistance layer 130, which may occur at higher temperatures, may be avoided. Additionally, the SOH material may be easily removed by the ashing process, so that the air gaps 170*a* and 170*b* may be formed without damaging other structures.

Figure 15:
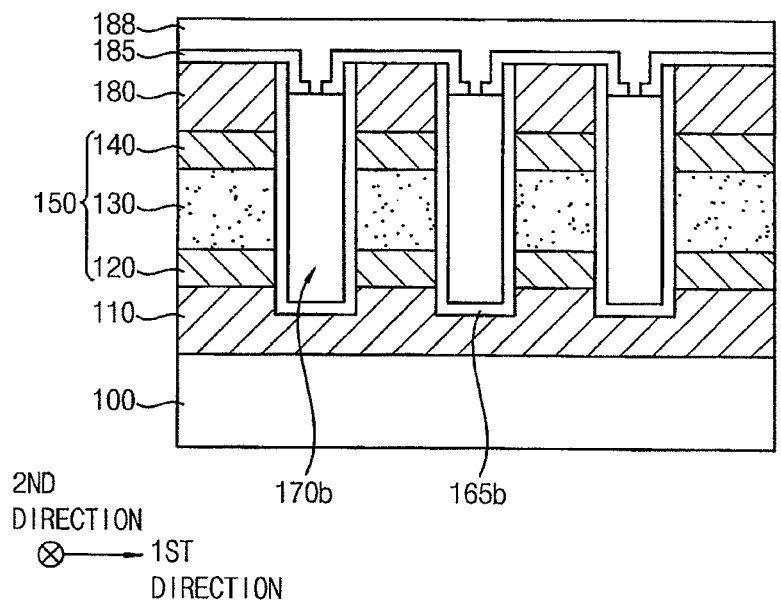

Referring to FIG. 15, a second capping layer 188 closing the second recess 184 may be formed on the first capping layer pattern 185. In example embodiments, the second capping layer 188 may be formed using an insulation material which has relatively poor step coverage or gap fill properties relative to the first capping layer. For example, the second capping layer 188 may be formed using silicon oxide such as TEOS or a CVD oxide. The second capping layer 188 may be formed by a process condition that has the gap fill property lower than that of an ALD process. For example, the second capping layer 188 may be formed by a CVD process or a spin coating process. Advantageously, as a result, the second capping layer 188 leaves the air gaps 170*a* and 170*b* unfilled. For example, the second capping layer 188 may be overhung by the first capping layer pattern 185.

Figure 16:
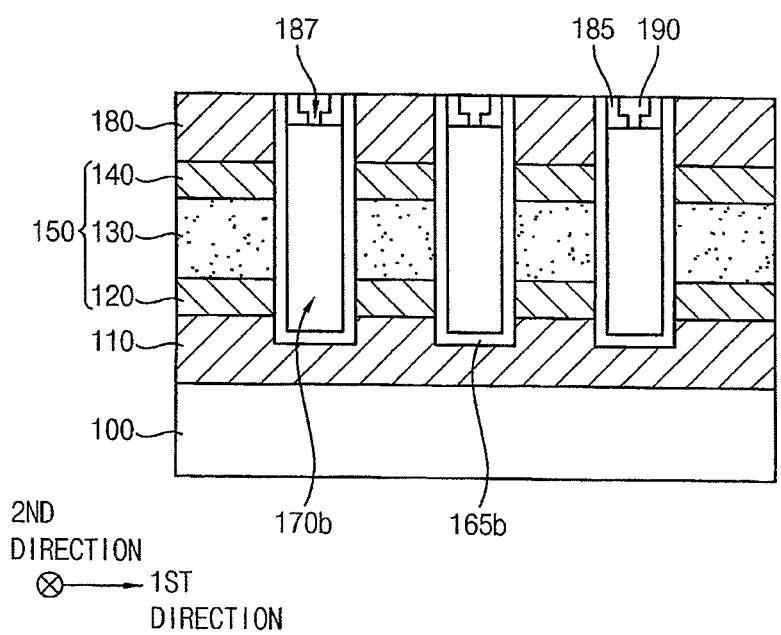

Referring to FIG. 16, an upper portion of the second capping layer 188 may be planarized to form a second capping layer pattern 190 extending linearly in the second direction.

In such an embodiment, the second capping layer pattern 190 may be formed as a line pattern capping each second air gap 170*b*.

Figure 17A:
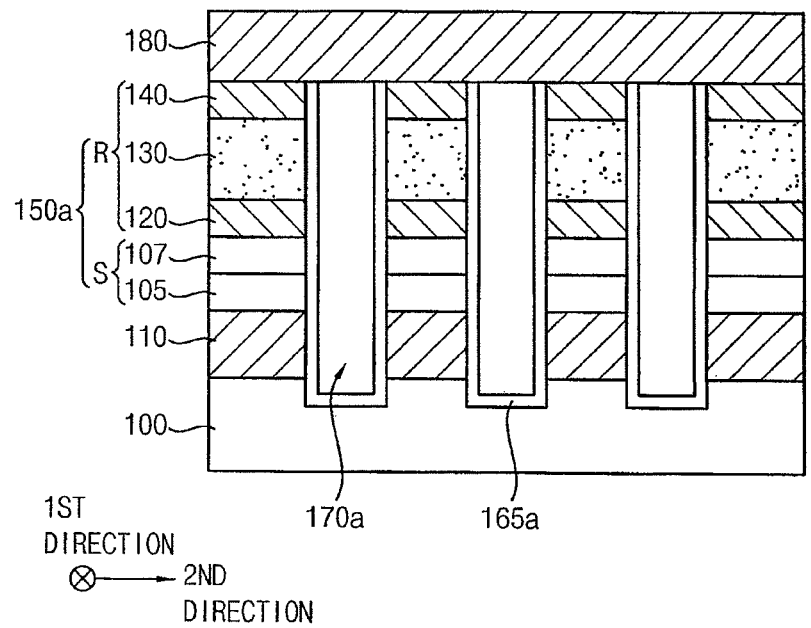
FIGS. 17A and 17B are cross-sectional views illustrating a variable resistance memory device in accordance with some example embodiments.
Figure 17B:
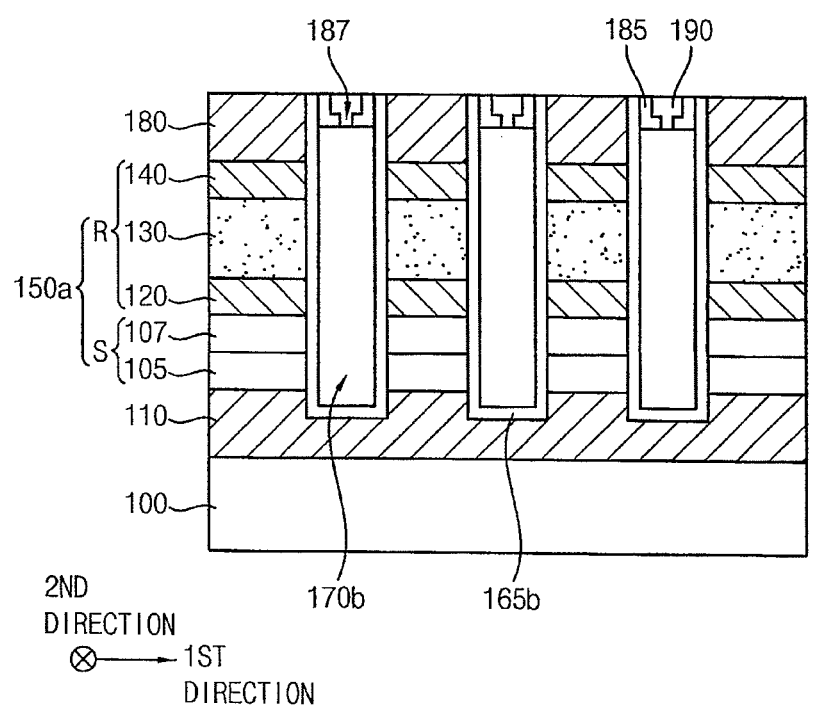

FIGS. 17A and 17B are cross-sectional views illustrating a variable resistance memory device in accordance with example embodiments. Specifically, FIGS. 17A and 17B are cross-sectional views of the variable resistance memory device taken along the second direction and the first direction, respectively.

For example, FIGS. 17A and 17B illustrate a cross-point memory cell array having a "1R+1S" structure in which one selection device and one variable resistance device are located at each intersection region of conductive lines. Detailed descriptions of elements and/or constructions substantially the same as, or similar to, those illustrated with reference to FIGS. 1 to 3B will not be repeated here. Like reference numerals are used to designate like elements.

Referring to FIGS. 17A and 17B, the variable resistance memory device may include a memory cell 150*a* located at each intersection region of a first conductive line 110 and a second conductive line 180. The memory cell 150*a* may have a stacked structure including a selection device S and a variable resistance device R.

The variable resistance device R may include a lower electrode 120, a variable resistance layer 130 and an upper electrode 140.

In example embodiments, the selection device S may include a P-N diode. In such embodiments, the selection device S may include a lower semiconductor layer pattern 105 and an upper semiconductor layer pattern 107 stacked on the first conductive line 110. For example, the lower semiconductor layer pattern 105 and the upper semiconductor layer pattern 107 may include polysilicon doped with n-type impurities and p-type impurities, respectively.

Alternatively, the lower semiconductor layer pattern 105 and the upper semiconductor layer pattern 107 may include an n-type oxide semiconductor and a p-type oxide semiconductor, respectively. The n-type oxide semiconductor may include, for example, zinc oxide (ZnOx) or indium zinc oxide (InZnOx). The p-type oxide semiconductor may include, for example, copper oxide (CuOx).

In an example embodiment, a first buffer layer (not illustrated) may be further disposed between the first conductive line 110 and the selection device S. A second buffer layer (not illustrated) may be further disposed between the selection device S and the variable resistance device R. The first and second buffer layers may include a metal nitride, for example, titanium nitride, tantalum nitride, tungsten nitride or zirconium nitride.

As illustrated with reference to FIGS. 1 to 3B, a first air gap 170*a* and a second air gap 170*b* extending in the first direction and the second direction, respectively, may be formed between the neighboring memory cells 150*a* to prevent parasitic capacitance and interference between memory cells 150*a*. The first air gap 170*a* may extend through an upper portion of a base insulation layer 100, and the second air gap 170*b* may extend through an upper portion of the first conductive line 110.

A first spacer 165*a* and a second spacer 165*b* may be formed on sidewalls and bottoms of the first air gap 170*a* and the second air gap 170*b*, respectively. Sidewalls of the memory cell 150*a* may be surrounded by the first and second spacers 165*a* and 165*b*.

A first capping layer pattern 185 and a second capping layer pattern 190 may be disposed at an upper portion of the second air gap 170*b*. The second capping layer pattern 190 may be formed on the first capping layer pattern 185 to cap, or close, opening 187. An upper portion of the first air gap 170*a* may be covered by the second conductive lines 180 and the capping layer patterns 185 and 190.

FIGS. 18 to 24 are cross-sectional views illustrating a method of manufacturing a variable resistance memory device in accordance with example embodiments. Specifically, FIGS. 18, 19, 20 and 23A are cross-sectional views taken along the second direction. FIGS. 21, 22, 23*b* and 24 are cross-sectional views taken along the first direction.

Detailed descriptions of processes and/or materials substantially the same as, or similar to, those illustrated with reference to FIGS. 4 to 16 will not be repeated here.

Figure 18:
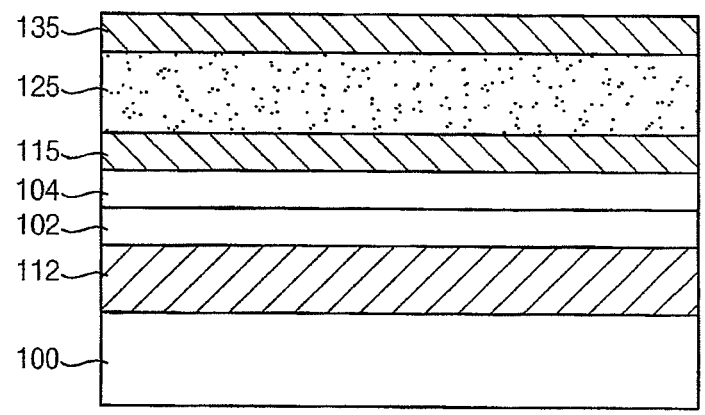
FIGS. 18 to 24 are cross-sectional views illustrating a method of manufacturing a variable resistance memory device in accordance with some example embodiments.

Referring to FIG. 18, a first conductive layer 112, a lower semiconductor layer 102, an upper semiconductor layer 104, a lower electrode layer 115, a variable resistance material layer 125 and an upper electrode layer 135 may be sequentially formed on a base insulation layer 100.

The lower semiconductor layer 102 may be formed using polysilicon doped with n-type impurities such as phosphorous (P) or arsenic (As). In an example embodiment, an amorphous silicon layer may be deposited, and the n-type impurities may be implanted thereto. A crystallization process such as a laser annealing process may be performed on the amorphous silicon layer to form the lower semiconductor layer 102. Alternatively, the lower semiconductor layer 102 may be formed using an n-type oxide semiconductor, for example, zinc oxide or indium zinc oxide.

The upper semiconductor layer 104 may be formed using polysilicon doped with p-type impurities such as boron (B) or gallium (Ga). In example embodiments, an amorphous silicon layer may be deposited, and the p-type impurities may be implanted thereto. A crystallization process such as a laser annealing process may be performed on the amorphous silicon layer to form the upper semiconductor layer 104. Alternatively, the upper semiconductor layer 104 may be formed using a p-type oxide semiconductor, for example, copper oxide.

The lower and upper semiconductor layers 102 and 104 may be formed by a PVD process, a sputtering process or an ALD process.

In an example embodiment, a first buffer layer (not illustrated) may be further formed between the first conductive layer 112 and the lower semiconductor layer 102. Additionally, a second buffer layer (not illustrated) may be formed between the upper semiconductor layer 104 and the lower electrode layer 115. The first and second buffer layers may be formed using a metal nitride such as titanium nitride, tantalum nitride, tungsten nitride or zirconium nitride by a PVD process, a sputtering process or an ALD process.

Figure 19:
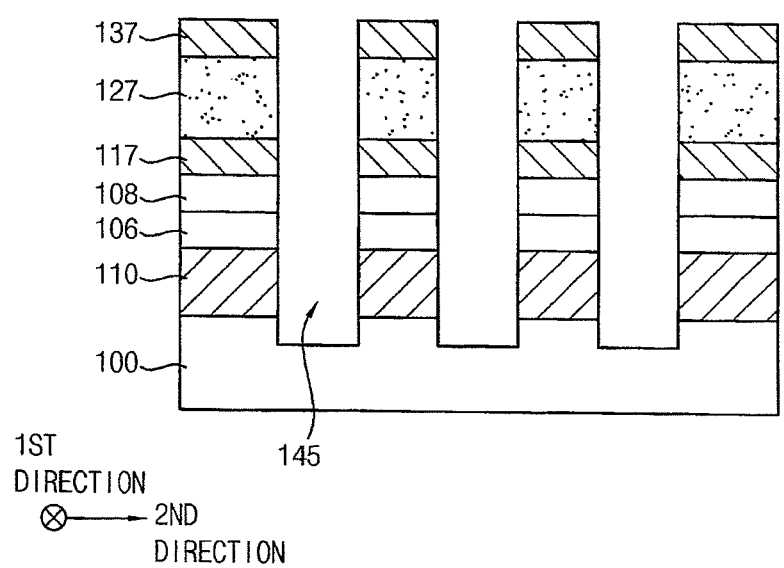

Referring to FIG. 19, a process substantially the same as or similar to that illustrated with reference to FIG. 5A may be performed to form a first trench 145.

The first trench 145 may extend in the first direction, and a plurality of the first trenches 145 may be formed in the second direction. The first trench 145 may extend through an upper portion of the base insulation layer 100.

By the formation of the first trench 145, a first conductive line 110, a lower semiconductor layer line 106, an upper semiconductor layer line 108, a lower electrode layer pattern 117, a variable resistance material layer pattern 127 and an upper electrode layer pattern 137, each of which extends in the first direction, may be formed sequentially on the base insulation layer 100.

Figure 20:
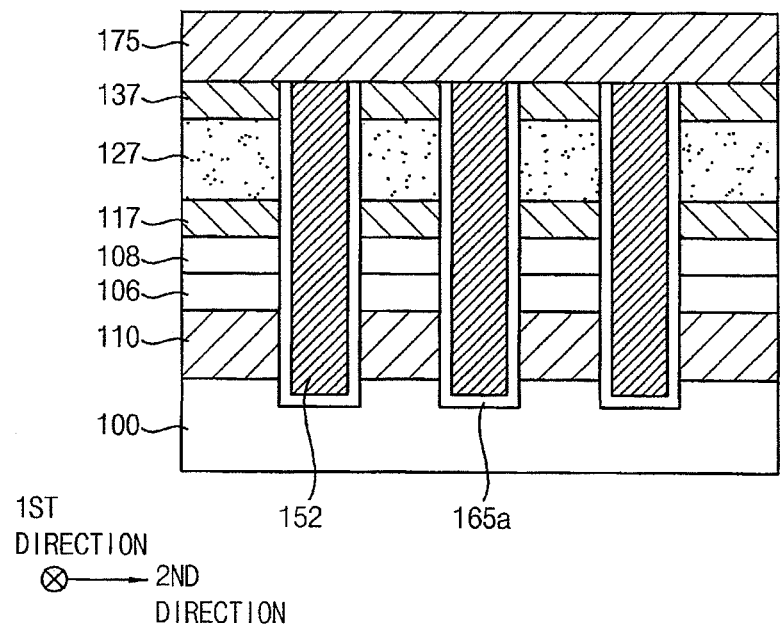

Referring to FIG. 20, processes substantially the same as or similar to those illustrated with reference to FIGS. 6 to 8B may be performed.

Accordingly, a first spacer 165*a* may be formed on a sidewall and a bottom of the first trench 145, and a first sacrificial layer pattern 152 filling the first trench 145 may be formed on the first spacer 165*a*. A second conductive layer 175 may be formed on the upper electrode layer pattern 137, the first spacer 165*a* and the first sacrificial layer pattern 152.

Figure 21:
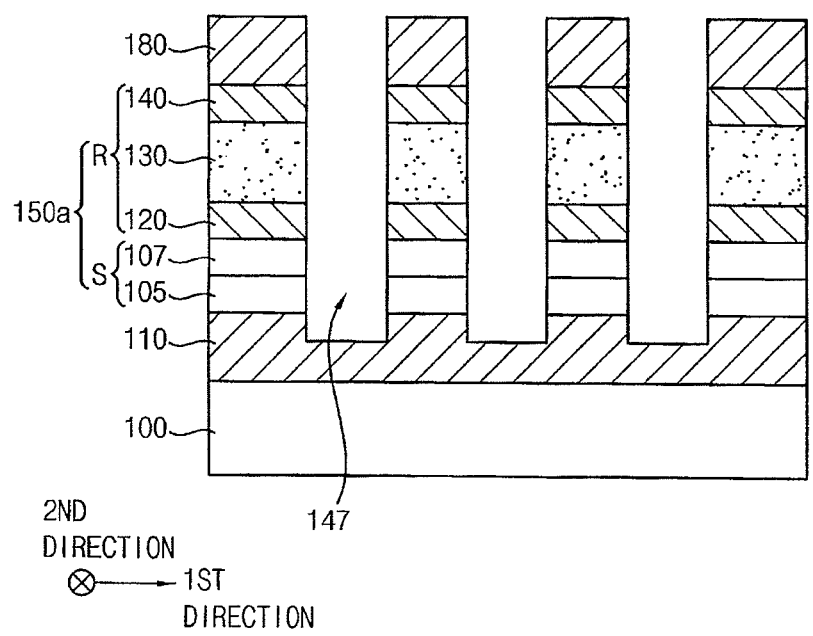

Referring to FIG. 21, a process substantially the same as or similar to that illustrated with reference to FIGS. 9A to 9B may be performed.

Accordingly, a second trench 147 extending in the second direction may be formed through the second conductive layer 175, the upper electrode layer pattern 137, the variable resistance material layer pattern 127, the lower electrode layer pattern 117, the upper semiconductor layer line 108 and the lower semiconductor layer line 106. A plurality of the second trenches 147 may be formed in the first direction. The second trench may extend through an upper portion of the first conductive line 110.

By the formation of the second trench, a second conductive line 180 extending in the second direction may be formed. Additionally, the upper electrode layer pattern 137, the variable resistance material layer pattern 127, the lower electrode layer pattern 117, the upper semiconductor layer line 108 and the lower semiconductor layer line 106 may be transformed into an upper electrode 140, a variable resistance layer 130, a lower electrode 120, an upper semiconductor layer pattern 107 and a lower semiconductor layer pattern 105, respectively.

A variable resistance device R may be defined by the lower electrode 120, the variable resistance layer 130 and the upper electrode 140. A selection device S may be defined by the lower semiconductor layer pattern 105 and the upper semiconductor layer pattern 107. Accordingly, a memory cell 150*a* including the selection device S and the variable resistance device R may be formed at an intersection region of the first and second conductive lines 110 and 180.

Figure 22:
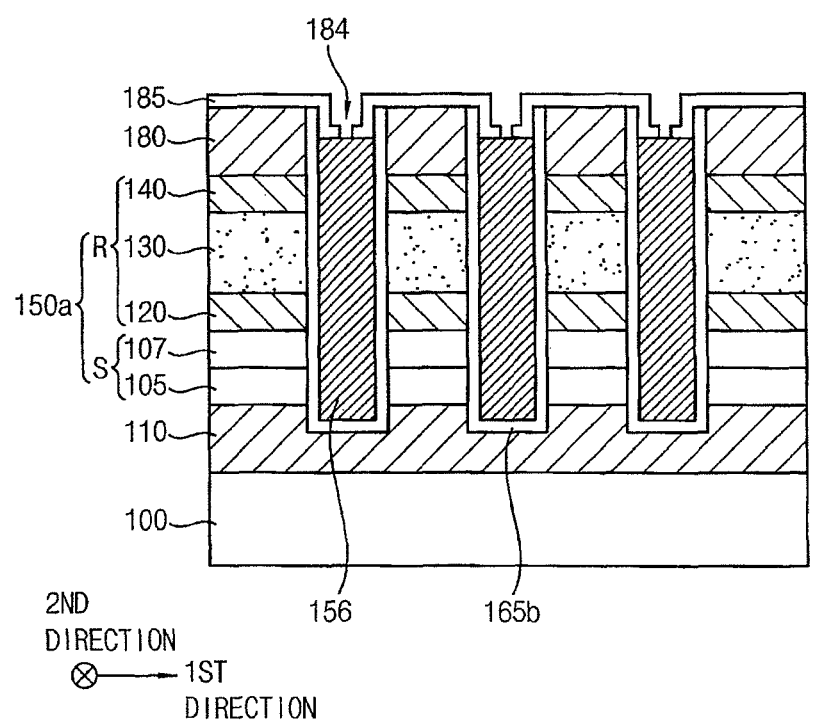

Referring to FIG. 22, processes substantially the same as or similar to those illustrated with reference to FIGS. 10 to 13 may be performed.

Accordingly, a second spacer 165*b* may be formed on a sidewall and a bottom of the second trench 147, and a second sacrificial layer pattern 156 partially filling the second trench 147 may be formed on the second spacer 165*b*. A first capping layer pattern 185 may be formed on the second conductive line 180, the second spacer 165*b* and a portion of the second sacrificial layer pattern 156. A top surface of the second sacrificial layer pattern 156 may be partially exposed by a second recess 184.

Figure 23A:
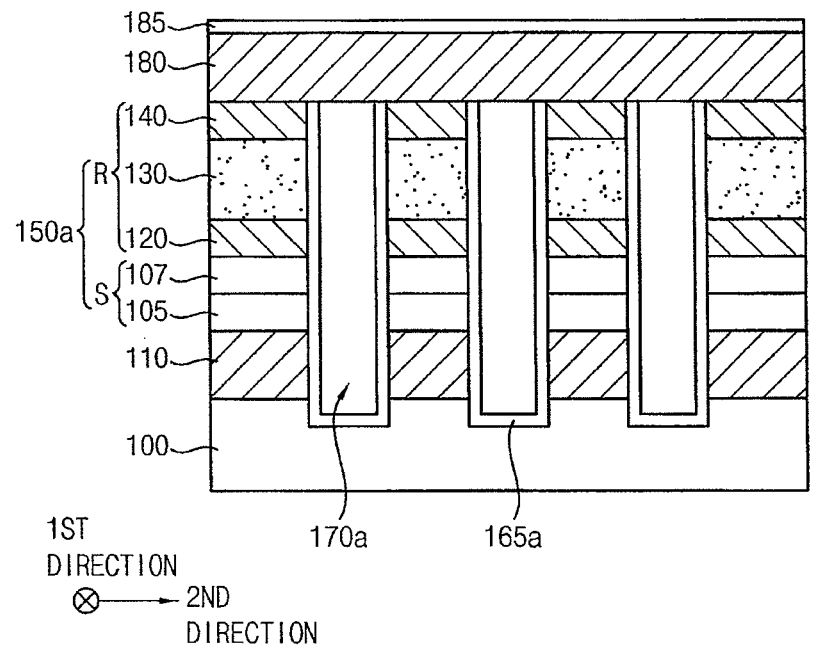
Figure 23B:
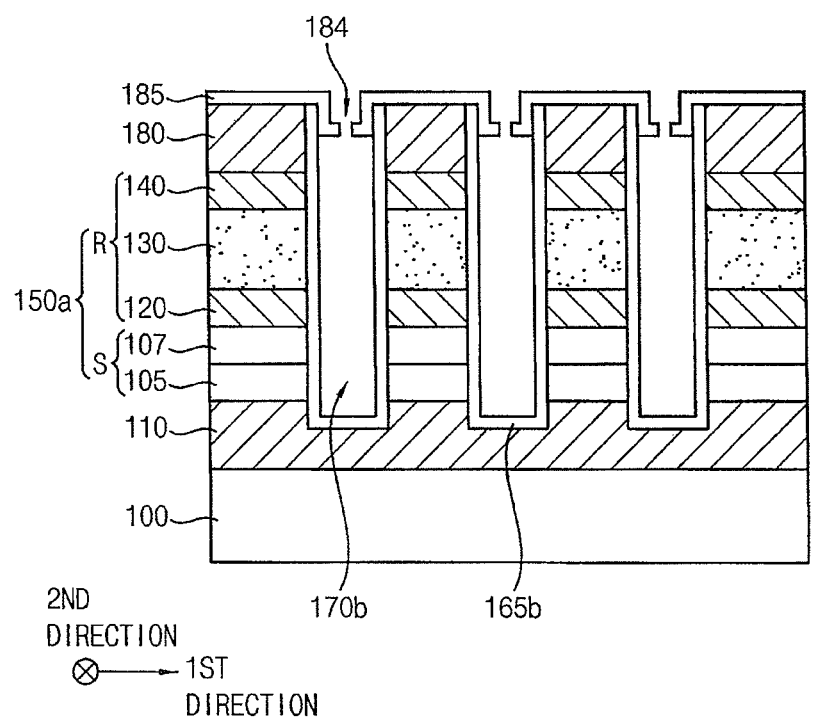

Referring to FIGS. 23A and 23B, a process substantially the same as or similar to that illustrated with reference to FIGS. 14A and 14B may be performed. Accordingly, the sacrificial layer patterns 152 and 156 exposed by the second recess 184 may be removed by an ashing process to form a first air gap 170*a* and a second air gap 170*b* extending in the first direction and the second direction, respectively.

Figure 24:
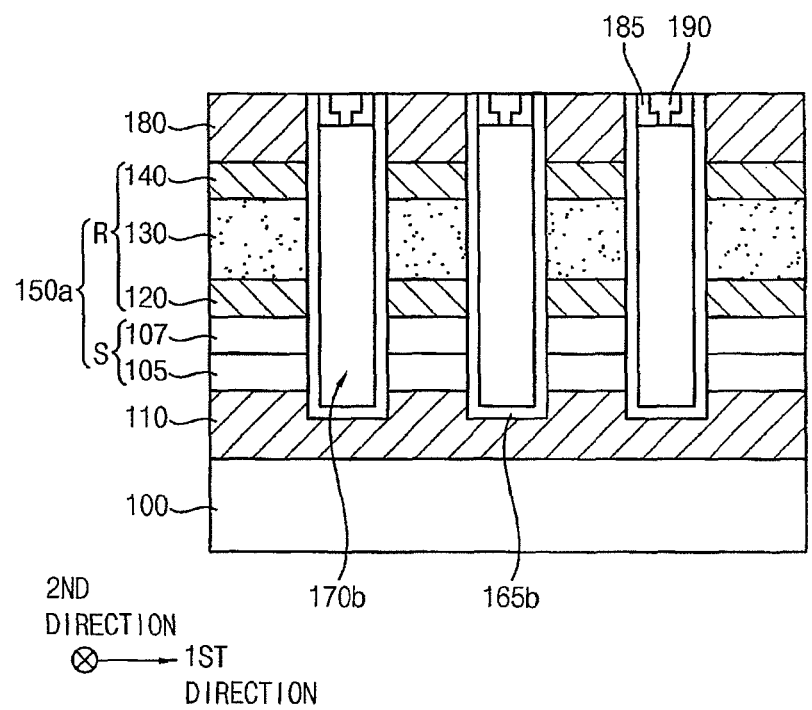

Referring to FIG. 24, processes substantially the same as, or similar to, those illustrated with reference to FIGS. 15 and 16 may be performed to form a second capping layer pattern 190 filling the second recess 184 and capping an upper portion of the second air gap 170*b*.

Figure 25A:
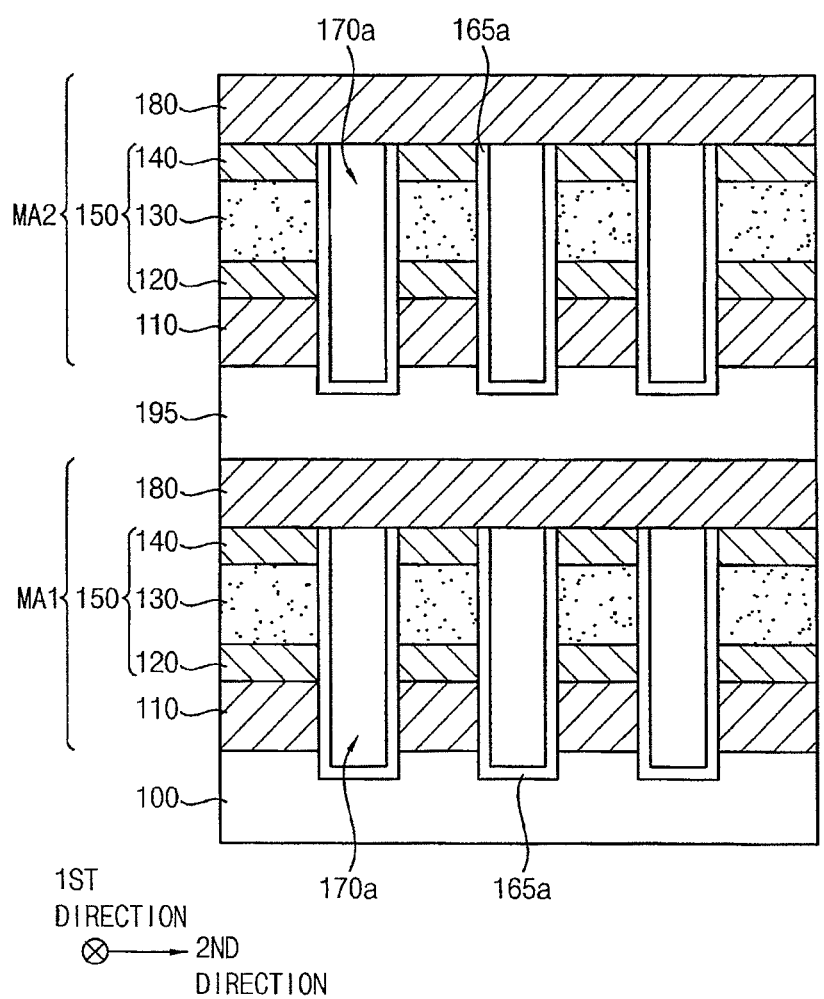
FIGS. 25A to 26B are cross-sectional views illustrating variable resistance memory devices in accordance with some example embodiments.
Figure 25B:
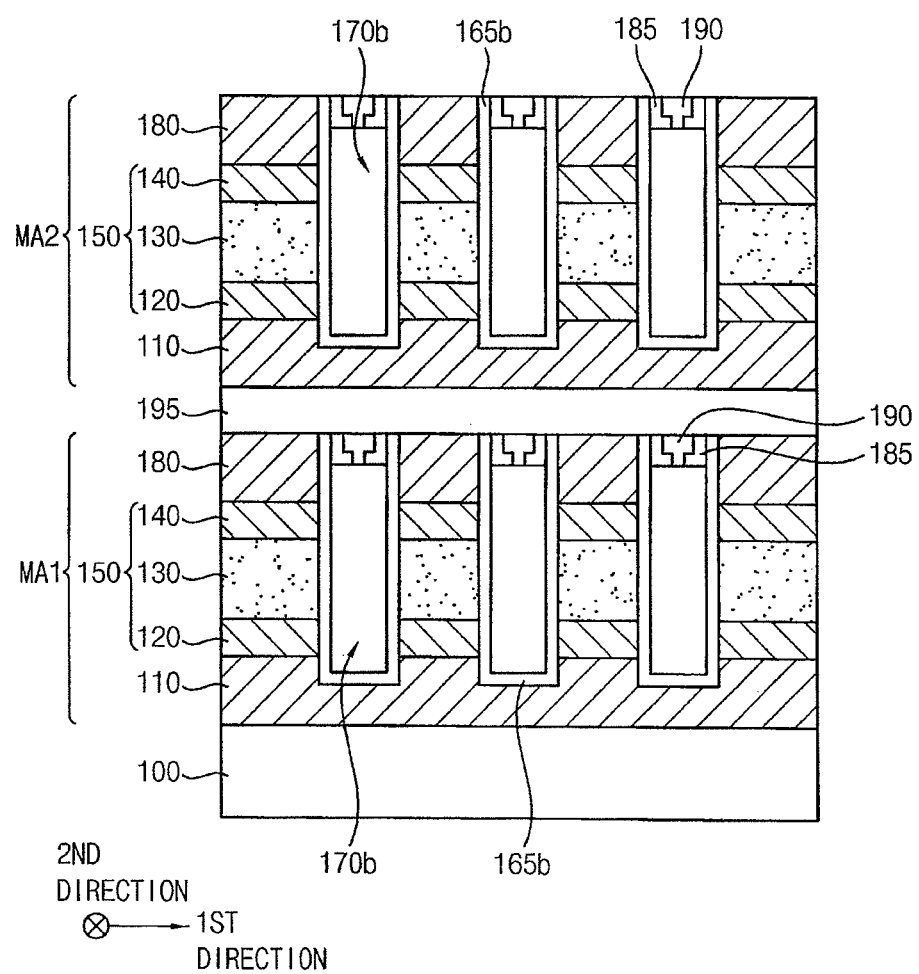
Figure 26A:
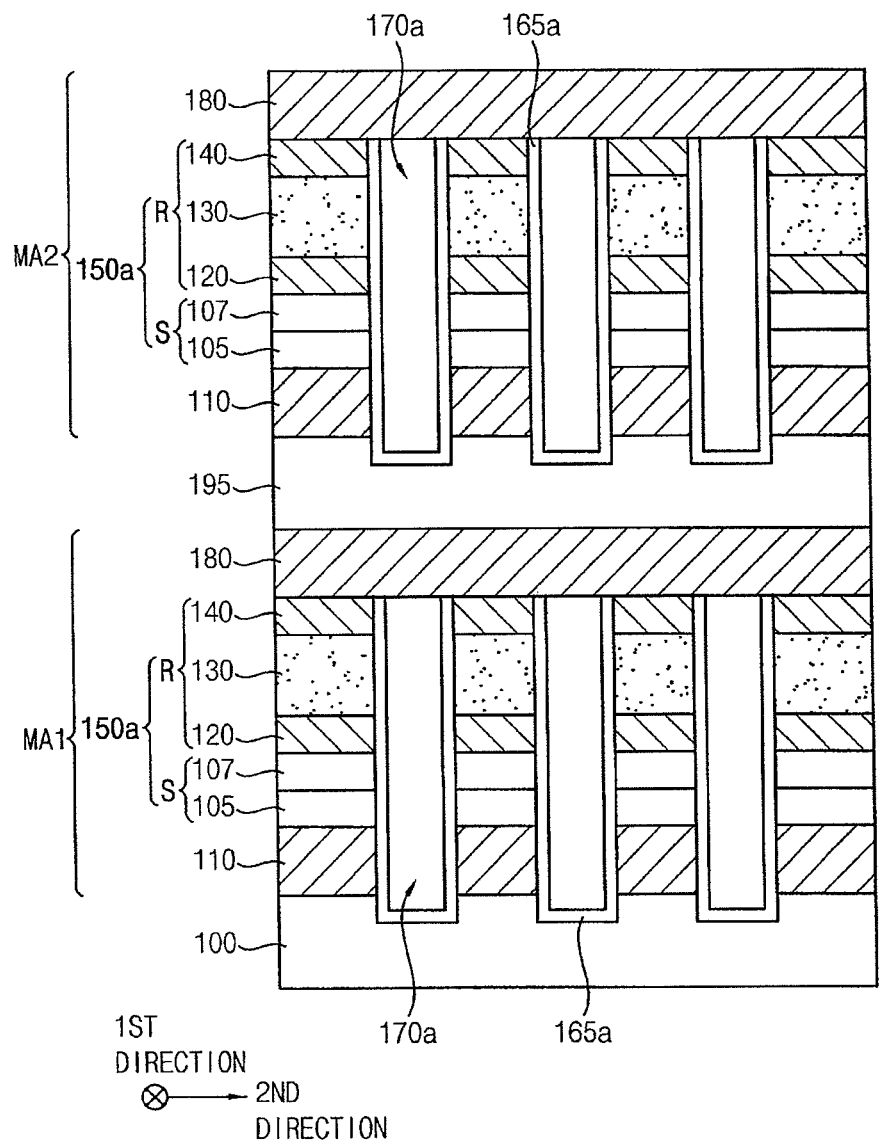
Figure 26B:
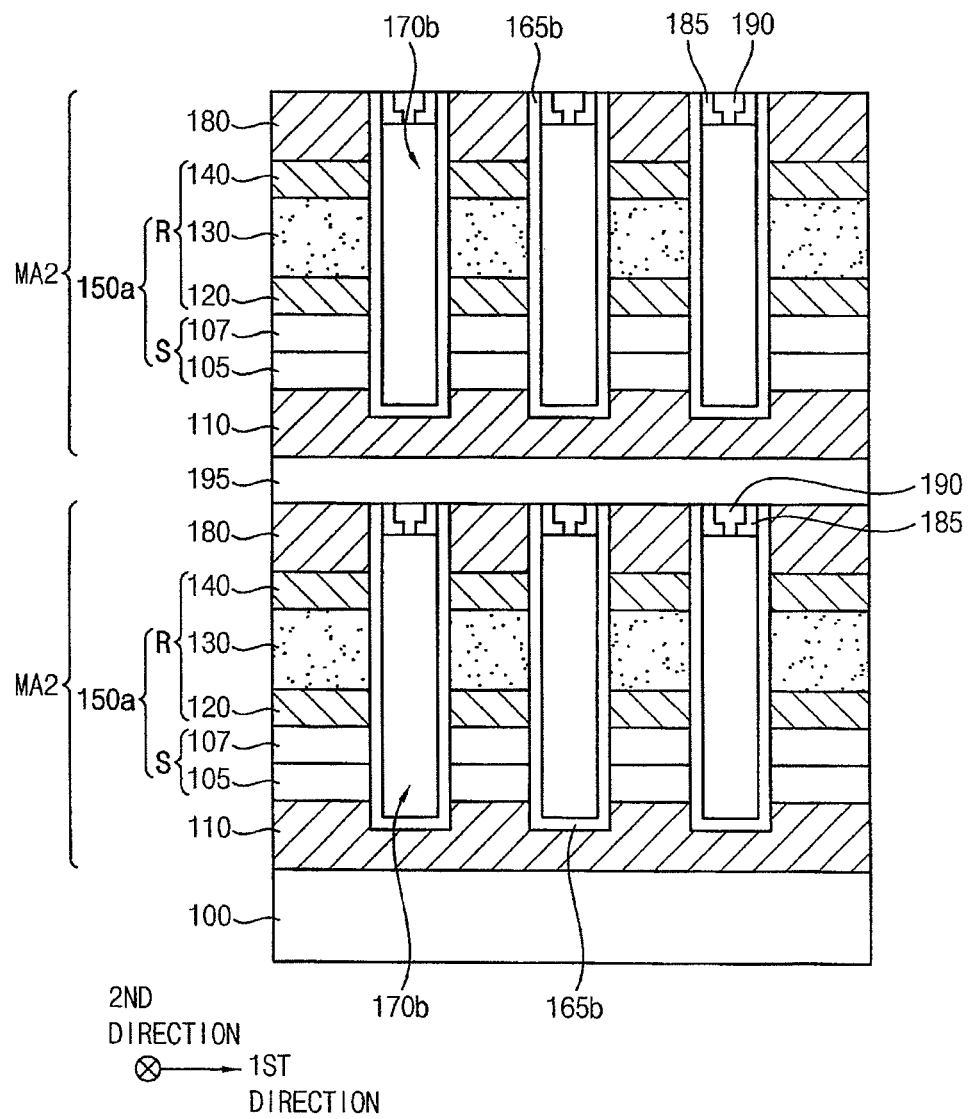

FIGS. 25A to 26B are cross-sectional views illustrating variable resistance memory devices in accordance with some example embodiments. Specifically, FIGS. 25A and 26A are cross-sectional views taken along in the second direction. FIGS. 25B and 26B are cross-sectional views taken along in the first direction. For example, FIGS. 25A to 26B illustrate cross-point memory cell array stacks.

Detailed descriptions of elements and/or constructions substantially the same as, or similar to, those illustrated with reference to FIGS. 1 to 3B, or FIGS. 17A and 17B will not be repeated here. Like reference numerals are used to designate like elements.

Referring to FIGS. 25A and 25B, the variable resistance memory device may have a double-stacked structure including a first memory cell array MA1 and a second memory cell array MA2.

In example embodiments, the first memory cell array MA1 and the second memory cell array MA2 may have structures and/or constructions substantially the same as, or similar to, those illustrated with reference to FIGS. 1 to 3B. For example, each of the first and second memory cell arrays MA1 and MA2 may have a "1R" structure in which one variable resistance device is located at an intersection region of a first conductive line 110 and a second conductive line 180.

An insulating interlayer 195 may be interposed between the first memory cell array MA1 and the second memory cell array MA2. A first spacer 165a and a first air gap 170a of the second memory cell array MA2 may extend through an upper portion of the insulating interlayer 195.

In an example embodiment, as illustrated in FIG. 15, the second memory cell array MA2 may be formed on a second capping layer 188 covering the first memory cell array MA1. In such an embodiment, the insulating interlayer 195 may be omitted, and the second capping layer 188 may operate substantially as the insulating interlayer.

Referring to FIGS. 26A and 26B, a first memory cell array MA1 and a second memory cell array MA2 may have structures and/or constructions substantially the same as, or similar to, those illustrated with reference to FIGS. 17A and 17B. For example, each of the first and second memory cell arrays MA1 and MA2 may have a "1R+1S" structure in which one selection device and one variable resistance device R are located at an intersection region of a first conductive line 110 and a second conductive line 180.

FIGS. 25A to 26B illustrate variable resistance memory devices of a double-stacked structure. However, inventive concepts are not limited thereto, and, for example, at least three memory cell arrays may be stacked to define the variable resistance memory device.

The variable resistance memory devices of FIGS. 25A and 25B, or FIGS. 26A and 26B may be manufactured by repeating processes substantially the same as, or similar to, those illustrated with reference to FIGS. 4 to 16 or FIGS. 18 to 24. Thus, detailed descriptions of methods of manufacturing the variable resistance memory devices will not be repeated here.

Figure 27A:
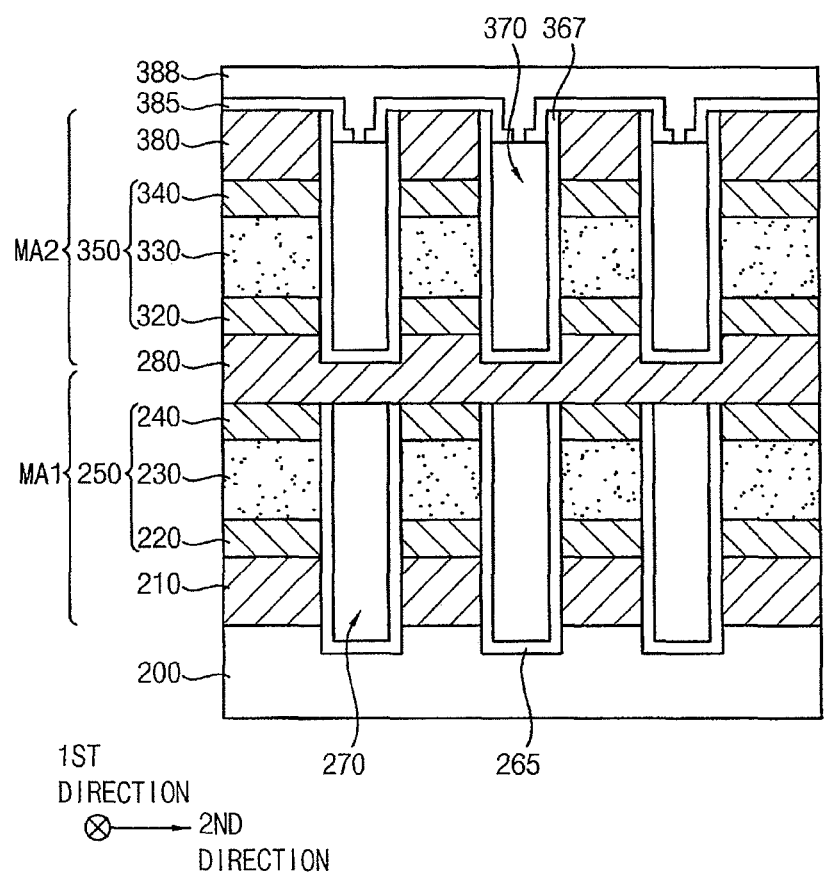
FIGS. 27A and 27B are cross-sectional views illustrating a variable resistance memory device in accordance with some example embodiments.
Figure 27B:
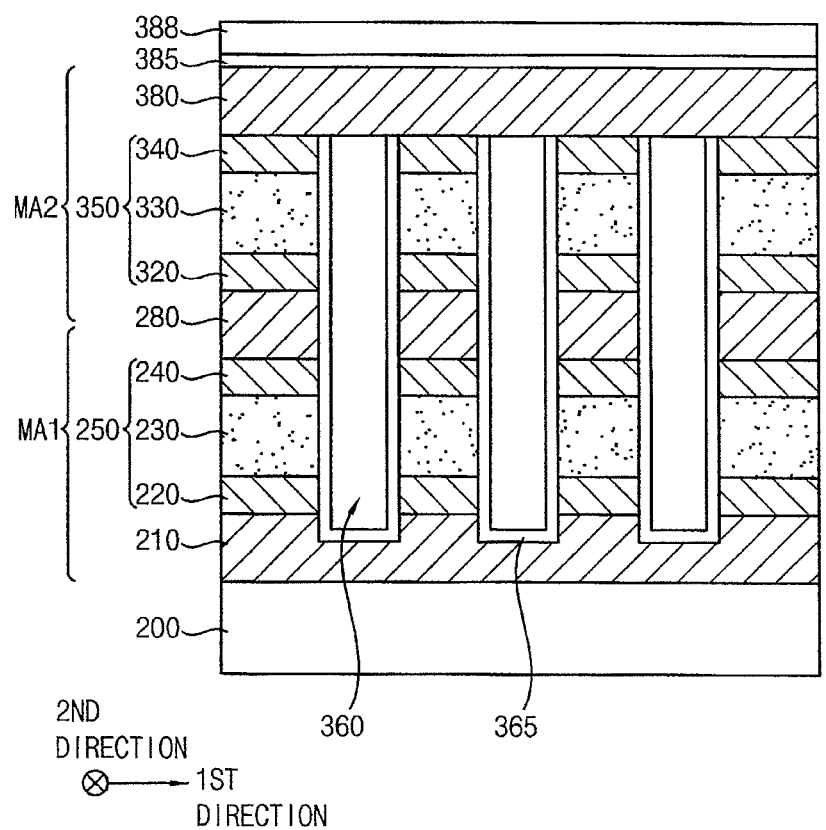

FIGS. 27A and 27B are cross-sectional views illustrating a variable resistance memory device in accordance with some example embodiments. Specifically, FIGS. 27A and 27B are cross-sectional views taken along the second direction and the first direction, respectively.

FIGS. 27A and 27B illustrate a cross-point memory cell array having a double-stacked structure and a "1R" structure in which one variable resistance device is located at an intersection region of conductive lines.

Detailed descriptions of elements and/or constructions substantially the same as, or similar to, those illustrated with reference to FIGS. 1 to 3B will not be repeated here.

Referring to FIGS. 27A and 27B, the variable resistance memory device may include a first conductive line 210, a second conductive line 280 and a third conductive line 380 sequentially stacked from a base insulation layer 200 and spaced apart from each other.

In example embodiments, the first conductive line 210 may extend in the first direction, and a plurality of the first conductive lines 210 may be arranged in the second direction. The second conductive line 280 may be disposed over the first conductive line 210. The second conductive line 280 may extend in the second direction, and a plurality of the second conductive lines 280 may be arranged in the first direction. The third conductive line 380 may be disposed over the second conductive line 280. The third conductive line 380 may extend in the first direction, and a plurality of the third conductive lines 380 may be arranged in the second direction. Accordingly, the first and third conductive lines 210 and 380 may extend in substantially the same direction, and the second conductive line 280 may cross the first and third conductive lines 210 and 380 therebetween.

A first memory cell 250 may be located at an intersection region of the first and second conductive lines 210 and 280. The first memory cell 250 may include a first variable resistance layer 230. In example embodiments, a first lower electrode 220 may be interposed between the first variable resistance layer 230 and the first conductive line 210, and a first upper electrode 240 may be interposed between the first variable resistance layer 230 and the second conductive line 280. A first memory cell array MA1 may be defined by the first conductive line 210, the first memory cell 250 and the second conductive line 280.

A second memory cell 350 may be located at an intersection region of the first and third conductive lines 280 and 380. The second memory cell 350 may include a second variable resistance layer 330. In example embodiments, a second lower electrode 320 may be interposed between the second variable resistance layer 330 and the second conductive line 280, and a second upper electrode 340 may be interposed between the second variable resistance layer 330 and the third conductive line 380. A second memory cell array MA2 may be defined by the second conductive line 280, the second memory cell 350 and the third conductive line 380.

For example, the first conductive line 210 and the third conductive line 380 may serve as word lines of the first memory cell array MA1 and the second memory cell array MA2, respectively. The second conductive line 280 may serve as a common bit line of the first and second memory cell arrays MA1 and MA2.

The first memory cell array MA1 may include a first air gap 270 extending in the first direction. The first air gap 270 may extend through the first memory cells 250 and the first conductive lines 210 neighboring in the second direction. In example embodiments, the first air gap 270 may extend through an upper portion of a base insulation layer 200. A plurality of the first air gaps 270 may be formed in the second direction.

A first spacer 265 may be formed on a sidewall and a bottom of the first air gap 270.

The second memory cell array MA2 may include a second air gap 370 extending in the first direction. The second air gap 370 may extend through the second memory cells 350 neighboring in the second direction. In example embodiments, the second air gap 370 may extend through an upper portion of the second conductive line 280. A plurality of the second air gaps 370 may be formed in the second direction.

A second spacer 367 may be formed on a sidewall and a bottom of the second air gap 370.

In example embodiments, a common air gap 360 extending in the second direction may be formed through the second memory cells 350, the second conductive lines 280 and the first memory cells 250 neighboring in the first direction. The common air gap 360 may extend through an upper portion of the first conductive line 210. A common spacer 365 may be formed on a sidewall and a bottom of the common air gap 360.

In example embodiments, the first air gap 270 and the common air gap 360 may cross each other and may be in fluid communication with each other. The second air gap 370 and the common air gap 360 may also cross each other and may be in fluid communication with each other. Additionally, the first air gap 270 and the second air gap 370 may be in fluid communication with each other via the common air gap 360.

Accordingly, a sidewall of the first memory cell 250 may be surrounded by the first spacer 265 and the common spacer 365. The first memory cells 250 may be isolated from each other by the first air gap 270 and the common air gap 360. A sidewall of the second memory cell 350 may be surrounded by the second spacer 367 and the common spacer 365. The second memory cells 350 may be isolated from each other by the second air gap 370 and the common air gap 360. As a result, parasitic capacitance and associated interference generated between the neighboring memory cells may be avoided.

According to example embodiments, the air gap extending in the second direction may be provided commonly through the first memory cell array MA1 and the second memory cell array MA2. In this manner, a structure and a manufacturing method of a variable resistance memory device in accordance with principles of inventive concepts may be simplified.

A first capping layer pattern 385 may be disposed on the third conductive line 380 to partially cover the second air gap 385. A second capping layer 388 may be formed on the first capping layer pattern 385 to close or cap the second air gap 370. An upper portion of the common air gap 360 may be closed or capped by the third conductive line 380, the first capping layer pattern 385 and the second capping layer 388.

FIGS. 28 to 38B are cross-sectional views illustrating a method of manufacturing a variable resistance memory device in accordance with principles of inventive concepts. Specifically, FIGS. 28, 29, 30A, 33A, 34, 35, 36A, 37A and 38A are cross-sectional views taken along the second direction. FIGS. 30B, 31, 32, 33B, 36B, 37B and 38B are cross-sectional views taken along the first direction.

Detailed descriptions of processes and/or materials substantially the same as, or similar to, those illustrated with reference to FIGS. 4 to 16 will not be repeated here.

Figure 28:
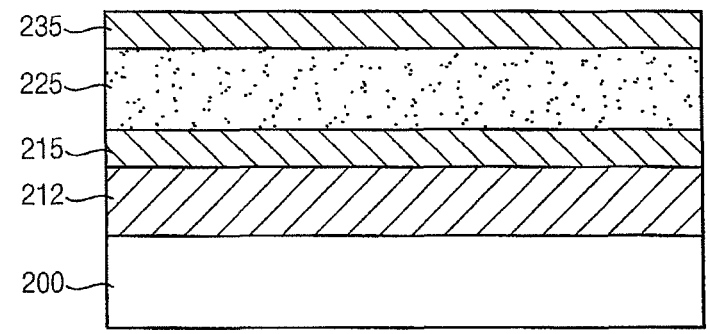
FIGS. 28 to 38B are cross-sectional views illustrating a method of manufacturing a variable resistance memory device in accordance with some example embodiments.

Referring to FIG. 28, a process substantially the same as, or similar to, that illustrated with reference to FIG. 4 may be performed. Accordingly, a first conductive layer 212, a first lower electrode layer 215, a first variable resistance material layer 225 and a first upper electrode layer 235 may be sequentially formed on a base insulation layer 200.

Figure 29:
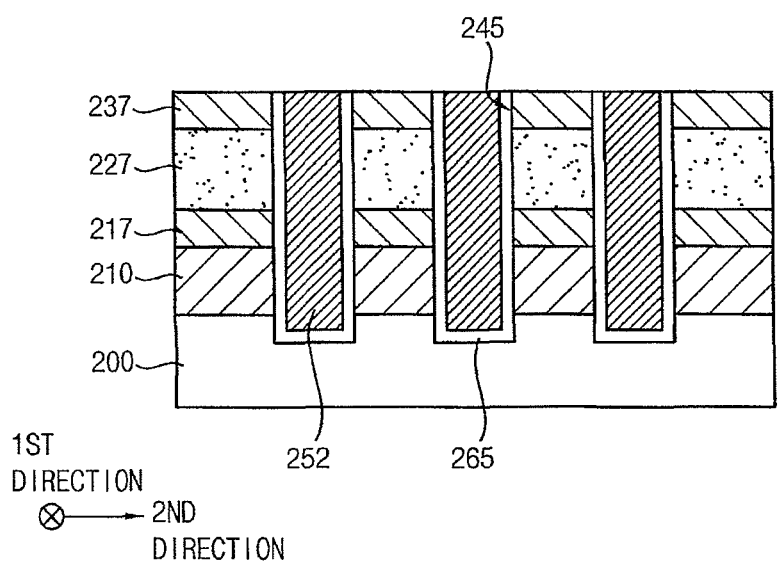

Referring to FIG. 29, processes substantially the same as, or similar to, those illustrated with reference to FIGS. 5A to 7 may be performed. Accordingly, a first trench 245 extending in the first direction may be formed through the first upper electrode layer 235, the first variable resistance material layer 225, the first lower electrode layer 215 and the first conductive layer 212. A first spacer 265 may be formed on a sidewall and a bottom of the first trench 245. A first sacrificial layer pattern 252 filling the first trench 245 may be formed on the first spacer 265. The first trench 245 may extend through an upper portion of the base insulation layer 200.

By the formation of the first trench 245, the first conductive layer 212, the first lower electrode layer 215, the first variable resistance material layer 225 and the first upper electrode layer 235 may be transformed into a first conductive line 210, a first lower electrode layer pattern 217, a first variable resistance material layer pattern 227 and a first upper electrode layer pattern 237, respectively.

Figure 30A:
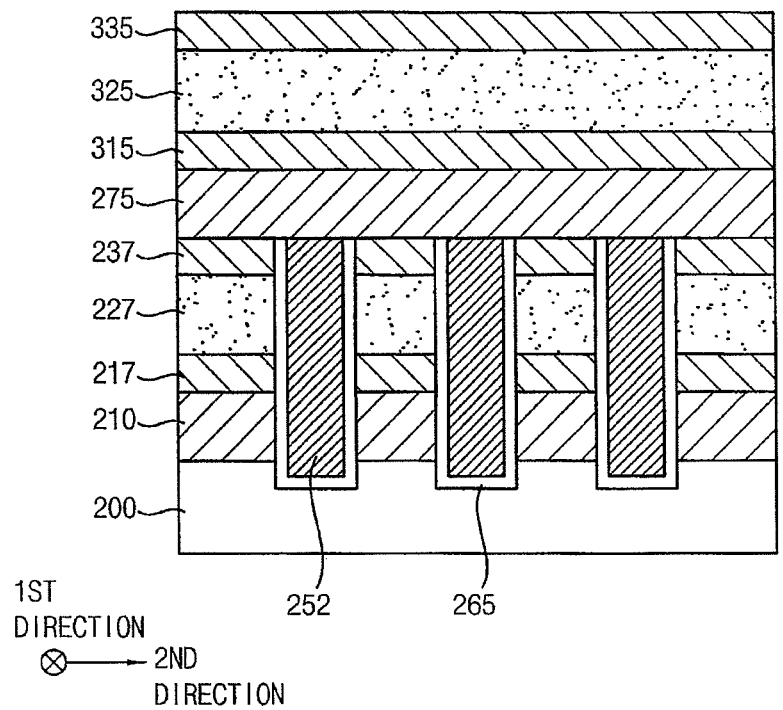
Figure 30B:
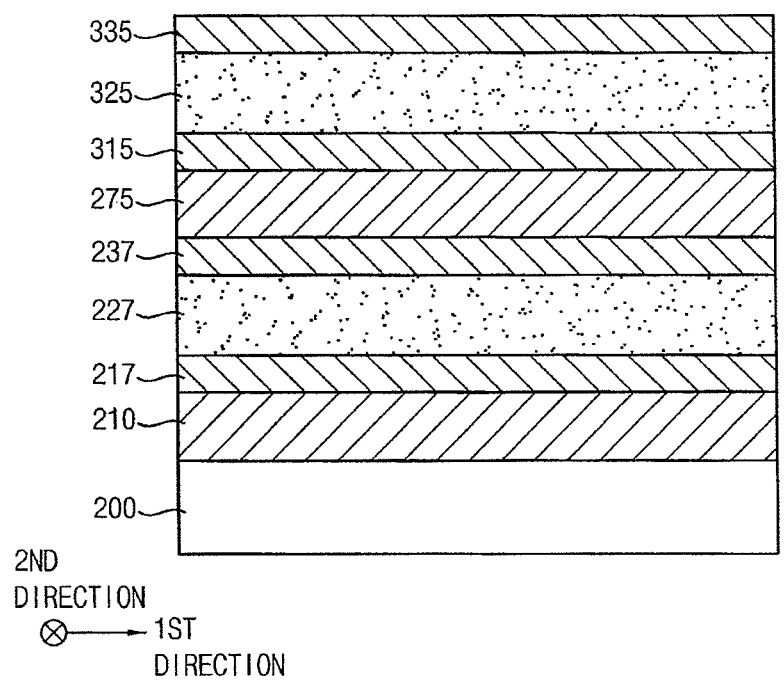

Referring to FIGS. 30A and 30B, a process substantially the same as, or similar to, that illustrated with reference to FIG. 28 may be performed. Accordingly, a second conductive layer 275, a second lower electrode layer 315, a second variable resistance material layer 325 and a second upper electrode layer 335 may be sequentially formed on the first upper electrode layer pattern 237, the first spacer 265 and the first sacrificial layer pattern 252.

Figure 31:
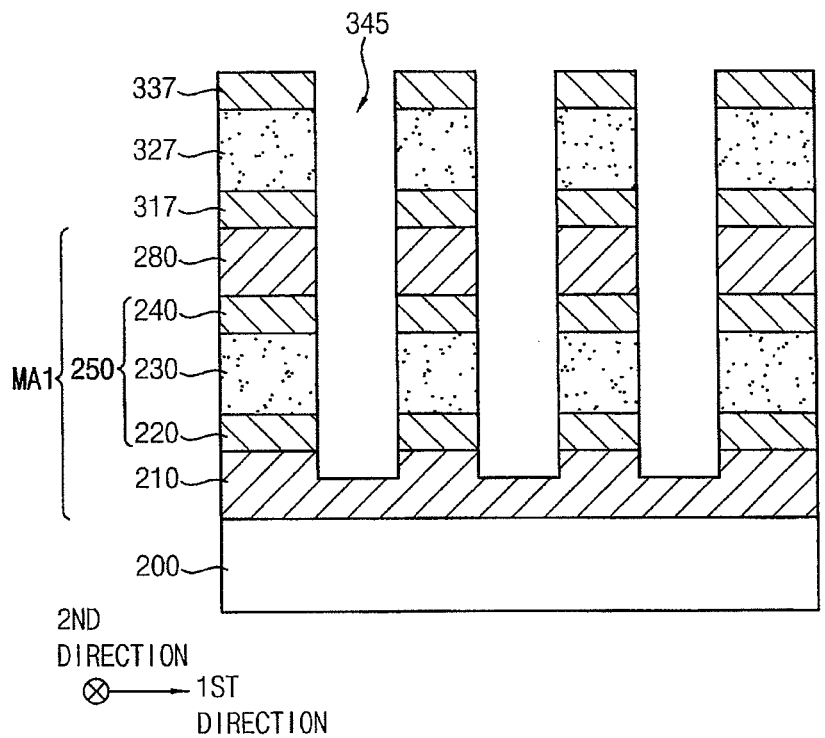

Referring to FIG. 31, a common trench 345 may be formed through the second upper electrode layer 335, the second variable resistance material layer 325, the second lower electrode layer 315, the second conductive layer 275, the first upper electrode layer pattern 237, the first variable resistance material layer pattern 227 and the first lower electrode layer pattern 217. In example embodiments, the common trench 345 may extend in the second direction, and a plurality of the common trenches 345 may be formed in the first direction.

For example, a mask pattern (not illustrated) extending in the second direction may be formed on the second upper electrode layer 335. The second upper electrode layer 335, the second variable resistance material layer 325, the second lower electrode layer 315, the second conductive layer 275, the first upper electrode layer pattern 237, the first variable resistance material layer pattern 227 and the first lower electrode layer pattern 217 may be partially removed by a dry etching process using the mask pattern as an etching mask. Additionally, portions of the first sacrificial layer pattern 252 and the first spacer 265 exposed during the etching process may be also removed. The mask pattern may be removed by an ashing process and/or a strip process after the formation of the common trench 345.

In example embodiments, the common trench 345 may extend through an upper portion of the first conductive line 210.

By the formation of the common trench 345, the first lower electrode layer pattern 217, the first variable resistance material layer pattern 227, the first upper electrode layer pattern 237 and the second conductive layer 275 may be transformed into a first lower electrode 220, a first variable resistance layer 230, a first upper electrode 240 and a second conductive line 280, respectively. Accordingly, a first memory cell 250 may be defined by the first lower electrode 220, the first variable resistance layer 230 and the first upper electrode 240. A first memory cell array MA1 may be defined by the first conductive lines 210, the first memory cells 250 and the second conductive lines 280.

By the formation of the common trench 345, the second lower electrode layer 315, the second variable resistance material layer 325 and the second upper electrode layer 335 may be transformed into a second lower electrode layer pattern 317, a second variable resistance material layer pattern 327 and the second upper electrode layer pattern 337, respectively.

Figure 32:
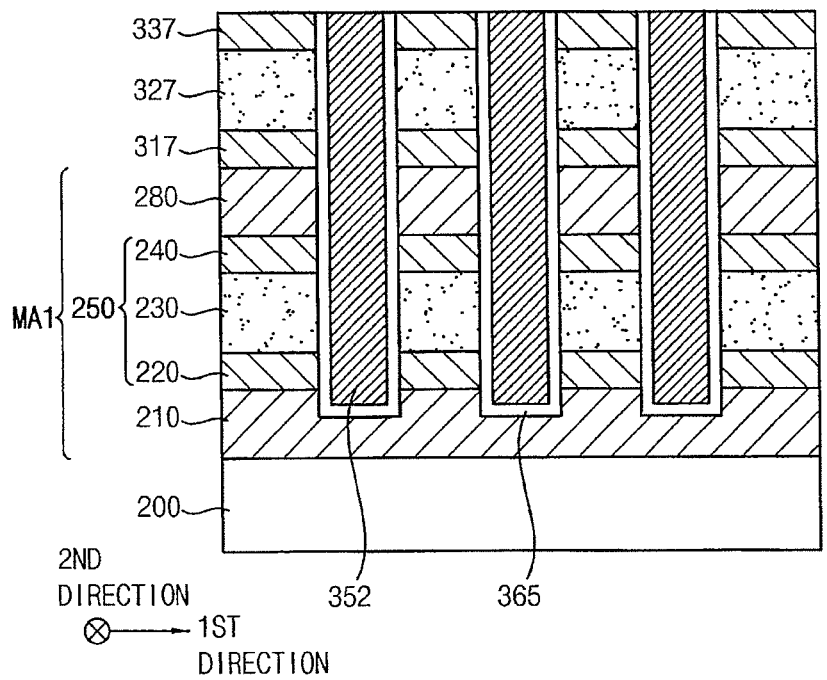

Referring to FIG. 32, a common spacer 365 may be formed on a sidewall and a bottom of the common trench 345, and then a common sacrificial layer pattern 352 filling the common trench 345 may be formed on the common spacer 365.

In example embodiments, processes substantially the same as, or similar to, those illustrated with reference to FIGS. 10 and 11 may be performed. Accordingly, a common spacer layer may be formed along top surfaces of the second upper electrode layer patterns 337, and sidewalls and bottoms of the common trenches 345. A common sacrificial layer sufficiently filling the common trench 345 may be formed on the common spacer layer.

The common sacrificial layer and the common spacer layer may be planarized by, for example, a CMP process until the top surface of the second upper electrode layer pattern 337 is exposed to form the common sacrificial layer pattern 352 and the common spacer 365.

In example embodiments, the common sacrificial layer pattern 352 and the first sacrificial layer pattern 252 may cross each other and may be connected to each other.

Figure 33A:
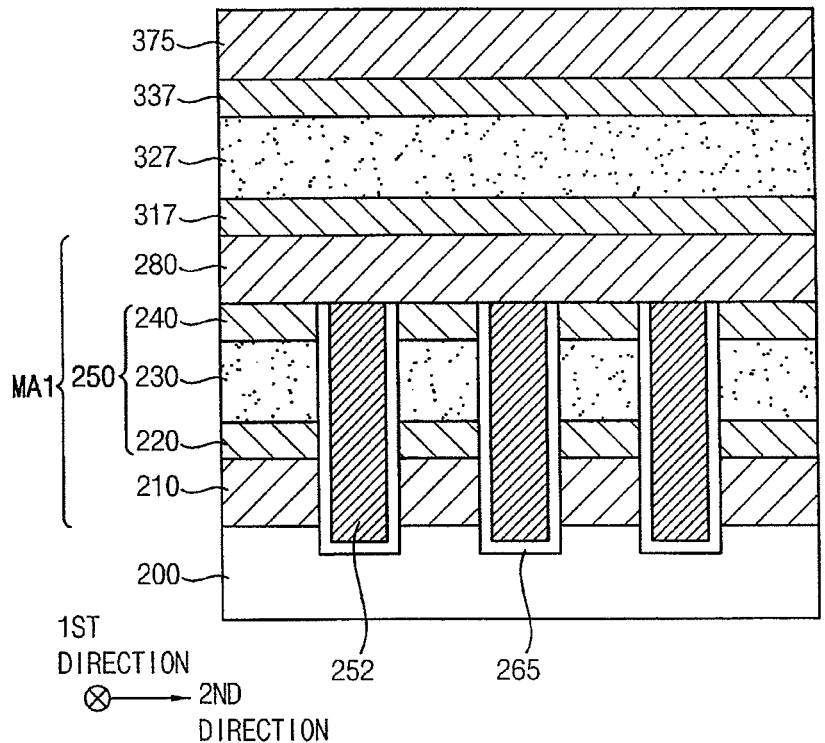
Figure 33B:
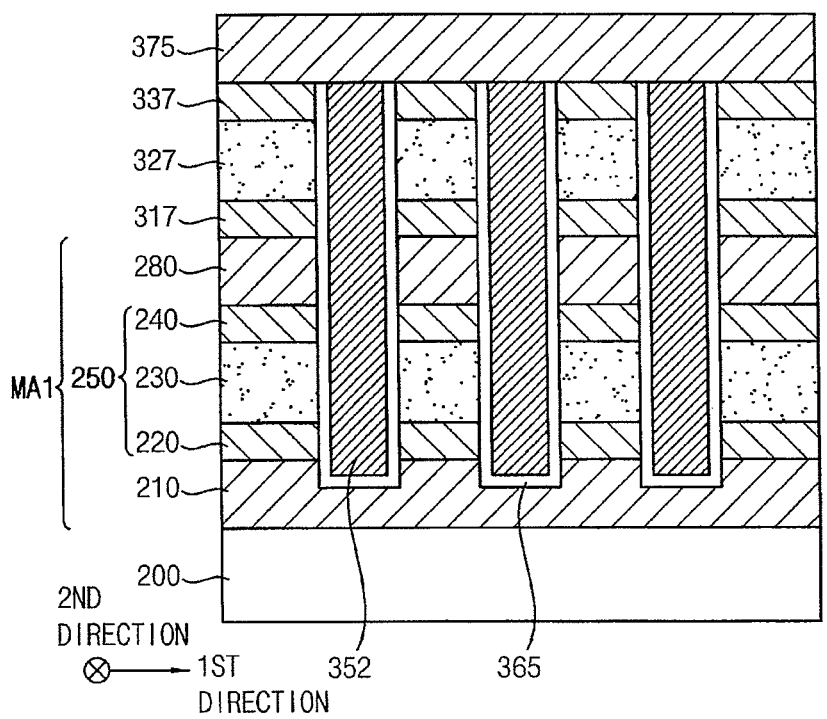

Referring to FIGS. 33A and 33B, a third conductive layer 375 may be formed on the second upper electrode layer pattern 337, the common spacer 365 and the common sacrificial layer pattern 352. The third conductive layer 375 may be formed using a metal, for example, W, Cu, Al, Ti or Ta by a sputtering process, an ALD process or a PVD process, for example.

Figure 34:
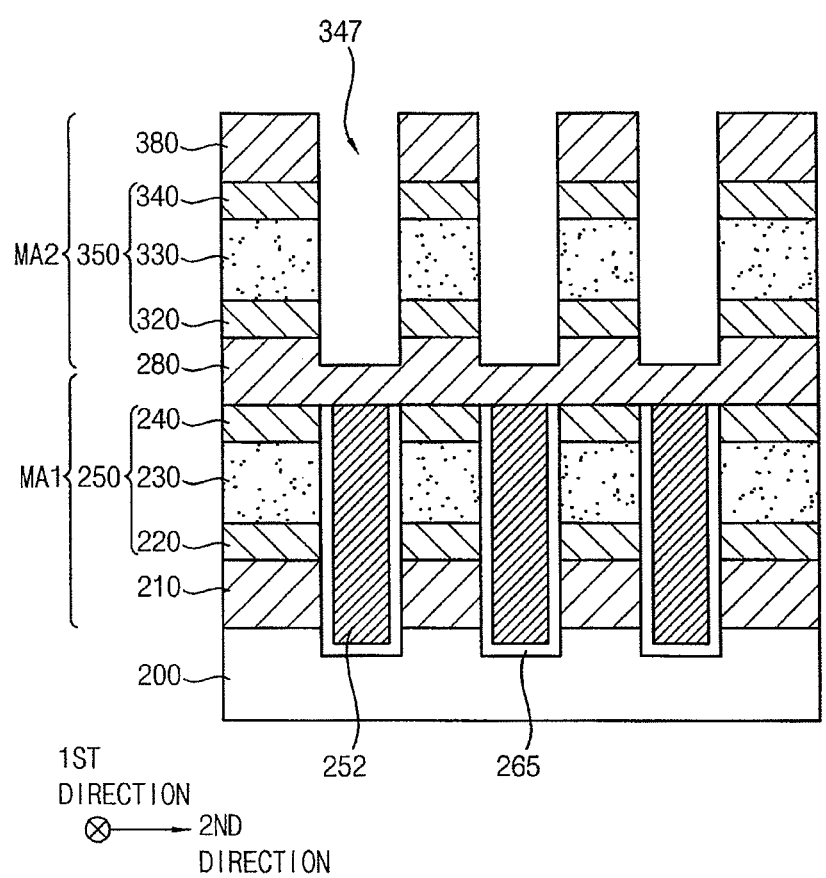

Referring to FIG. 34, a second trench 347 may be formed through the third conductive layer 375, the second upper electrode layer pattern 337, the second variable resistance material layer pattern 327 and the second lower electrode layer pattern 317. In example embodiments, the second trench 347 may extend in the first direction, and a plurality of the second trenches 347 may be formed in the second direction.

For example, a mask pattern (not illustrated) extending in the first direction may be formed on the third conductive layer 375. The third conductive layer 375, the second upper electrode layer pattern 337, the second variable resistance material layer pattern 327 and the second lower electrode layer pattern 317 may be partially removed by a dry etching process using the mask pattern as an etching mask. Further, portions of the common sacrificial layer pattern 352 and the common spacer 365 exposed during the etching process may be also removed. The mask pattern may be removed by an ashing process and/or a strip process after the formation of the second trench 347.

In example embodiments, the second trench 347 may extend through an upper portion of the second conductive line 280.

By the formation of the second trench 347, the second lower electrode layer pattern 317, the second variable resistance material layer pattern 327, the second upper electrode layer pattern 337 and the third conductive layer 375 may be transformed into a second lower electrode 320, a second variable resistance layer 330, a second upper electrode 340 and a third conductive line 380. Accordingly, a second memory cell 350 may be defined by the second lower electrode 320, the second variable resistance layer 330 and the second upper electrode 340. A second memory cell array MA2 may be defined by the second conductive lines 280, the second memory cells 350 and the third conductive lines 380.

Figure 35:
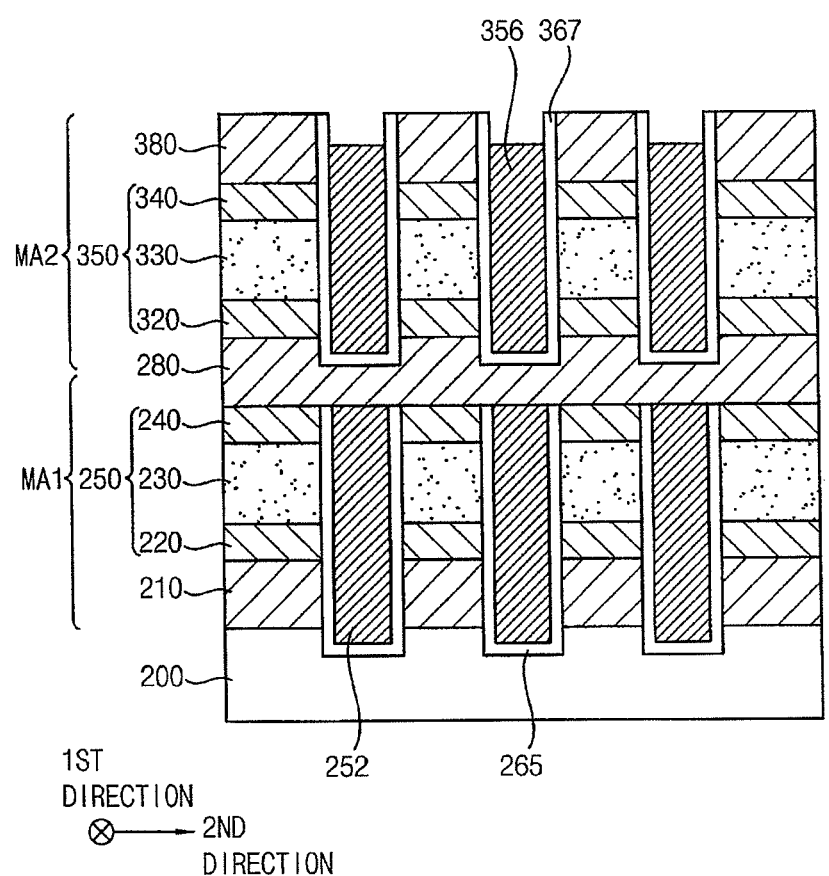
Figure 36A:
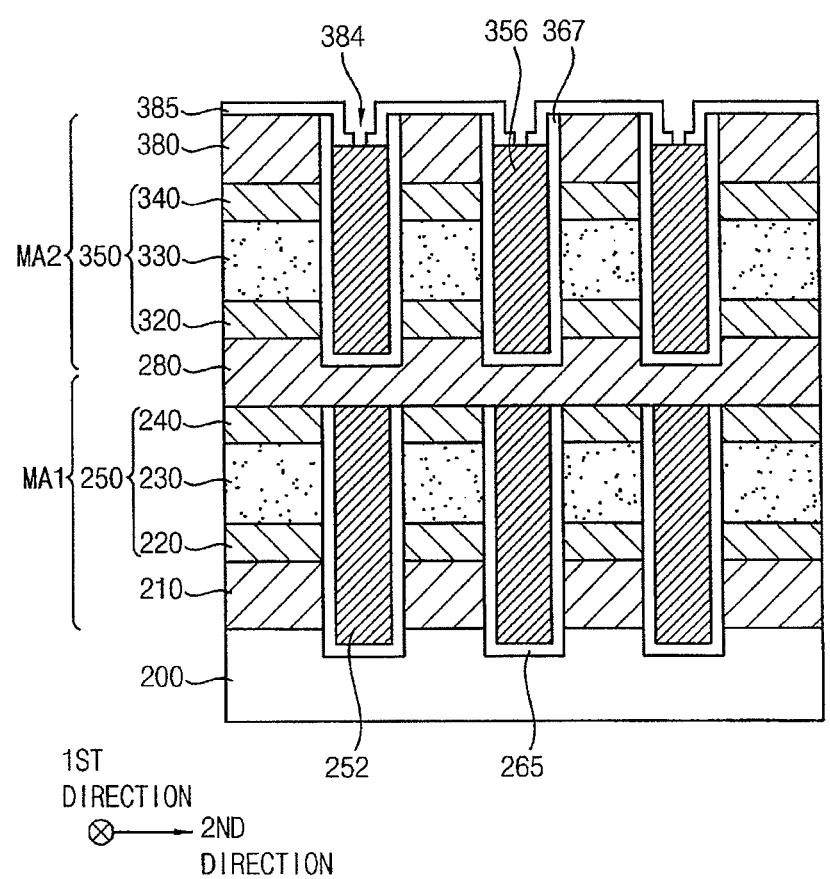
Figure 36B:
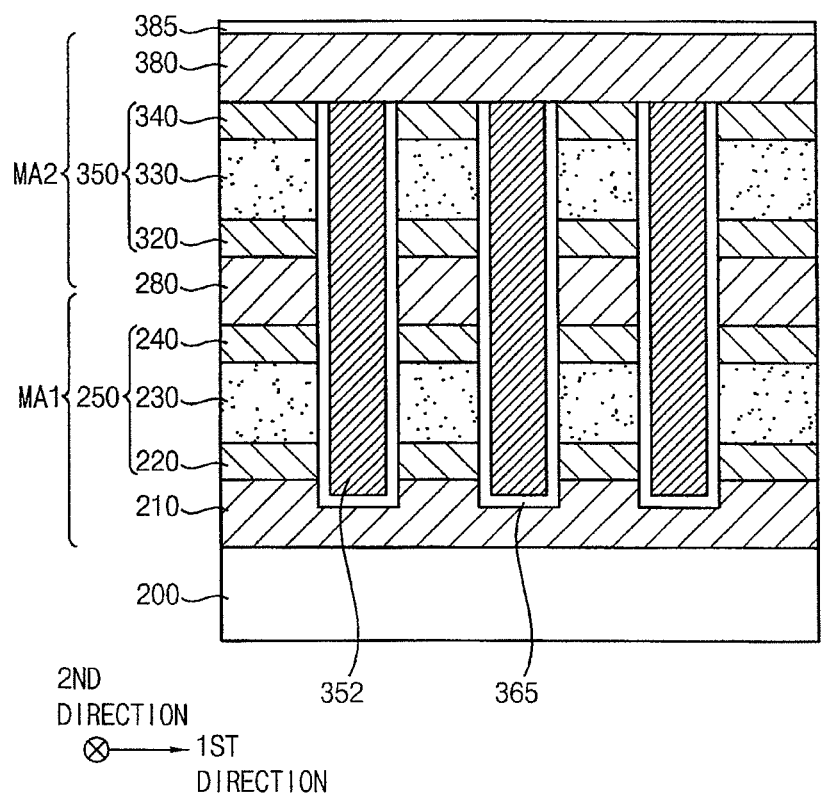

Referring to FIG. 35, processes substantially the same as, or similar to, those illustrated with reference to FIGS. 10 to 12 may be performed to form a second spacer 367 and a second sacrificial layer pattern 356 in the second trench 347.

For example, the second spacer 367 may be formed on a sidewall and a bottom of the second trench 347. A second sacrificial layer filling the second trench 347 may be formed on the second spacer 367 using an SOH material. An upper portion of the second sacrificial layer may be removed by an etch-back process to form the second sacrificial layer pattern 356 partially filling the second trench 347.

Referring to FIG. 36, a process substantially the same as, or similar to, that illustrated with reference to FIG. 13 may be performed to form a first capping layer pattern 385 by which the second sacrificial layer pattern 356 may be partially exposed.

For example, a first capping layer may be formed conformably on top surfaces of the third conductive lines 380, the second spacers 367 and the second sacrificial layer patterns 356 by an ALD process. Portions of the first capping layer formed on the top surfaces of the second sacrificial layer pattern 356 may be partially removed by an etch-back process to form the first capping layer pattern 385. Additionally, an opening 384 through which the second sacrificial layer pattern 356 is partially exposed may be defined by the first capping layer pattern 385.

In example embodiments, the second sacrificial layer pattern 356 and the common sacrificial layer pattern 352 may cross each other and may be connected to each other. As described above, the common sacrificial layer pattern 352 and the first sacrificial layer pattern 252 may also be connected to and cross each other. In this manner, the second sacrificial layer pattern 356 and the first sacrificial layer pattern 252 may be connected to each other via the common sacrificial layer pattern 352.

Figure 37A:
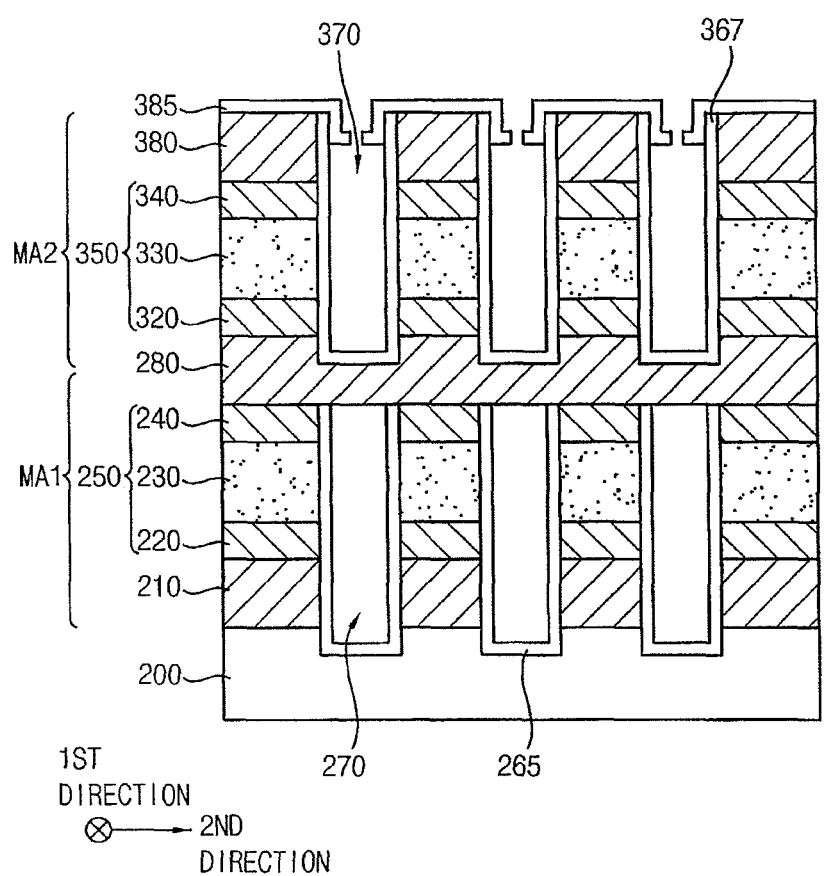
Figure 37B:
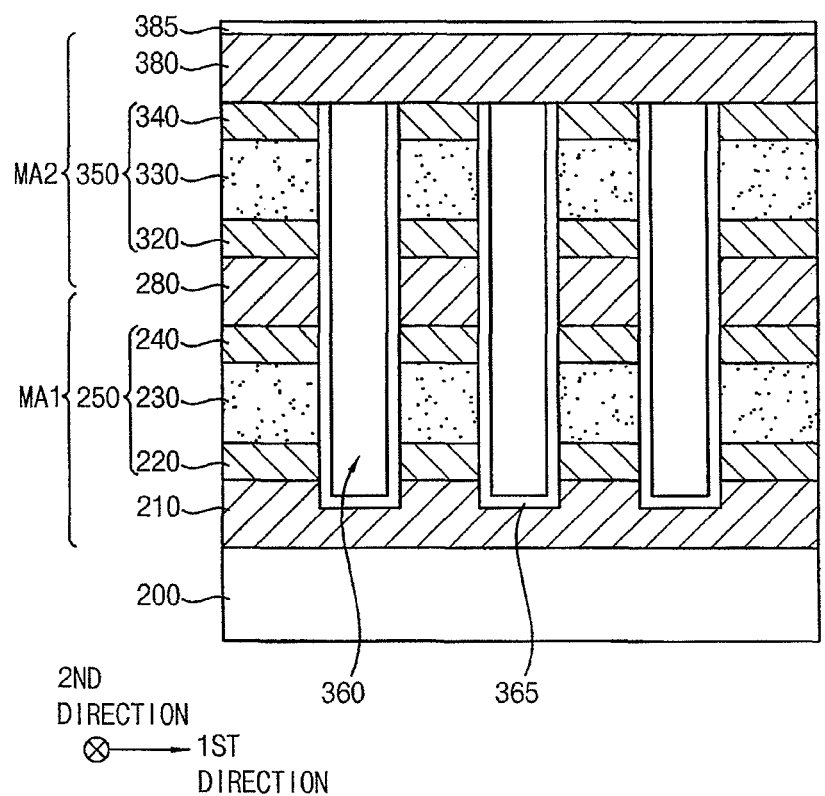

Referring to FIGS. 37A and 37B, processes substantially the same as, or similar to, that illustrated with reference to FIGS. 14A and 14B may be performed to remove the sacrificial layer patterns 252, 352 and 356. Accordingly, a first air gap 270, a common air gap 360 and a second air gap 370 may be formed at spaces from which the first sacrificial layer pattern 252, the common sacrificial layer pattern 352 and the second sacrificial layer pattern 356 are removed, respectively.

As described above, the first sacrificial layer pattern 252, the common sacrificial layer pattern 352 and the second sacrificial layer pattern 356 may be connected to each other. In this manner, while the second sacrificial layer pattern 356 is removed by, for example, an ashing process, the common sacrificial layer pattern 352 and the first sacrificial layer pattern 252 may be also sequentially removed.

Accordingly, the air gaps may be in fluid communication with each other. In example embodiments, the first and second air gaps 270 and 370 may extend in the first direction, and cross the common air gap 360 extending in the second direction to be in fluid communication with each other.

In example embodiments, each first memory cell 250 may be surrounded by the first air gap 270 and the common air gap 360. Each second memory cell 350 may be surrounded by the second air gap 370 and the common air gap 360. Therefore, parasitic capacitance and associated interference generated between the neighboring memory cells may be avoided.

Figure 38A:
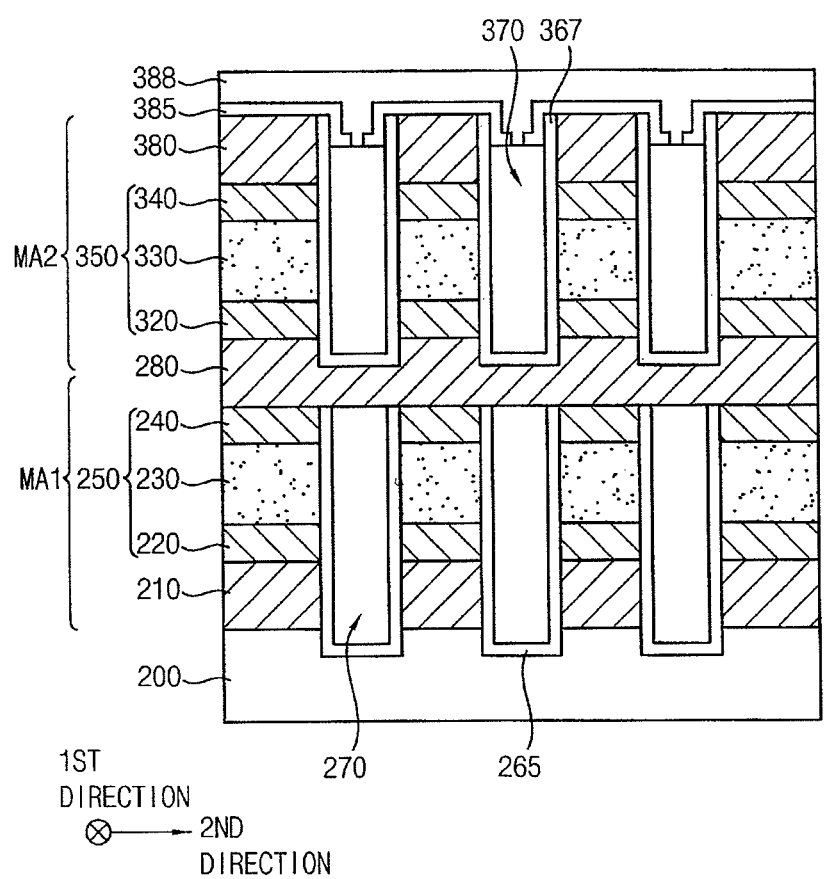
Figure 38B:
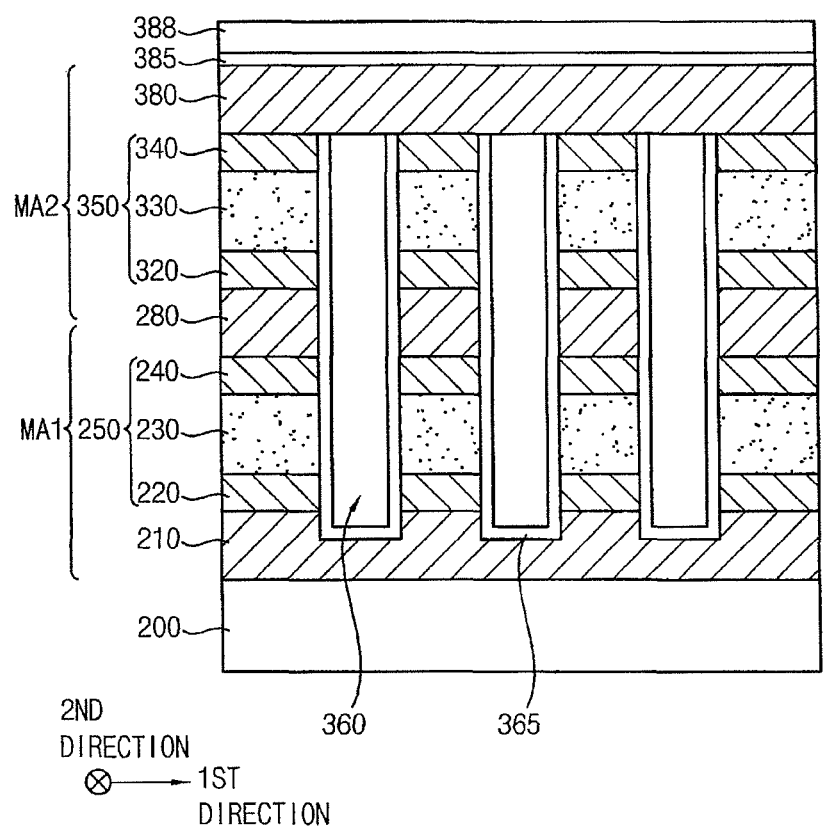

Referring to FIGS. 38A and 38B, a process substantially the same as, or similar to, that illustrated with reference to FIG. 15 may be performed to form a second capping layer 388 on the first capping layer pattern 385 to close or cap the second air gap 370. The common air gap 360 may be also closed or capped by the second capping layer 388.

For example, the second capping layer 388 may be formed using, for example, a CVD oxide having poor gap-fill characteristics. The second capping layer 388 may not extend in the second air gap 370 and may be overhung by the first capping layer pattern 385.

In an example embodiment, as illustrated in FIG. 16, an upper portion of the second capping layer 388 may be planarized to form a second capping layer pattern at each second air gap 370.

According to example embodiments of inventive concepts, the air gaps and the sacrificial layer patterns may be formed utilizing, for example, the SOH material capable of being cured at a low temperature so that a modification of the variable resistance layer may be prevented during a curing process. Further, the common air gap 360 extending in the second direction may be provided through plural levels utilizing the common sacrificial layer pattern 360. In this manner, a process for forming a cross-point air gap structure at each level may be simplified.

In example embodiments, an additional memory cell array may be stacked on, for example, the second memory cell array MA2. For example, processes illustrated with reference to FIGS. 28 to 38B are repeated to obtain a variable resistance memory device having a 4-leveled structure. In such embodiments, the second capping layer 388 may substantially serve as a base insulation layer for the additional memory cell array.

Figure 39A:
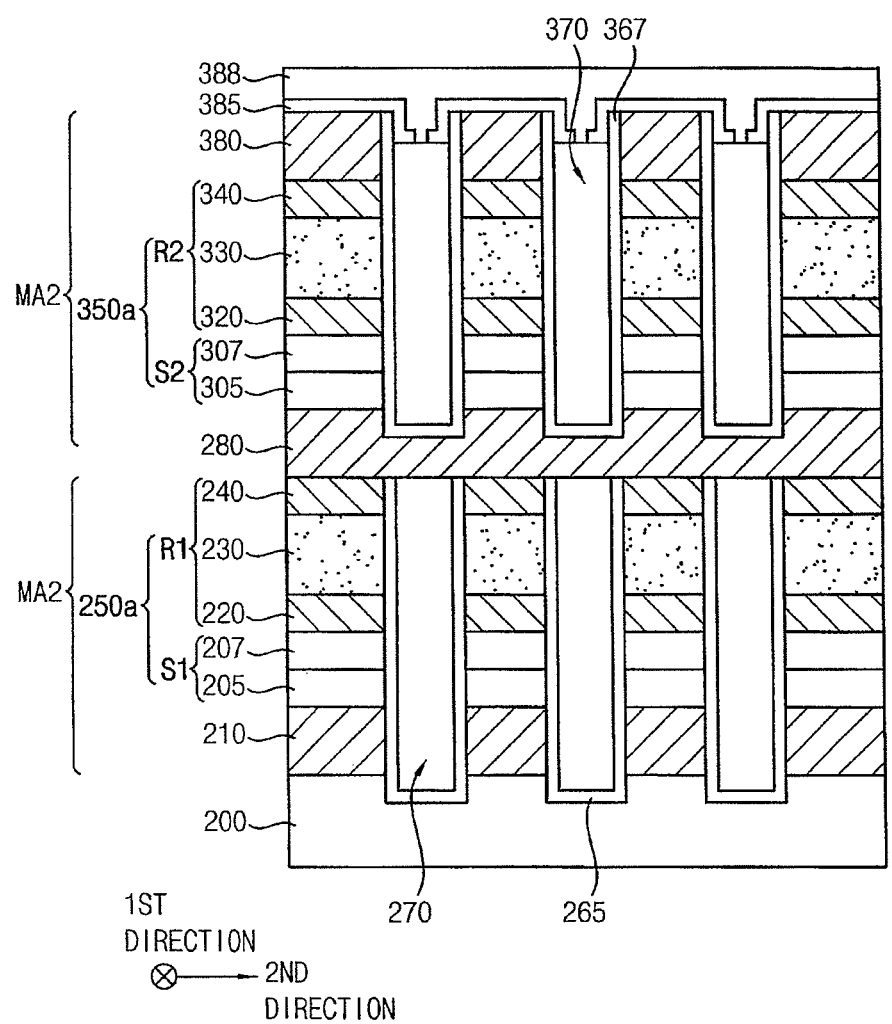
FIGS. 39A and 39B are cross-sectional views illustrating a variable resistance memory device in accordance with some example embodiments.
Figure 39B:
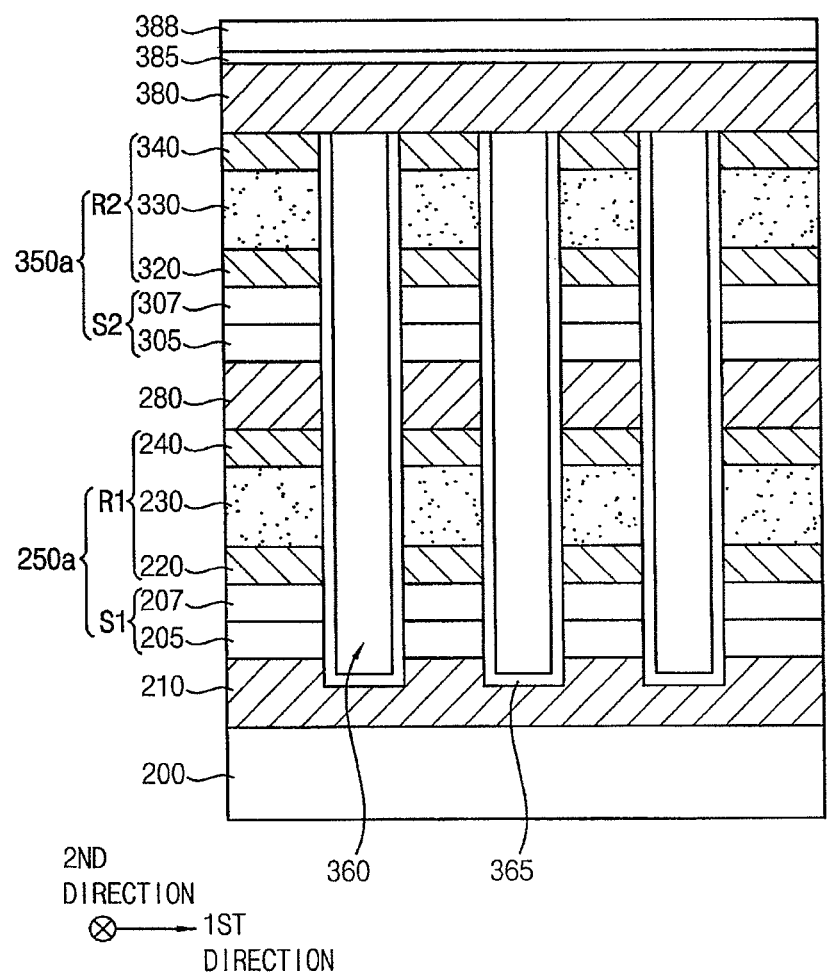

FIGS. 39A and 39B are cross-sectional views illustrating a variable resistance memory device in accordance with some example embodiments. Specifically, FIGS. 39A and 39B are cross-sectional views taken along the second direction and the first direction, respectively.

For example, FIGS. 39A and 39B illustrate a variable resistance memory device having a cross-point memory cell array structure of a double-stacked structure. The variable resistance memory device may have a "1R+1S" structure in which one selection device and one variable resistance device are located at each intersection region of conductive lines.

Detailed descriptions of elements and/or constructions substantially the same as, or similar to, those illustrated with reference to FIGS. 17A and 17B, or FIGS. 27A and 27B will not be repeated here. Like reference numerals are used to designate like elements.

Referring to FIGS. 39A and 39B, the variable resistance memory device may have a multi-stacked structure including a first memory cell array MA1 and a second memory cell array MA2. The first memory cell array MA1 may include a first memory cell 250a located at an intersection region of a first conductive line 210 and a second conductive line 280. The first memory cell 250a may include a first selection device S1 and a first variable resistance device R1. The second memory cell array MA2 may include a second memory cell 350a located at an intersection region of the second conductive line 280 and a third conductive line 380. The second memory cell 350a may include a selection device S2 and a second variable resistance device R2.

The first and second selection devices S1 and S2 may have a P-N diode structure. In such an embodiment, the first selection device S1 may include a first lower semiconductor layer pattern 205 and a first upper semiconductor layer pattern 207 sequentially stacked on the first conductive line 210. The second selection device S2 may include a second lower semiconductor layer pattern 305 and a second upper semiconductor layer pattern 307 sequentially stacked on the second conductive line 280. The first and second lower semiconductor layer patterns 205 and 305 may include n-type impurities. The first and second upper semiconductor layer patterns 207 and 307 may include p-type impurities.

The first variable resistance device R1 may include a first lower electrode 220, a first variable resistance layer 230 and a first upper electrode 240 sequentially stacked on the first selection device S1. The second variable resistance device R2 may include a second lower electrode 320, a second variable resistance layer 330 and a second upper electrode 340 sequentially stacked on the second selection device S2.

Sidewalls of the first memory cells 250a included in the first memory cell array MA1 may be surrounded by first air gaps 270 extending in the first direction and common air gaps 360 extending in the second direction. Sidewalls of the second memory cells 350a included in the second memory cell array MA2 may be surrounded by second air gaps 370 extending in the first direction and the common air gaps 360 extending in the second direction.

The first air gap 270 may extend between the first variable resistance devices R1, the first selection devices S1 and the first conductive lines 210 neighboring in the second direction. The first air gap 270 may further extend through an upper portion of a base insulation layer 200. The second air gap 370 may extend between the third conductive lines 380, the second variable resistance devices R2 and the second selection devices S2 neighboring in the second direction. The second air gap 370 may further extend through an upper portion of the second conductive line 280.

The common air gap 360 may extend between the second memory cells 350a neighboring in the first direction and between the first memory cells 250a neighboring in the first direction. The common air gap 360 may further extend through an upper portion of the first conductive line 210. The first and second air gaps 270 and 370 may be in fluid communication with each other via the common air gap 360.

FIGS. 40 to 46B are cross-sectional views illustrating a method of manufacturing a variable resistance memory device in accordance with some example embodiments. Specifically, FIGS. 40, 41, 42A, 44, 45A and 46A are cross-sectional views taken along the second direction. FIGS. 42B, 43, 45B and 46B are cross-sectional views taken along the first direction.

Detailed descriptions of processes substantially the same as, or similar to, those illustrated with reference to FIGS. 18 to 24, or FIGS. 28 to 38B will not be repeated here.

Figure 40:
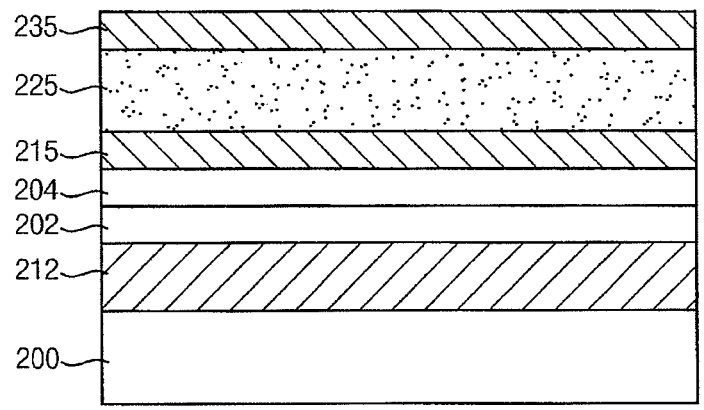
FIGS. 40 to 46B are cross-sectional views illustrating a method of manufacturing a variable resistance memory device in accordance with some example embodiments.

Referring to FIG. 40, a process substantially the same as, or similar to, that illustrated with reference to FIG. 18 may be performed. Accordingly, a first conductive layer 212, a first lower semiconductor layer 202, a first upper semiconductor layer 204, a first lower electrode layer 215, a first variable resistance material layer 225 and a first upper electrode layer 235 may be sequentially formed on a base insulation layer 200.

Figure 41:
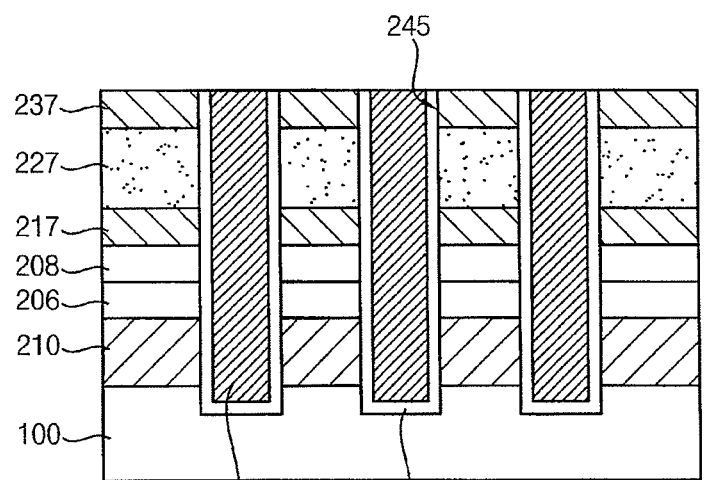

Referring to FIG. 41, processes substantially the same as, or similar to, those illustrated with reference to FIGS. 19 and 20, or FIG. 29 may be performed.

Accordingly, a first trench 245 may be formed through the first upper electrode layer 235, the first variable resistance material layer 225, the first lower electrode layer 215, the first upper semiconductor layer 204, the first lower semiconductor layer 202 and the first conductive layer 212. A first spacer 265 and a first sacrificial layer pattern 252 extending in the first direction may be formed in the first trench 245.

By the formation of the first trench 245, the first upper electrode layer 235, the first variable resistance material layer 225, the first lower electrode layer 215, the first upper semiconductor layer 204, the first lower semiconductor layer 202 and the first conductive layer 212 may be transformed into a first upper electrode layer pattern 237, a first variable resistance material layer pattern 227, a first lower electrode layer pattern 217, a first upper semiconductor layer line 208, a first lower semiconductor layer line 206 and a first conductive line 210, respectively.

Figure 42A:
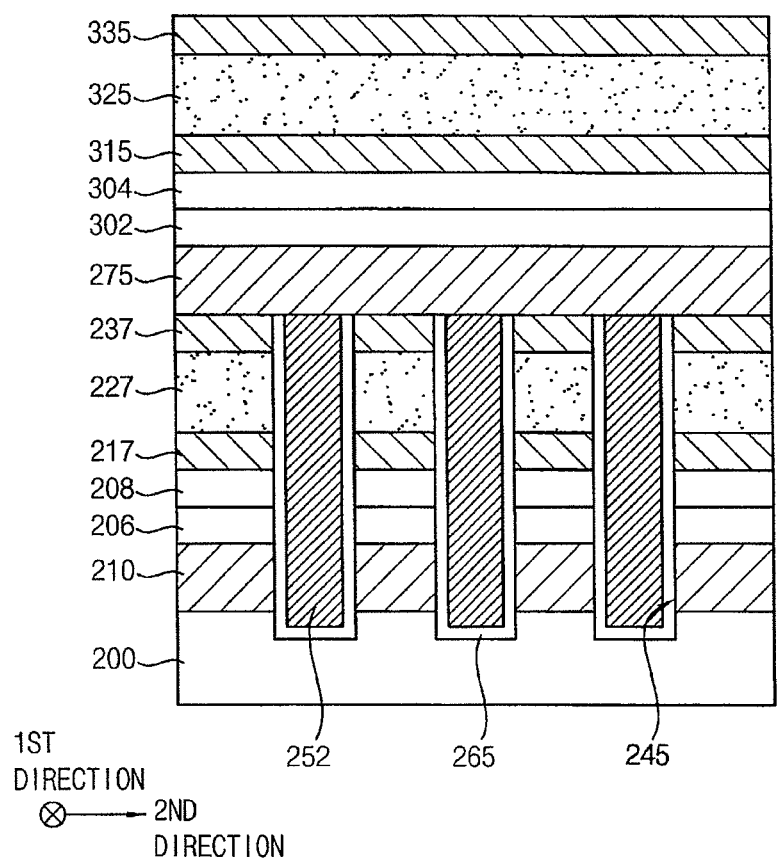
Figure 42B:
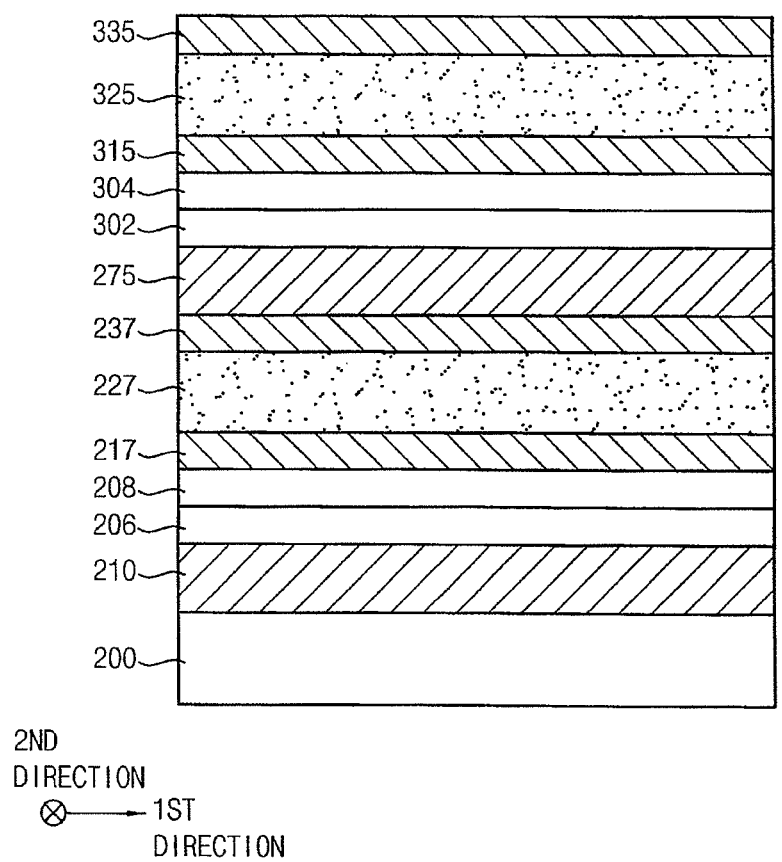

Referring to FIGS. 42A and 42B, a process substantially the same as, or similar to, that illustrated with reference to FIGS. 30A and 30B may be performed.

Accordingly, a second conductive layer 275, a second lower semiconductor layer 302, a second upper semiconductor layer 304, a second lower electrode layer 315, a second variable resistance material layer 325 and a second upper electrode layer 335 may be sequentially formed on the first upper electrode layer pattern 237, the first spacer 265 and the first sacrificial layer pattern 252.

Figure 43:
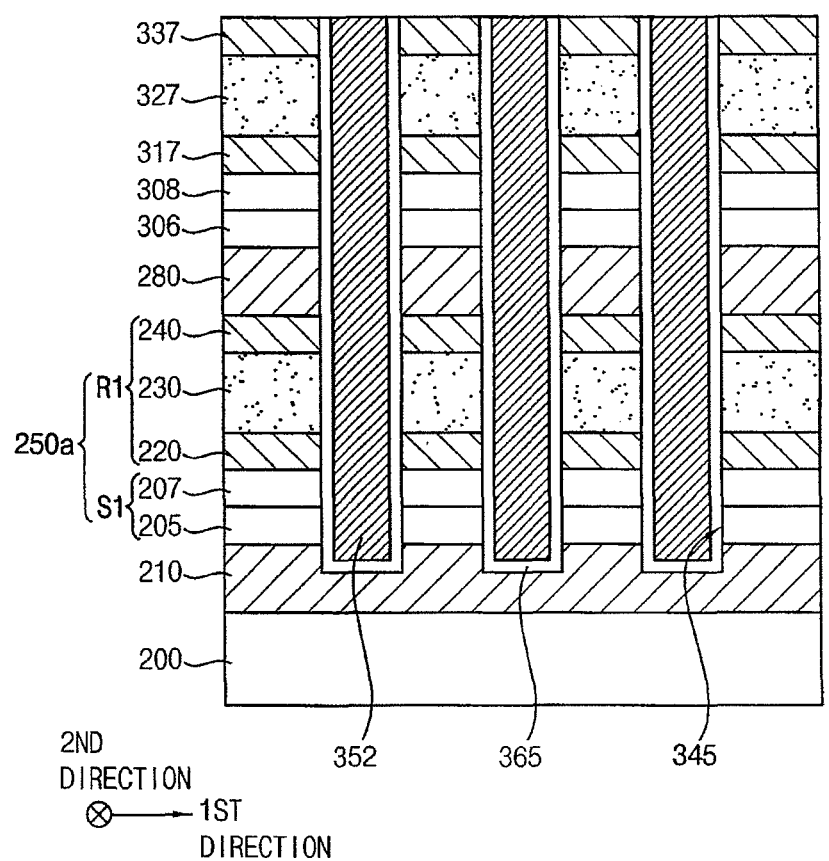

Referring to FIG. 43, processes substantially the same as, or similar to, those illustrated with reference to FIGS. 31 and 32 may be performed.

Accordingly, a common trench 345 extending from the second upper electrode layer 335 to an upper portion of the first conductive line 210 may be formed. A common spacer 365 and a common sacrificial layer pattern 352 may be formed in the common trench 345.

By the formation of the common trench 345, the second upper electrode layer 335, the second variable resistance material layer 325 and the second lower electrode layer 315 may be transformed into a second upper electrode layer pattern 337, a second variable resistance material layer pattern 327 and a second lower electrode layer pattern 317, respectively. The second upper semiconductor layer 304, the second lower semiconductor layer 302 and the second conductive layer 275 may be transformed into a second upper semiconductor layer line 308, a second lower semiconductor layer line 306 and a second conductive line 280, respectively.

The first upper electrode layer pattern 237, the first variable resistance material layer pattern 227, the first lower electrode layer pattern 217, the first upper semiconductor layer line 208 and the first lower semiconductor layer line 206 may be transformed into a first upper electrode 240, a first variable resistance layer 230, a first lower electrode 220, a first upper semiconductor layer pattern 207 and a first lower semiconductor layer pattern 205, respectively. Accordingly, a first selection device S1 may be defined by the first lower semiconductor layer pattern 205 and the first upper semiconductor layer pattern 207. A first variable resistance device R1 may be defined by the first lower electrode 220, the first variable resistance layer 230 and the first upper electrode 240. A first memory cell 250a including the first selection device S1 and the first variable resistance device R1 may be formed at each intersection region of the first conductive line 210 and the second conductive line 280.

Figure 44:
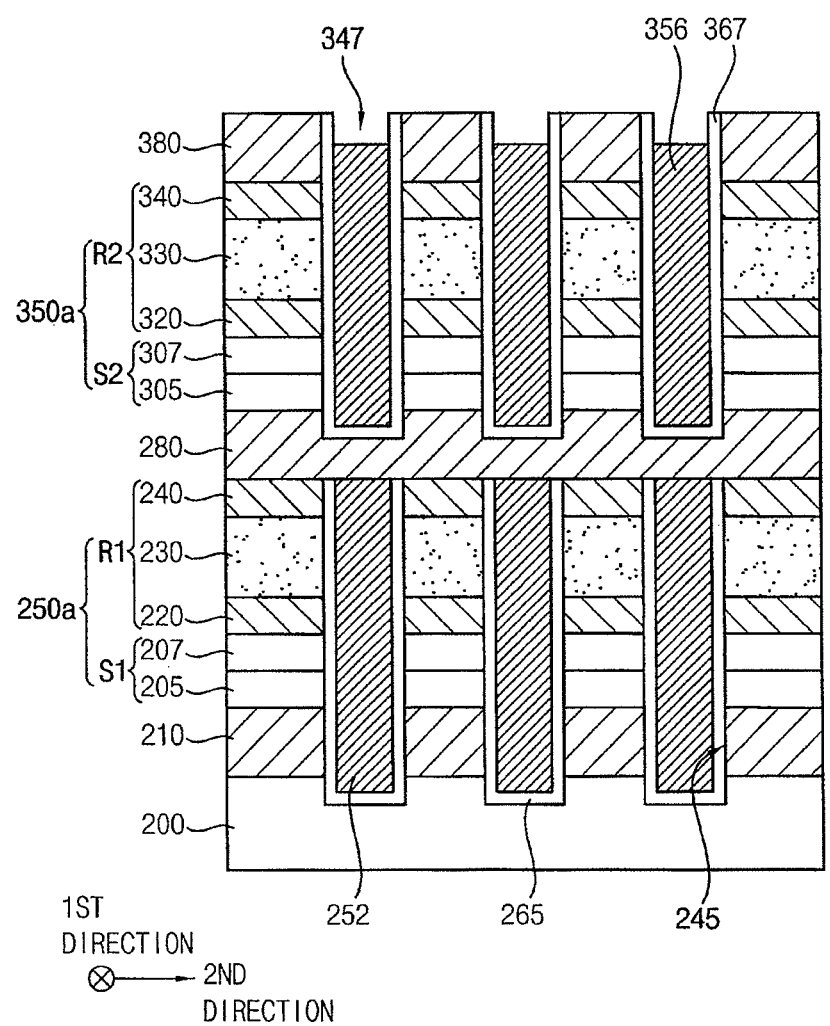

Referring to FIG. 44, processes substantially the same as, or similar to, those illustrated with reference to FIGS. 33A and 35 may be performed.

Accordingly, a third conductive layer may be formed on the second upper electrode layer pattern 337, the common spacer 365 and the common sacrificial layer pattern 352. A second trench 347 extending in the first direction may be formed through the third conductive layer to an upper portion of the second conductive line 280. A second spacer 367 may be formed on a sidewall and a bottom of the second trench 347, and a second sacrificial layer pattern 356 partially filling the second trench 347 may be formed on the second spacer 367.

By the formation of the second trench 347, the third conductive layer, the second upper electrode layer pattern 337, the second variable resistance material layer pattern 327 and the second lower electrode layer pattern 317 may be transformed into a third conductive line 380, a second upper electrode 340, a second variable resistance layer 330 and a second lower electrode 320, respectively. In this manner, a second variable resistance device R2 may be defined by the second lower electrode 320, the second variable resistance layer 330 and the second upper electrode 340.

Additionally, the second upper semiconductor layer line 308 and the second lower semiconductor layer line 306 may be transformed into a second upper semiconductor layer pattern 307 and a second lower semiconductor layer pattern 305. In this manner, a second selection device S2 may be defined by the second lower semiconductor layer pattern 305 and the second upper semiconductor layer pattern 307.

Accordingly, a second memory cell 350a including the second selection device S2 and the second variable resistance device R2 may be formed at each intersection region of the second conductive line 280 and the third conductive line 380.

Figure 45A:
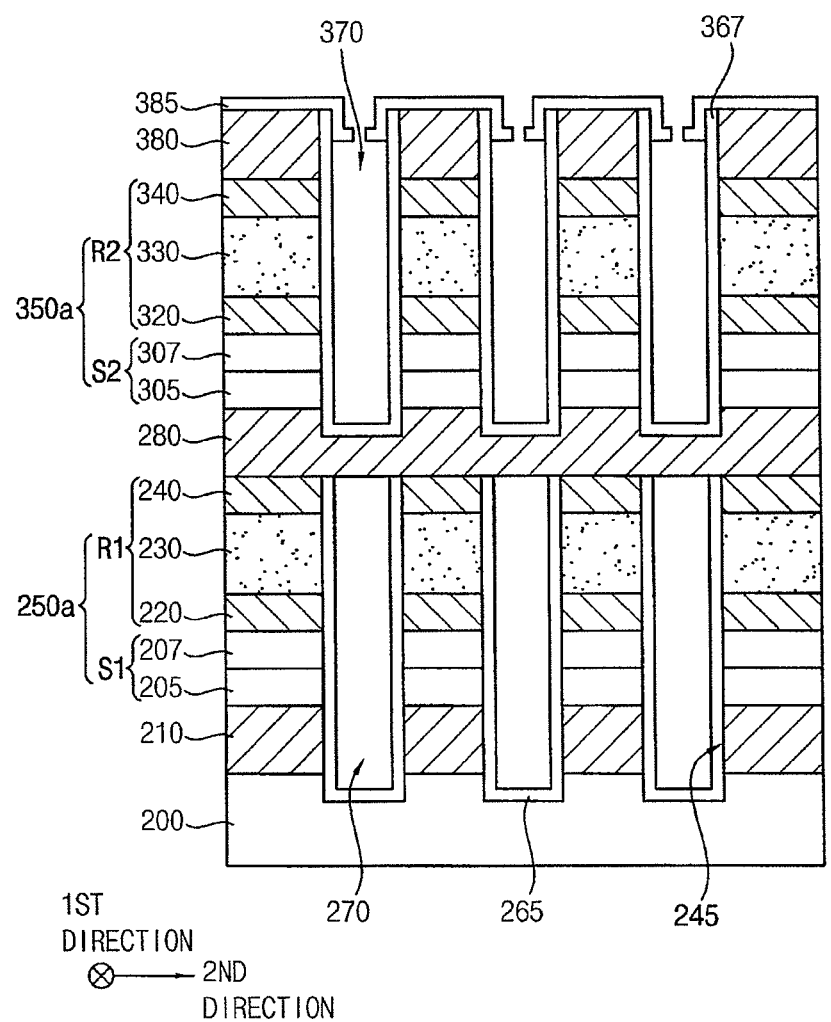
Figure 45B:
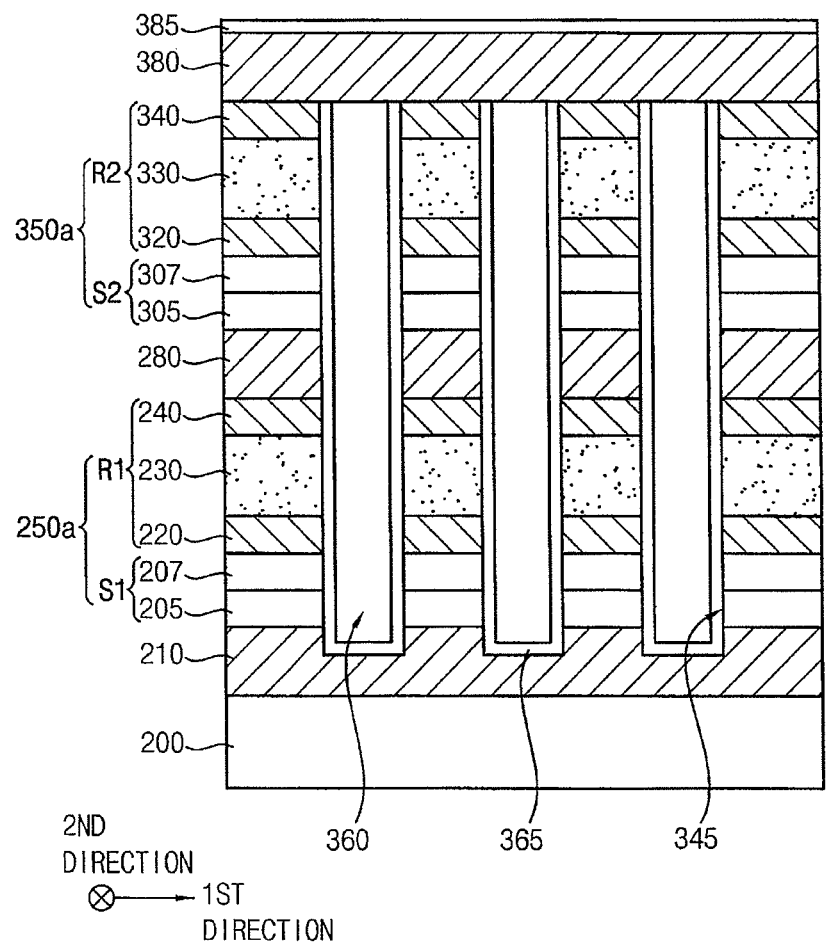

Referring to FIGS. 45A and 45B, processes substantially the same as, or similar to, those illustrated with reference to FIGS. 36A to 37B may be performed.

Accordingly, a first capping layer pattern 385 through which the second sacrificial layer pattern 356 is partially exposed may be formed, and then the second sacrificial layer pattern 356, the common sacrificial layer pattern 352 and the first sacrificial layer pattern 252 may be removed. A first air gap 270, a common air gap 360 and a second air gap 370 may be formed at spaces from which the first sacrificial layer pattern 252, the common sacrificial layer pattern 352 and the second sacrificial layer pattern 356 are removed, respectively.

Figure 46A:
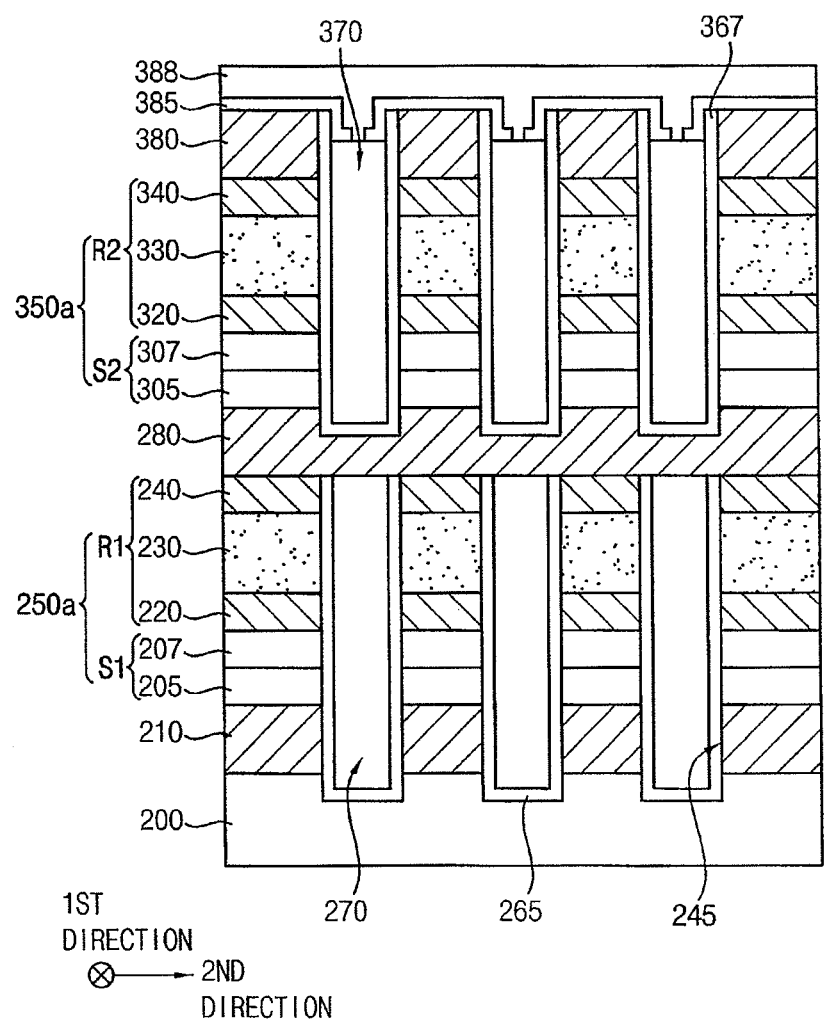
Figure 46B:
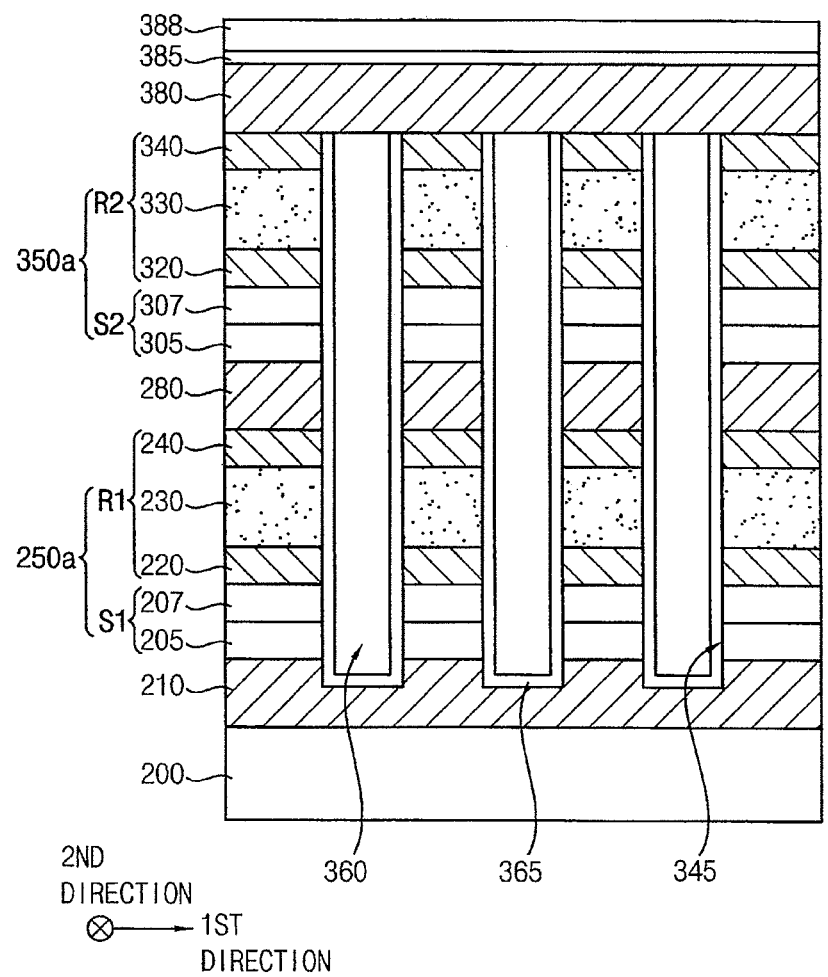

Referring to FIGS. 46A and 46B, a process substantially the same as, or similar to, that illustrated with reference to FIGS. 38A to 38B may be performed. Accordingly, a second capping layer 388 closing or capping the second air gap 370 and the common air gap 360 may be formed on the first capping layer pattern 385.

In example embodiments, processes illustrated with reference to FIGS. 40 to 46B may be repeated to obtain a variable resistance memory device having, for example, a 4-leveled structure.

Figure 47:
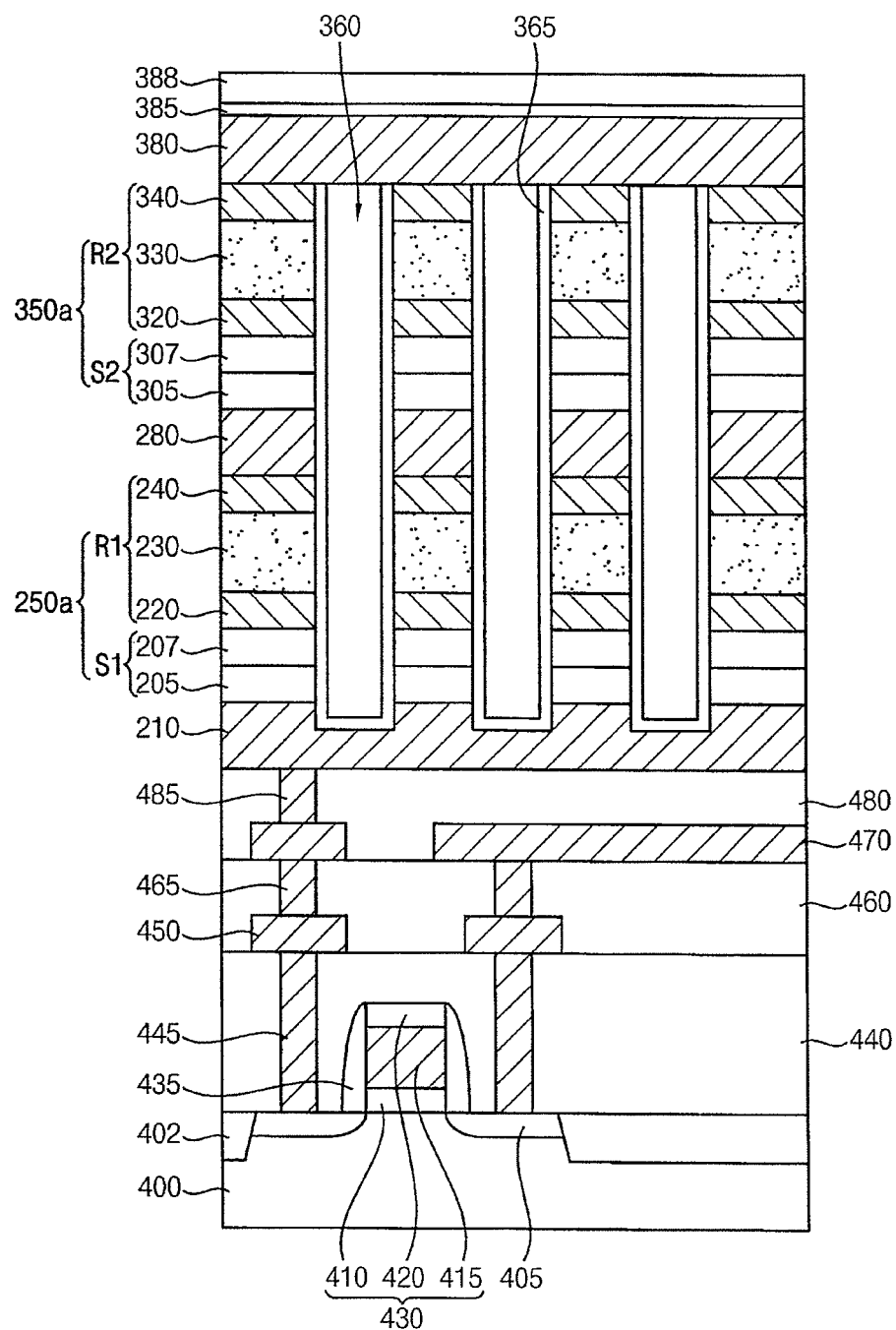
FIG. 47 is a cross-sectional view illustrating a semiconductor device in accordance with example embodiments.

FIG. 47 is a cross-sectional view illustrating a semiconductor device in accordance with example embodiments. The semiconductor device of FIG. 47 may include a variable resistance memory device in accordance with example embodiments which is stacked on a lower structure including a transistor and a wiring.

Referring to FIG. 47, the lower structure may include a gate structure 430, insulating interlayers 440, 460 and 480, contacts 445, 465 and 485, and wirings 450 and 470, which are disposed on a substrate 400. The contacts 445, 465 and 485, and the wirings 450 and 470 may provide a peripheral circuit such as a routing wiring.

A semiconductor substrate including, for example, single crystalline silicon or single crystalline germanium may be used as the substrate 400. An isolation layer 402 may be formed at an upper portion of the substrate 400 such that the substrate 400 may be divided into an active region and a field region.

The gate structure 430 may include a gate insulation layer pattern 410, a gate electrode 415 and a gate mask 420 sequentially stacked on the substrate 400.

The gate insulation layer pattern 410 may include silicon oxide or a metal oxide. The gate electrode 415 may include polysilicon doped with impurities, a metal or a metal nitride. The gate mask 420 may include silicon nitride. In an example embodiment, a gate spacer 435 may be formed on a sidewall of the gate structure.

An impurity region 405 may be formed at an upper portion of the substrate 400 adjacent to the gate structure 430. For example, the impurity region 405 may include n-type impurities such as phosphorous or arsenic. In such an embodiment, a negative metal oxide semiconductor (NMOS) transistor be defined by the gate structure 430 and the impurity region 405, and a portion of the substrate illustrated in FIG. 47 may be provided as an NMOS region.

In an example embodiment, the substrate 400 may further include a positive metal oxide semiconductor (PMOS) region, and a PMOS transistor including an additional gate structure and a p-type impurity region may be disposed on the PMOS region of the substrate 400. Accordingly, a complementary metal oxide semiconductor (CMOS) transistor may be formed on the substrate 400.

In an example embodiment, the gate structure 430 may be at least partially buried or embedded into the substrate 400. In such an embodiment, an upper portion of the substrate 400 may be etched to form a recess, and then a gate insulation layer pattern and a gate electrode may be formed in the recess.

A first insulating interlayer 440 covering the gate structure 430, the gate spacer 435 and the impurity region 405 may be formed on the substrate 400. A first contact 445 may extend through the first insulating interlayer 440 to be in contact with the impurity region 405. A first wiring 450 may be disposed on the first insulating interlayer 440 to be electrically connected to the first contact 445.

A second insulating interlayer 460 covering the first wiring 450 may be formed on the first insulating interlayer 440. A second contact 465 may extend through the second insulating interlayer 460 to be in contact with the first wiring 450. A second wiring 470 may be disposed on the second insulating interlayer 460 to be electrically connected to the second contact 465. In an example embodiment, a portion of the second wiring 470 may extend to the PMOS region to be electrically connected to the impurity region of the PMOS transistor.

A third insulating interlayer 480 covering the second wiring 470 may be formed on the second insulating interlayer 460. A third contact 485 may extend through the third insulating interlayer 480 to be in contact with the second wiring 470.

The first to third insulating interlayers 440, 460 and 480 may include silicon oxide, and may substantially serve as the base insulation layer described above. The first to third contacts 445, 465 and 485, the first wiring 450 and the second wiring 470 may include a metal such as W, Al, Cu or Ti, and/or a nitride thereof.

A variable resistance memory device in accordance with example embodiments may be disposed on the third insulating interlayer 480. A first conductive line 210 of the variable resistance memory device may be electrically connected to the third contact 485.

The variable resistance memory device may include a multi-stacked memory cell array having a "1R+1S" structure. For example, the variable resistance memory device may have structures and/or constructions substantially the same as, or similar to, those illustrated with reference to FIGS. 39A and 39B.

In some example embodiments, the variable resistance memory device may include a multi-stacked memory cell array having a "1R" structure as illustrated in FIGS. 27A and 27B. The variable resistance memory device may have structures and/or constructions substantially the same as, or similar to, those illustrated with reference to FIGS. 1 to 3B, FIGS. 17A and 17B, FIGS. 25A and 25B, or FIGS. 26A and 26B.

Detailed descriptions of the structures and/or constructions of the variable resistance memory device will not be repeated here.

FIG. 47 illustrates that the lower structure includes a double-leveled wiring structure. However, the lower structure may include a single-leveled wiring structure or a multi-leveled wiring structure having at least 3 levels, depending upon requirements of a circuit design of the semiconductor device.

FIGS. 48 to 51 are cross-sectional views illustrating a method of manufacturing a semiconductor device in accordance with example embodiments. For example, FIGS. 48 to 51 illustrate a method of manufacturing the semiconductor device of FIG. 47.

Figure 48:
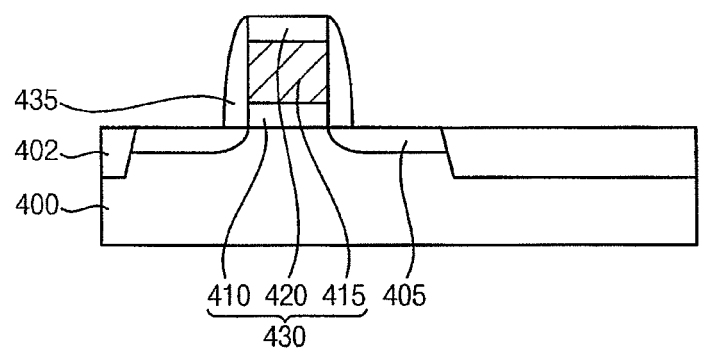
FIGS. 48 to 51 are cross-sectional views illustrating a method of manufacturing a semiconductor device in accordance with example embodiments.

Referring to FIG. 48, a gate structure 430 may be formed on a substrate 400, and an impurity region 405 may be formed at an upper portion of the substrate 400 adjacent to the gate structure 430.

The substrate 400 may include an NMOS region and a PMOS region, and a CMOS transistor may be formed on the substrate 400. An isolation layer 402 may be formed at an upper portion of the substrate 400 by, for example, a shallow trench isolation (STI) process. An active region and a field region of the substrate 400 may be defined by the isolation layer 402.

In example embodiments, a gate insulation layer, a gate electrode layer and a gate mask layer may be sequentially formed on the substrate 400, and may be patterned by, for example, a photolithography process to form the gate structure 430 including a gate insulation layer pattern 410, a gate electrode 415 and a gate mask 420.

The gate insulation layer may be formed of silicon oxide by, for example, a CVD process or a thermal oxidation process. The gate electrode layer may be formed using doped polysilicon, a metal or a metal nitride by a sputtering process, an ALD process, etc. The gate mask layer may be formed using silicon nitride by a CVD process, a spin coating process, etc.

An ion implantation process may be performed using the gate structure 430 as an ion implantation mask to form the impurity region 405. In example embodiments, the impurity region 405 may include n-type impurities such as phosphorous or arsenic. In such an embodiment, a portion of the substrate 400 illustrated in FIG. 48 may be provided as the NMOS region, and an NMOS transistor may be defined by the impurity region 405 and the gate structure 430. Additionally, a PMOS transistor (not illustrated) may be formed on the PMOS region of the substrate 400 together with the NMOS transistor.

In an example embodiment, a gate spacer 435 may be further formed on a sidewall of the gate structure 430. For example, a spacer layer covering the gate structure 430 may be formed on the substrate 400. The spacer layer may be anisotropically etched to form the gate spacer 435. The gate spacer layer may be formed using silicon nitride by, for example, a CVD process.

Figure 49:
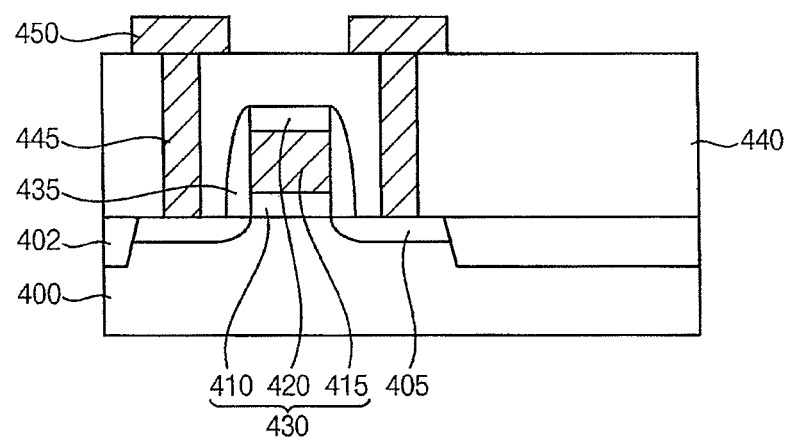

Referring to FIG. 49, a first insulating interlayer 440 covering the gate structure 430 may be formed on the substrate 400. A first contact 445 may be formed through the first insulating interlayer 440 to make contact with the impurity region 405.

For example, the first insulating interlayer 440 may be formed using silicon oxide such as TEOS by, for example, a CVD process or a spin coating process. The first insulating interlayer 440 may be partially removed to form a first contact hole through which the impurity region 405 is exposed. A first conductive layer sufficiently filling the first contact hole may be formed on the first insulating interlayer 440. An upper portion of the first conductive layer may be planarized until a top surface of the first insulating interlayer 440 is exposed to form the first contact 445.

In an example embodiment, the first contact 445 may be self-aligned with the gate spacer 435. In such an embodiment, the first contact 445 may be in contact with a sidewall of the gate spacer 435.

A first wiring 450 electrically connected to the first contact 445 may be formed on the first insulating interlayer 440. For example, a second conductive layer may be formed on the first insulating interlayer 440 and the first contact 445, and may be patterned to form the first wiring 450. The first and second conductive layers may be formed using a metal or a metal nitride by an ALD process or a sputtering process, for example.

Figure 50:
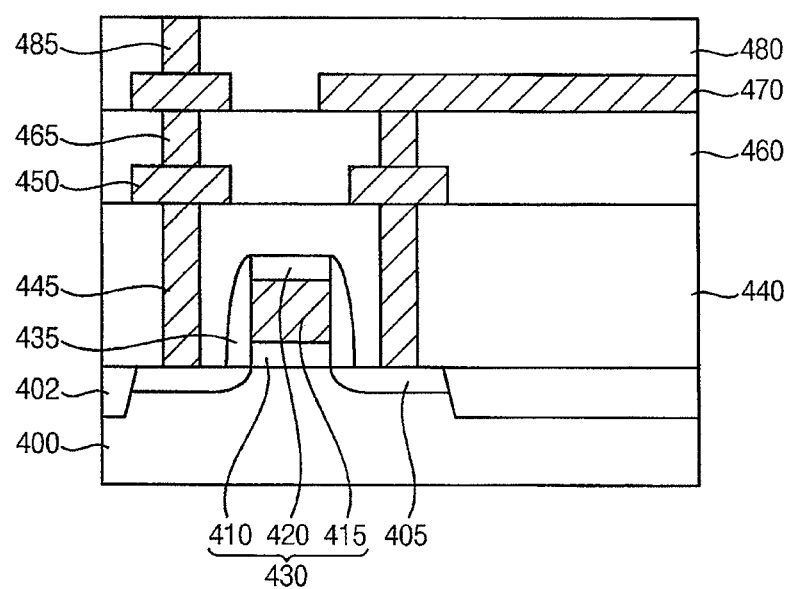

Referring to FIG. 50, a second insulating interlayer 460 covering the first wiring 450 may be formed on the first insulating interlayer 440. The second insulating interlayer 460 may be partially removed to form a second contact hole through which the first wiring 450 is at least partially exposed. A third conductive layer sufficiently filling the second contact hole may be formed on the second insulating interlayer 460, and an upper portion of the third conductive layer may be planarized to form a second contact 465 electrically connected to the first wiring 450.

A fourth conductive layer may be formed on the second insulating interlayer 460 and the second contact 465, and may be patterned to form a second wiring 470 electrically connected to the second contact 465. In example embodiments, a plurality of the second wirings 470 may be formed, and at least one of the second wirings 470 may extend to the PMOS region to be electrically connected to the PMOS transistor.

A third insulating interlayer 480 covering the second wiring 470 may be formed on the second insulating interlayer 460. A third contact hole may be formed through the third insulating interlayer 480, such that the second wiring 470 may be exposed. A fifth conductive layer filling the third contact hole may be formed on the third insulating interlayer 480, and an upper portion of the fifth conductive layer may be planarized to form a third contact 485 electrically connected to the second wiring 470.

The second and third insulating interlayers 460 and 480 may be formed using silicon oxide substantially the same as, or similar to, that of the first insulating interlayer 440 by a CVD process, a spin coating process, etc. The third to fifth conductive layers may be formed using a metal such as W, Al, Cu, Ti, etc., or a nitride thereof by an ALD process, a sputtering process, a PVD process, etc.

A lower structure including the substrate 400, the transistor, and a wiring structure may be obtained by processes illustrated with reference to FIGS. 48 to 50. As illustrated in FIG. 50, the lower structure may have a double-leveled wiring structure. However, an additional wiring structure may be stacked, depending upon requirements of a circuit design of the semiconductor device.

Figure 51:
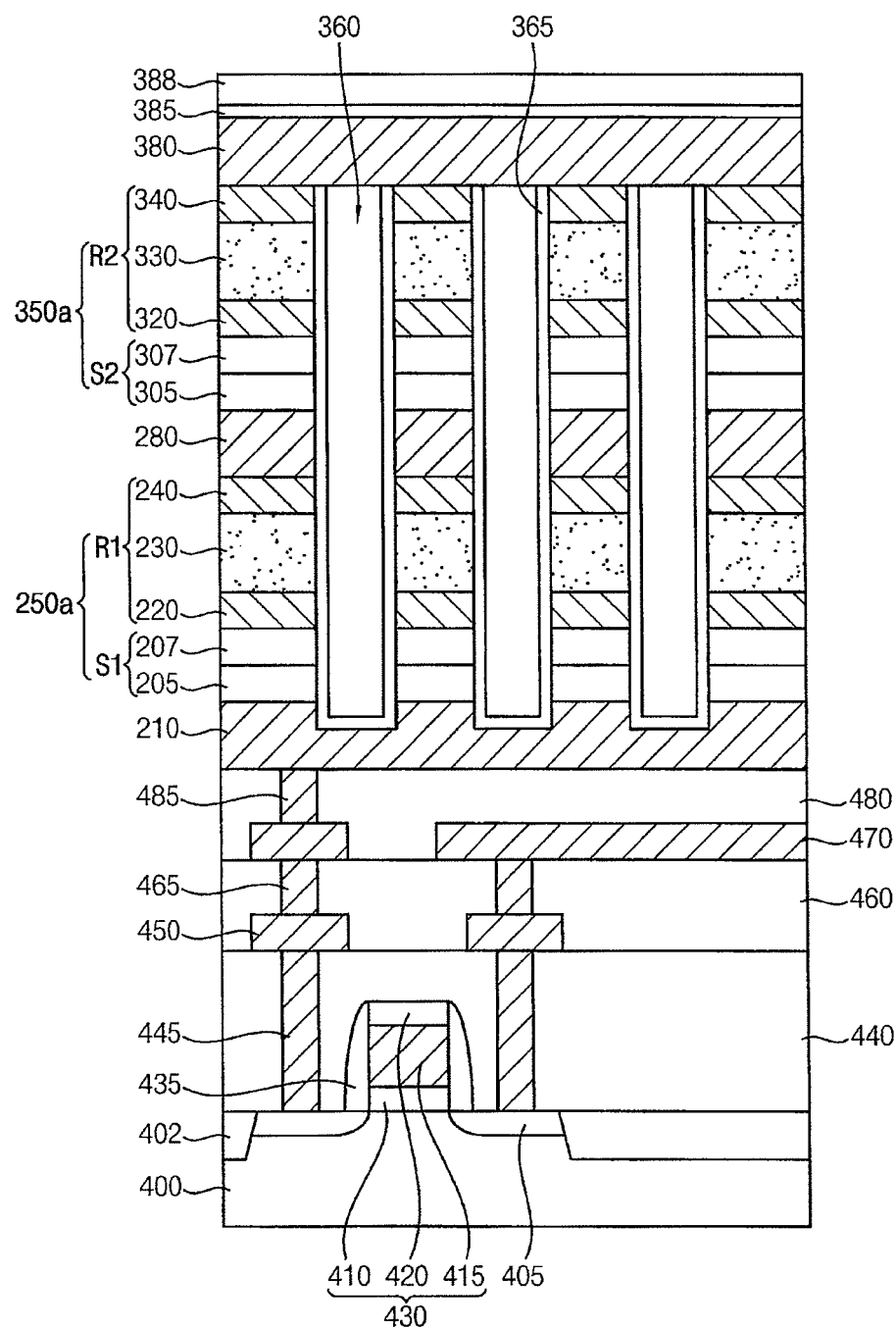

Referring to FIG. 51, a variable resistance memory device may be formed on the lower structure. For example, processes substantially the same as, or similar to, those illustrated with reference to FIGS. 40 to 46B may be performed such that the variable resistance memory device of FIGS. 39A and 39B may be stacked on the lower structure. In such an embodiment, a first conductive line 210 of the variable resistance memory device may be electrically connected to the third contact 485 of the lower structure.

In some example embodiments, processes substantially the same as, or similar to, those illustrated with reference to FIGS. 4 to 16, FIGS. 18 to 24 or FIGS. 28 to 38B may be performed to form the variable resistance memory device of FIGS. 1 to 3B, FIGS. 17A and 17B, or FIGS. 27A and 27B, respectively, on the lower structure. Alternatively, the variable resistance memory device of FIGS. 25A and 25B or FIGS. 26A and 26B may be stacked on the lower structure.

Figure 52:
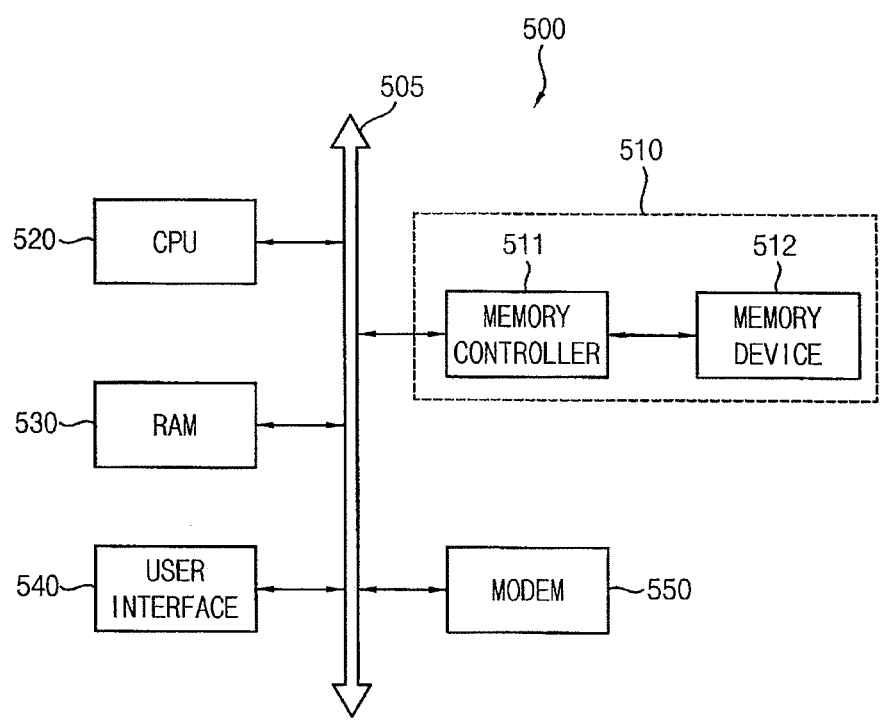

FIG. 52 is a block diagram illustrating a schematic construction of an information processing system in accordance with example embodiments.

Referring to FIG. 52, an information processing system 500 may include a CPU 520, a RAM 530, an user interface 540, a modem 550 such as a baseband chipset and a memory system 510 electrically connected to a system bus 505. The memory system 510 may include a memory device 512 and a memory controller 511. The memory device 512 may include a variable resistance memory device in accordance with principles of inventive concepts. In this manner, large data processed by the CPU 520 or input from an external device may be stored in the memory device 512 with high stability. The memory controller 511 may have a construction capable of controlling the memory device 512. The memory system 510 may be provided as, for example, a memory card or a solid state disk (SSD) by a combination of the memory device 512 and the memory controller 511. In an embodiment in which the information processing system 500 is implemented in a mobile device, a battery may be further provided for supplying a driving voltage of the information processing system 500. The information processing system 500 may further include an application chipset, a camera image processor (CIS), a mobile DRAM, etc.

In example embodiments in accordance with principles of inventive concepts, sidewalls of memory cells included in a cross-point array may be surrounded by air gaps crossing each other. The operational reliability and uniformity of memory cells may thereby be improved. A variable resistance memory device in accordance with principles of inventive concepts may be implemented as various types of non-volatile semiconductor devices such as a ReRAM device, an MRAM device or a PRAM device, for example.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of inventive concepts. Accordingly, all such modifications are intended to be included within the scope of inventive concepts as defined in the claims. In the claims, means-plus-function clauses are intended to cover the structures described herein as performing the recited function and not only structural equivalents but also equivalent structures.

What is claimed is:

1. A variable resistance memory device, comprising:
 a plurality of first conductive lines extending in a first direction;
 a plurality of second conductive lines over the first conductive lines, the second conductive line extending in a second direction crossing the first direction;
 a plurality of memory cells including a variable resistance device, each of the memory cells located at an intersection region of the first conductive line and the second conductive line;
 a plurality of first air gaps extending in the first direction between the memory cells;
 a plurality of second air gaps extending in the second direction between the memory cells; and
 a capping layer pattern at an upper portion of the second air gap.

2. The variable resistance memory device of claim 1, wherein the variable resistance device includes a variable resistance layer including a perovskite-based material or a transition metal oxide.

3. The variable resistance memory device of claim 1, wherein the capping layer pattern includes:
 a first capping layer pattern including an opening through which the upper portion of the second air gap is exposed; and
 a second capping layer pattern on the first air gap pattern and closing the opening in the first capping layer pattern.

4. The variable resistance memory device of claim 3, wherein the second capping layer pattern includes an oxide having a gap fill property less than that of the first capping layer pattern.

5. The variable resistance memory device of claim 4, wherein the first capping layer pattern includes an atomic layer deposition (ALD) oxide, and the second capping layer pattern includes tetra ethyl ortho silicate (TEOS) or a chemical vapor deposition (CVD) oxide.

6. The variable resistance memory device of claim 1, wherein an upper portion of the first air gap is covered by the second conductive line and the capping layer pattern.

7. The variable resistance memory device of claim 1, wherein the first air gap and the second air gap are in fluid communication with each other, and a sidewall surrounding the memory cell is surrounded by the first air gaps and the second air gaps.

8. The variable resistance memory device of claim 1, wherein the memory cell includes a lower electrode, a variable resistance layer and an upper electrode which are sequentially stacked on the first conductive line.

9. The variable resistance memory device of claim 1, wherein the memory cell further includes a selection device between the first conductive line and the variable resistance device.

10. A variable resistance memory device, comprising:
a plurality of first conductive lines extending in a first direction;
a plurality of second conductive lines over the first conductive lines, the second conductive line extending in a second direction crossing the first direction;
a plurality of memory cells including a variable resistance device, each of the memory cells located at an intersection region of the first conductive line and the second conductive line;
a plurality of first air gaps extending in the first direction between the memory cells; and
a plurality of second air gaps extending in the second direction between the memory cells;
wherein the first conductive line is on a base insulation layer, and
wherein the first air gap extends through an upper portion of the base insulation layer, and the second air gap extends through an upper portion of the first conductive line.

11. A variable resistance memory device, comprising:
a first memory cell array including a plurality of first memory cells, the first memory cells including a first variable resistance device;
a second memory cell array on the first memory cell array and including a plurality of second memory cells, the second memory cells including a second variable resistance device;
a plurality of first air gaps extending between the first memory cells;
a plurality of second air gaps extending between the second memory cells;
a plurality of common air gaps extending through the first memory cell array and the second memory cell array, the common air gap crossing the first air gap and the second air gap; and
a first spacer, a second spacer and a common spacer formed on bottoms and sidewalls of the first air gap, the second air gap and the common air gap, respectively.

12. The variable resistance memory device of claim 11, further comprising a plurality of first conductive lines, a plurality of second conductive lines and a plurality of third conductive lines,
wherein each of the first memory cells is located in an intersection region of the first conductive line and the second conductive line, and each of the second memory cells is located in an intersection region of the second conductive line and the third conductive line.

13. The variable resistance memory device of claim 12, wherein the first conductive line and the third conductive line extend in a first direction, and the second conductive line extends in a second direction crossing the first direction.

14. The variable resistance memory device of claim 13, wherein the first air gap and the second air gap extend in the first direction, and the common air gap extends in the second direction.

15. The variable resistance memory device of claim 11, wherein the first air gap and the second air gap are in fluid communication with each other via the common air gap.

16. The variable resistance memory device of claim 15, wherein a sidewall surrounding the first memory cell is surrounded by the first air gaps and the common air gaps, and a sidewall surrounding the second memory cell is surrounded by the second air gaps and the common air gaps.

17. The variable resistance memory device of claim 11, further comprising a capping layer pattern at an upper portion of the second air gap.

* * * * *